(12) United States Patent
Yamazaki

(10) Patent No.: US 7,956,362 B2
(45) Date of Patent: Jun. 7, 2011

(54) SEMICONDUCTOR DEVICE AND WIRING STRUCTURE OF TRIPLE-LAYER

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 130 days.

(21) Appl. No.: 11/438,295

(22) Filed: May 23, 2006

(65) Prior Publication Data

US 2006/0208258 A1    Sep. 21, 2006

Related U.S. Application Data

(62) Division of application No. 10/326,060, filed on Dec. 23, 2002, now Pat. No. 7,064,020, which is a division of application No. 09/447,574, filed on Nov. 23, 1999, now Pat. No. 6,501,098.

(30) Foreign Application Priority Data

Nov. 25, 1998    (JP) .................................... 10-333623

(51) Int. Cl.
  *H01L 29/04* (2006.01)
  *H01L 27/01* (2006.01)
(52) U.S. Cl. ............. 257/72; 257/347; 257/350; 257/59
(58) Field of Classification Search .................... 257/59, 257/72, 347–354
See application file for complete search history.

(56) References Cited

U.S. PATENT DOCUMENTS

| | | | |
|---|---|---|---|
| 3,933,529 A | 1/1976 | Goser | |
| 4,924,281 A * | 5/1990 | Endo et al. ................... | 257/388 |
| 4,963,504 A | 10/1990 | Huang | |
| 4,971,922 A * | 11/1990 | Watabe et al. ................ | 438/304 |
| 5,015,599 A * | 5/1991 | Verhaar ........................ | 438/304 |
| 5,034,348 A * | 7/1991 | Hartswick et al. ............ | 438/453 |
| 5,034,791 A | 7/1991 | Kameyama et al. | |
| 5,036,370 A * | 7/1991 | Miyago et al. ................. | 257/72 |
| 5,182,619 A | 1/1993 | Pfiester | |
| 5,210,435 A * | 5/1993 | Roth et al. .................... | 257/344 |
| 5,247,190 A | 9/1993 | Friend et al. | |
| 5,256,585 A * | 10/1993 | Bae ............................... | 438/304 |

(Continued)

FOREIGN PATENT DOCUMENTS

EP    0 602 250 A1    6/1994

(Continued)

OTHER PUBLICATIONS

European Search Report dated Oct. 1, 2004 Application No. 99 12 3427.

(Continued)

*Primary Examiner* — Ori Nadav
(74) *Attorney, Agent, or Firm* — Nixon Peabody LLP; Jeffrey L. Costella

(57) ABSTRACT

A multi-layered gate electrode of a crystalline TFT is constructed as a clad structure formed by deposition of a first gate electrode, a second gate electrode and a third gate electrode, to thereby to enhance the thermal resistance of the gate electrode. Additionally, an n-channel TFT is formed by selective doping to form a low-concentration impurity region which adjoins a channel forming region, and a sub-region overlapped by the gate electrode and a sub-region not overlapped by the gate electrode, to also mitigate a high electric field near the drain of the TFT and to simultaneously prevent the OFF current of the TFT from increasing.

44 Claims, 32 Drawing Sheets

U.S. PATENT DOCUMENTS

| | | | |
|---|---|---|---|
| 5,268,330 A * | 12/1993 | Givens et al. | 438/586 |
| 5,323,042 A | 6/1994 | Matsumoto | |
| 5,399,502 A | 3/1995 | Friend et al. | |
| 5,412,240 A | 5/1995 | Inoue et al. | |
| 5,482,871 A | 1/1996 | Pollack | |
| 5,508,216 A | 4/1996 | Inoue | |
| 5,532,175 A | 7/1996 | Racanelli et al. | |
| 5,543,340 A | 8/1996 | Lee | |
| 5,543,947 A | 8/1996 | Mase et al. | |
| 5,567,966 A | 10/1996 | Hwang | |
| 5,581,092 A | 12/1996 | Takemura | |
| 5,594,569 A | 1/1997 | Konuma et al. | |
| 5,608,251 A | 3/1997 | Konuma et al. | |
| 5,616,506 A | 4/1997 | Takemura | |
| 5,620,905 A | 4/1997 | Konuma et al. | |
| 5,623,157 A | 4/1997 | Miyazaki et al. | |
| 5,643,826 A | 7/1997 | Ohtani et al. | |
| 5,658,815 A | 8/1997 | Lee et al. | |
| 5,686,328 A | 11/1997 | Zhang et al. | |
| 5,693,959 A | 12/1997 | Inoue et al. | |
| 5,719,588 A | 2/1998 | Johnson | |
| 5,726,479 A * | 3/1998 | Matsumoto et al. | 257/412 |
| 5,753,546 A * | 5/1998 | Koh et al. | 438/229 |
| 5,757,048 A | 5/1998 | Inoue | |
| 5,763,285 A | 6/1998 | Yang | |
| 5,767,930 A | 6/1998 | Kobayashi et al. | |
| 5,773,330 A | 6/1998 | Park | |
| 5,841,170 A | 11/1998 | Adan et al. | |
| 5,858,820 A | 1/1999 | Jung et al. | |
| 5,903,249 A | 5/1999 | Koyama et al. | |
| 5,912,492 A | 6/1999 | Chang et al. | |
| 5,923,961 A | 7/1999 | Shibuya et al. | |
| 5,923,962 A | 7/1999 | Ohtani et al. | |
| 5,981,367 A | 11/1999 | Gonzalez | |
| 6,017,809 A * | 1/2000 | Inumiya et al. | 438/585 |
| 6,049,092 A | 4/2000 | Konuma et al. | |
| 6,069,032 A * | 5/2000 | Lee | 438/197 |
| 6,160,279 A | 12/2000 | Zhang et al. | |
| 6,165,824 A | 12/2000 | Takano et al. | |
| 6,166,396 A | 12/2000 | Yamazaki | |
| 6,174,762 B1 * | 1/2001 | Bronner et al. | 438/230 |
| 6,180,957 B1 | 1/2001 | Miyasaka et al. | |
| 6,198,133 B1 | 3/2001 | Yamazaki et al. | |
| 6,259,120 B1 | 7/2001 | Zhang et al. | |
| 6,259,138 B1 | 7/2001 | Ohtani et al. | |
| 6,259,144 B1 | 7/2001 | Gonzalez | |
| 6,281,552 B1 | 8/2001 | Kawasaki et al. | |
| 6,285,042 B1 | 9/2001 | Ohtani et al. | |
| 6,335,541 B1 | 1/2002 | Ohtani et al. | |
| 6,365,933 B1 | 4/2002 | Yamazaki et al. | |
| 6,469,317 B1 | 10/2002 | Yamazaki et al. | |
| 6,501,098 B2 | 12/2002 | Yamazaki | |
| 6,617,644 B1 | 9/2003 | Yamazaki et al. | |
| 6,867,431 B2 | 3/2005 | Konuma et al. | |
| 2002/0163049 A1 | 11/2002 | Yamazaki et al. | |
| 2003/0054653 A1 | 3/2003 | Yamazaki et al. | |
| 2003/0122132 A1 | 7/2003 | Yamazaki | |
| 2004/0051142 A1 | 3/2004 | Yamazaki et al. | |
| 2004/0256621 A1 | 12/2004 | Konuma et al. | |
| 2005/0142705 A1 | 6/2005 | Konuma et al. | |
| 2005/0153489 A1 | 7/2005 | Konuma et al. | |

FOREIGN PATENT DOCUMENTS

| | | |
|---|---|---|
| EP | 0645802 A2 | 3/1995 |
| EP | 0 650 197 A2 | 4/1995 |
| EP | 1 001 467 A2 | 5/2000 |
| EP | 1 003 223 A2 | 5/2000 |
| EP | 1564799 A2 | 8/2005 |
| EP | 1564800 A2 | 8/2005 |
| GB | 2 077 993 A | 12/1981 |
| JP | 04-369271 | 12/1992 |
| JP | 05-102483 | 4/1993 |
| JP | 5-188401 | 7/1993 |
| JP | 06-260499 | 9/1994 |
| JP | 06-260645 | 9/1994 |
| JP | 07-130652 | 5/1995 |
| JP | 07-169974 | 7/1995 |
| JP | 07-202210 | 8/1995 |
| JP | 08-78329 | 3/1996 |
| JP | 10-135468 | 5/1996 |
| JP | 10-092576 | 4/1998 |
| JP | 10-096956 | 4/1998 |
| JP | 10-135468 | 5/1998 |
| JP | 10-135469 | 5/1998 |
| JP | 10-163463 | 6/1998 |
| JP | 10-189979 | 7/1998 |
| JP | 10-223531 | 8/1998 |
| JP | 10-247735 | 9/1998 |
| JP | 10-256552 | 9/1998 |
| WO | WO 90/13148 | 11/1990 |

OTHER PUBLICATIONS

Specification and Drawings for U.S. Appl. No. 09/441,025, filed Nov. 16, 1999 "Method of Manufacturing Semiconductor Devices".

Specification and Drawings for U.S. Appl. No. 09/441,026, filed Nov. 16, 1999 "Electro-Optical Device and Manufacturing Method Thereof".

Hatano et al., "A Novel Self-Aligned Gate-Overlapped LDD Poly-Si TFT with High Reliability and Performance", IEDM Technical Digest, 1997, pp. 523-526.

Furue et al., "P-78: Characteristics and Driving Scheme of Polymer-Stabilized Monostable FLCD Exhibiting Fast Response Time and High Contrast Ratio with Gray-Scale Capability", SID 98 Digest, pp. 782-785.

Yoshida et al., "33.2: A Full-Color Thresholdless Antiferroelectric LCD Exhibiting Wide Viewing Angle with Fast Response Time", SID 97 Digest, pp. 841-844.

Inui et al., "Thresholdhess Antiferroelectricity in Liquid Crystals and its Application to Displays", J. Mater Chem., vol. 6, No. 4, 1996, pp. 671-673.

Terada et al., "Half-V Switching Mode FLCD", Proceedings of the 46th Applied Physics Association Lectures, 28P-V-8, Mar. 1999, p. 1316.

Yoshihara, "Time Division Full Color LCD by Ferroelectric Liquid Crystal", EKISHO, vol. 3, No. 3, 1999, pp. 190-194.

Schenk et al., "Polymers for Light Emitting Diodes", EuroDisplay '99 Proceedings, Sep. 6-9, 1999, pp. 33-37.

Schenk et al., "Polymers for Light Emitting Diodes", EuroDisplay '99: Proceedings of the 19th IDRC International Display Research Conference Proceedings, Sep. 6-9, 1999, pp. 33-37.

Terada et al. "Half-V Shaped Switching Mode FLCD", Proceedings of the 46th Applied Physics Association Lectures, 28P-V-8, Mar. 1999, p. 1316.

Yoshihara, "Time Division Full Color LCD by Ferroelectric Liquid Crystal", Ekisho, vol. 3, No. 3, 1999, pp. 190-194.

* cited by examiner

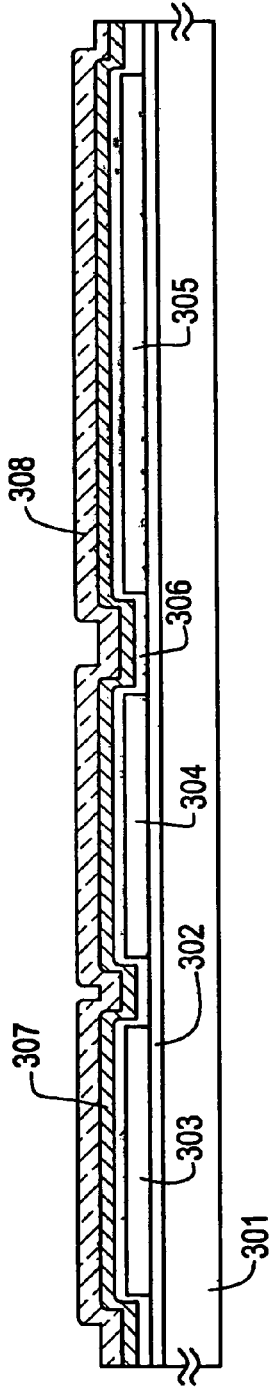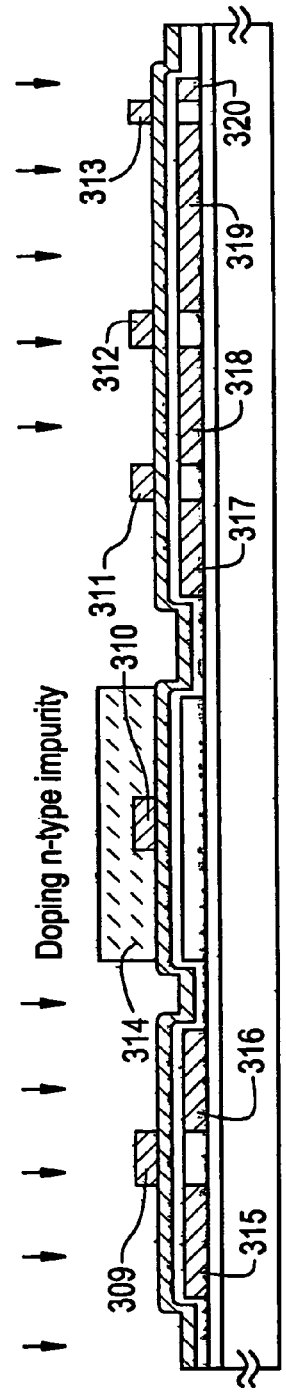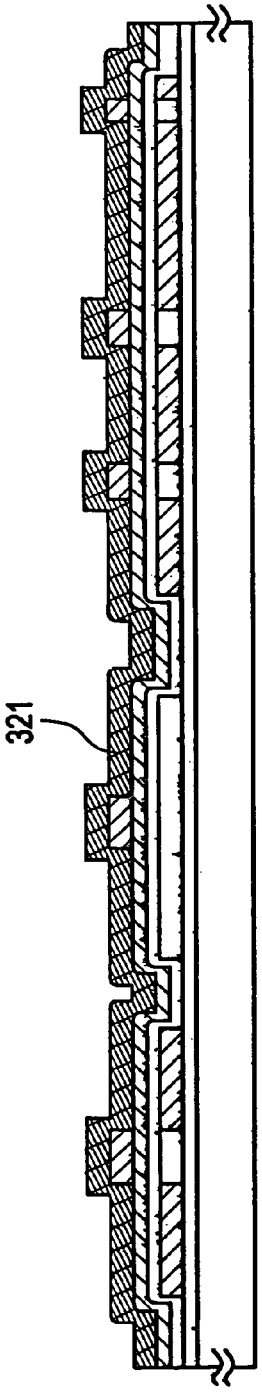

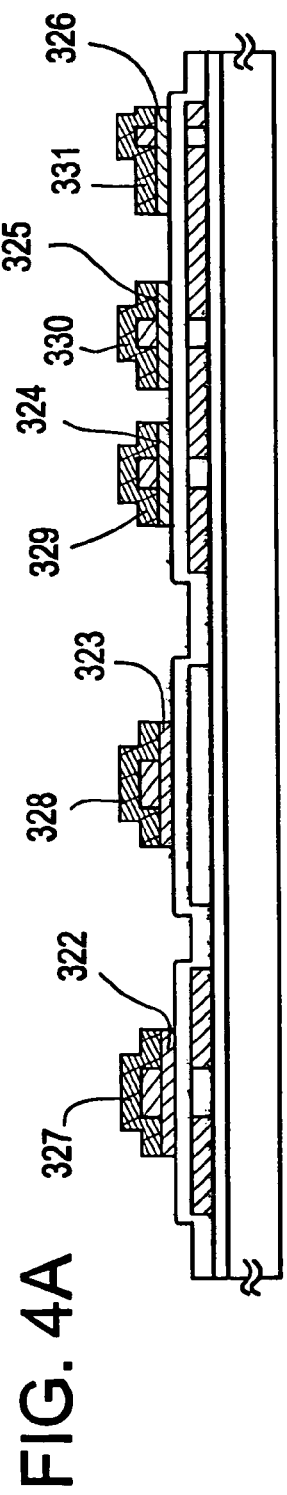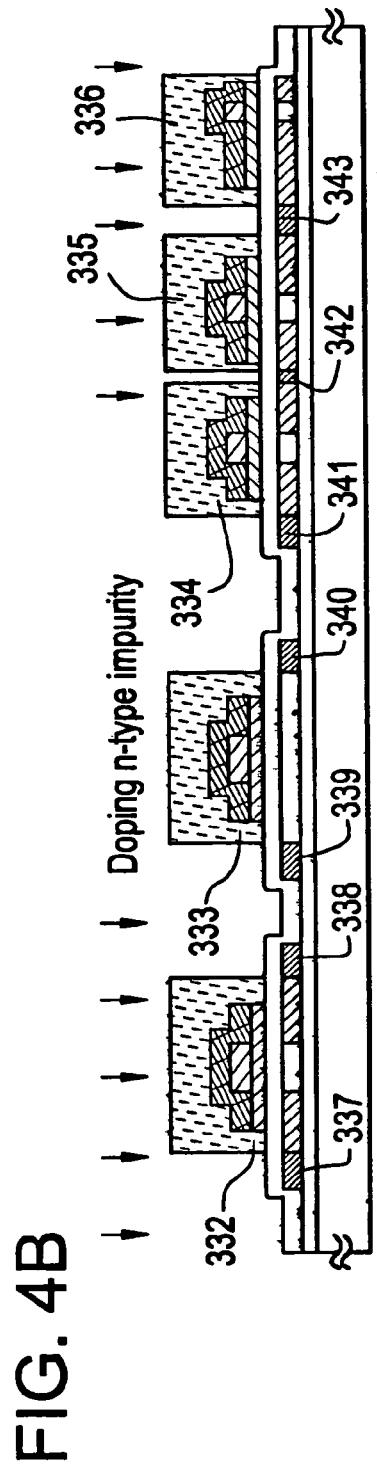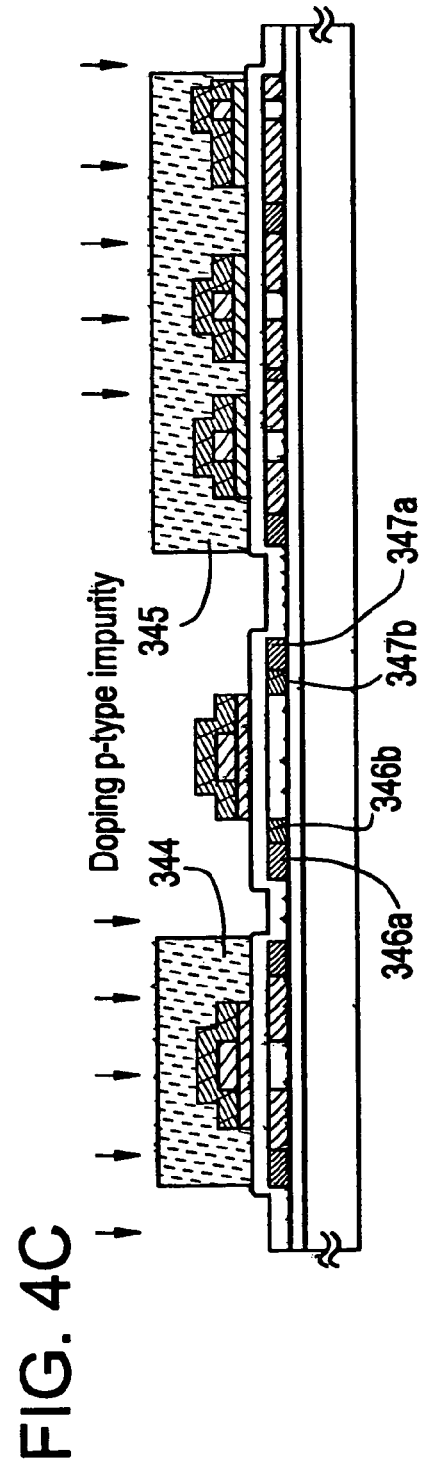

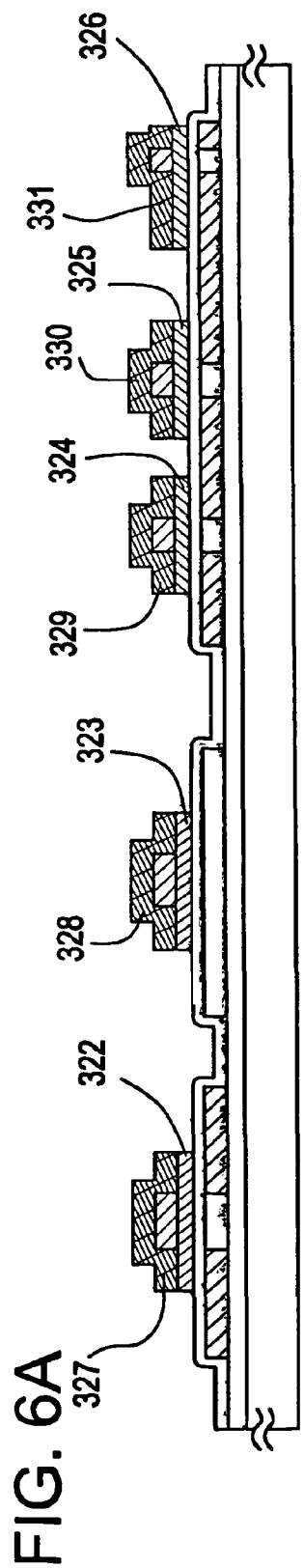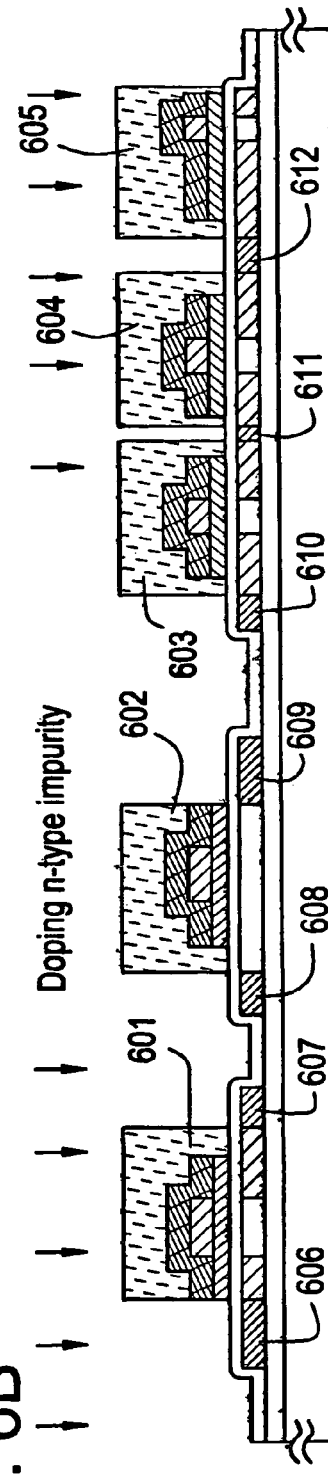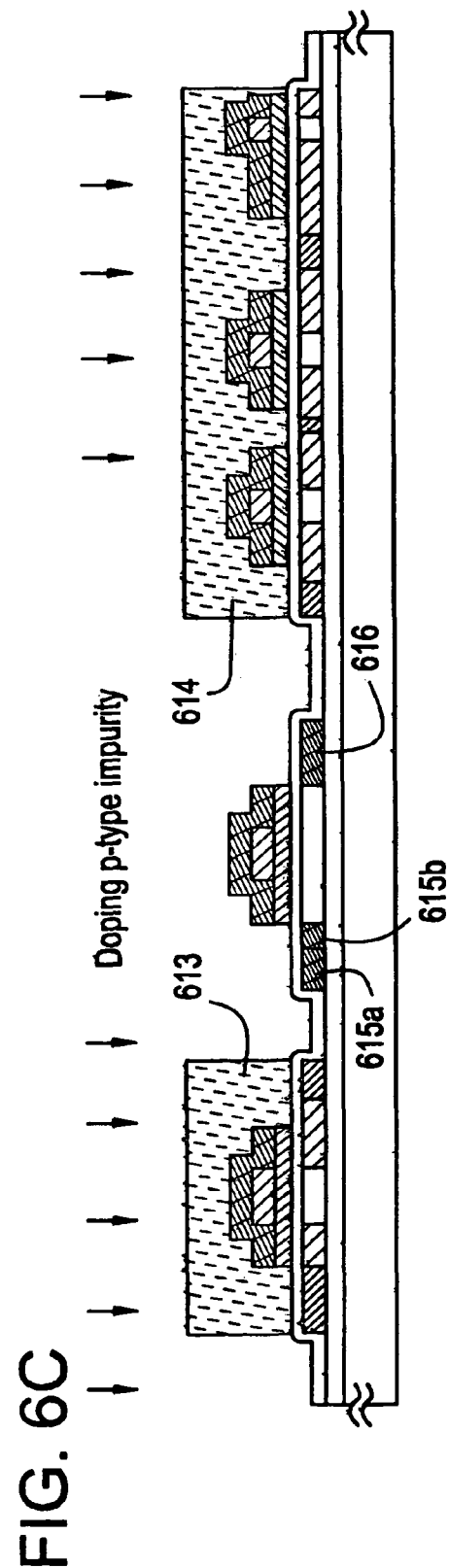

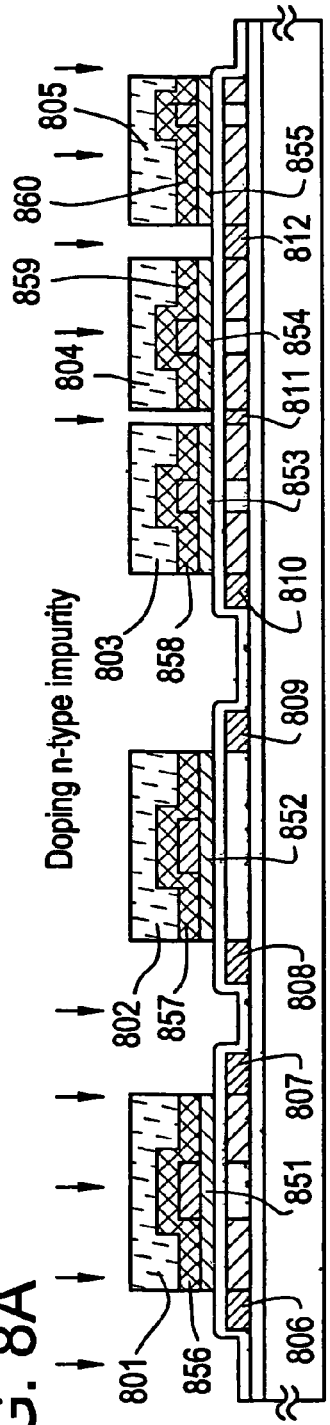
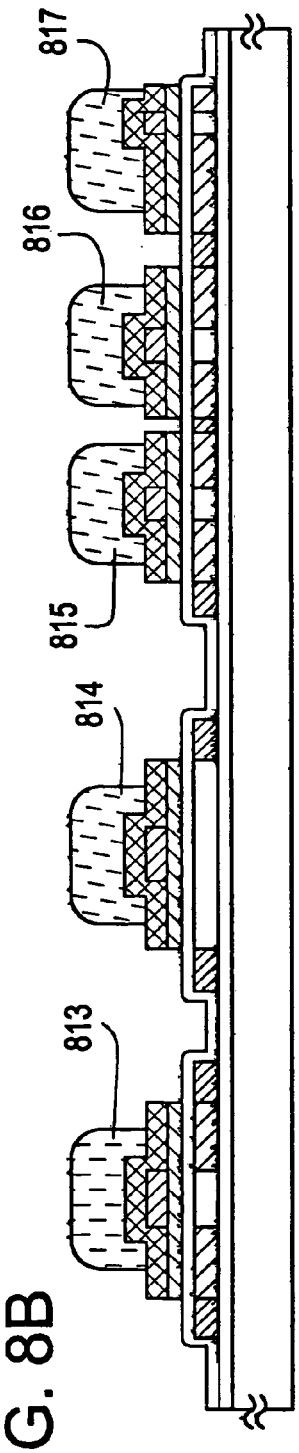
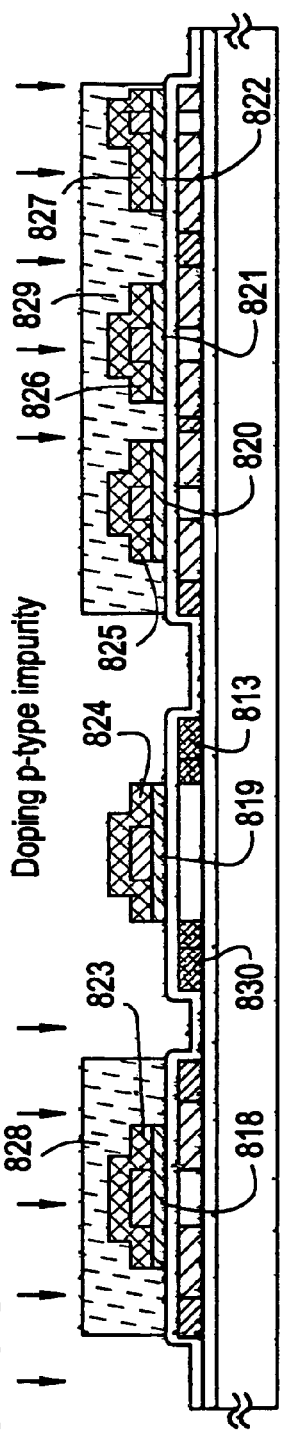

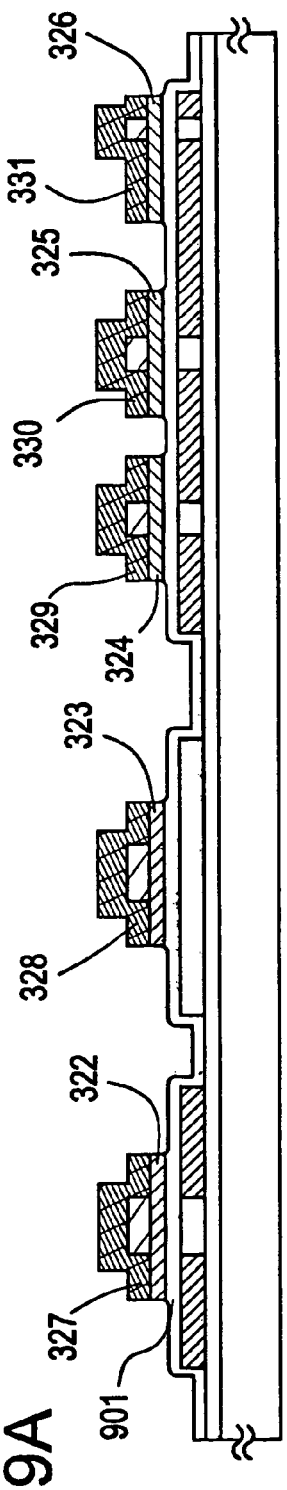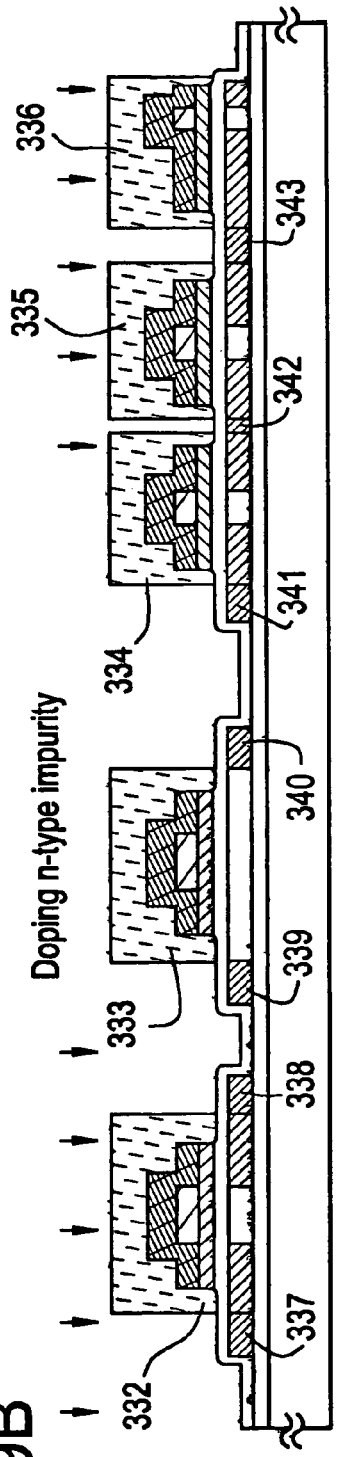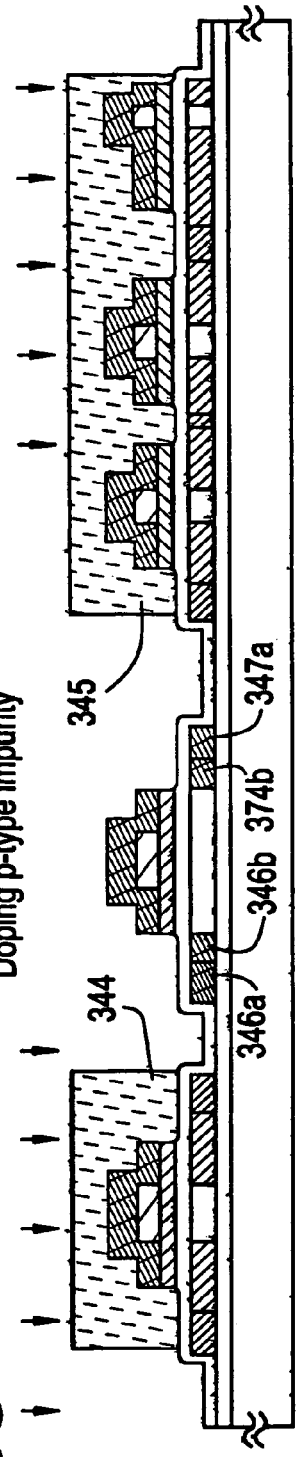

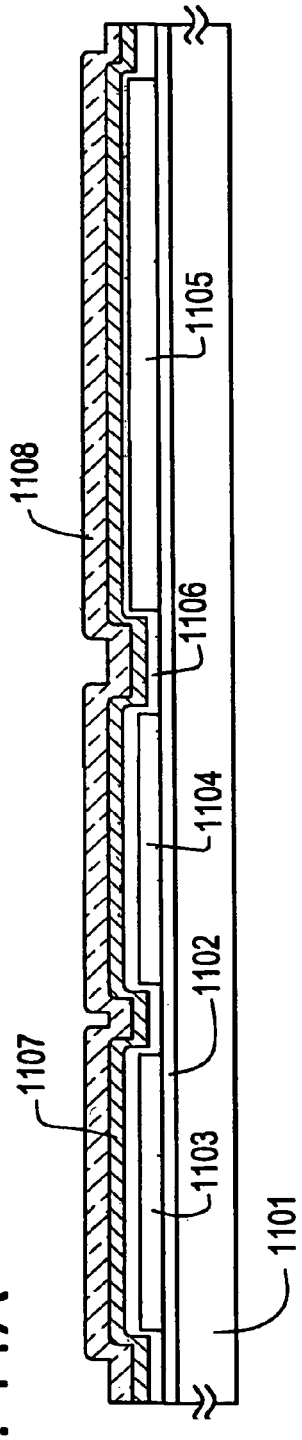
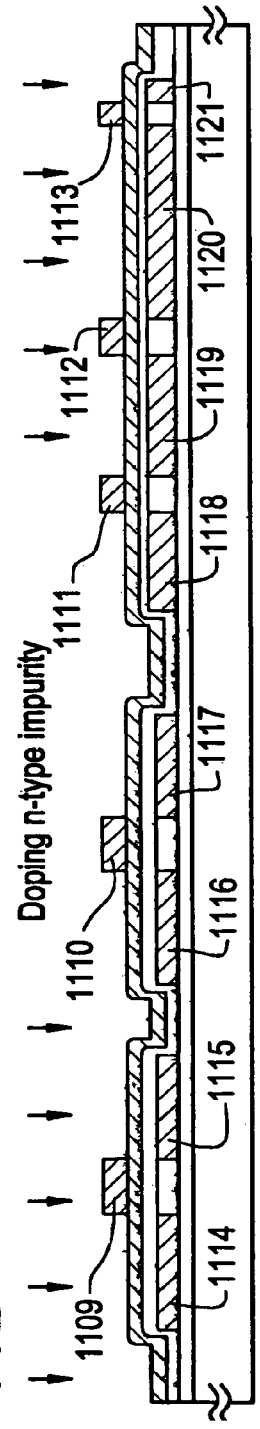
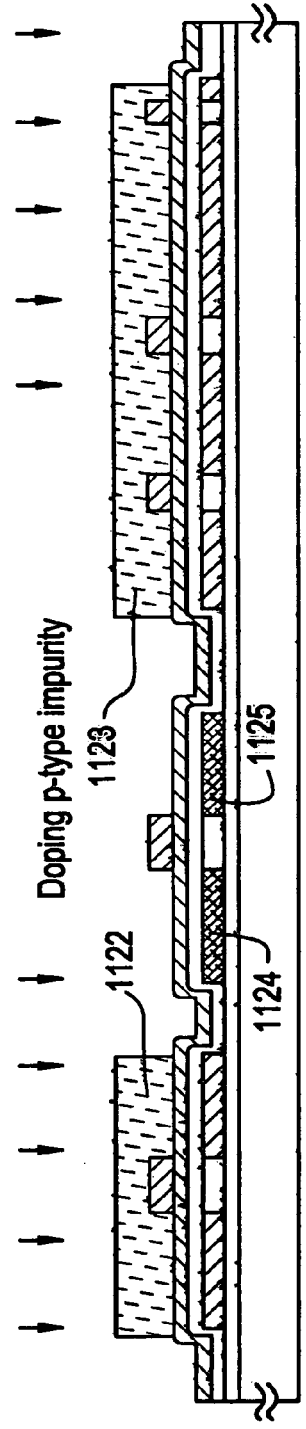
FIG. 11A
FIG. 11B
FIG. 11C

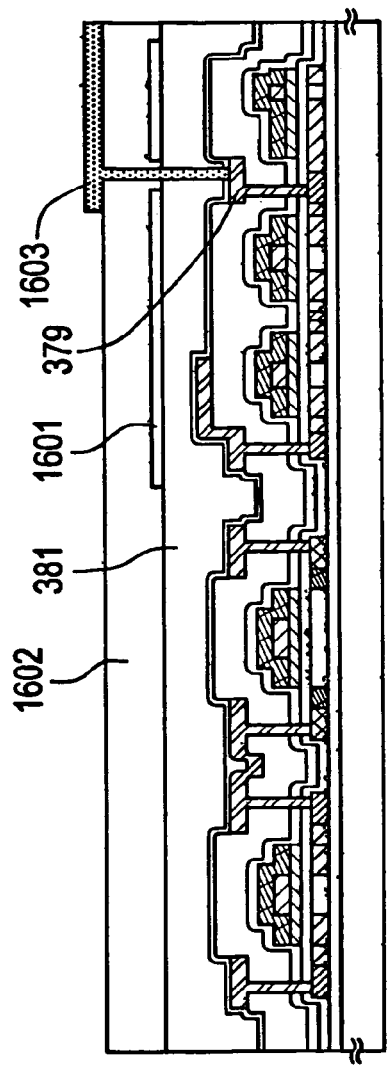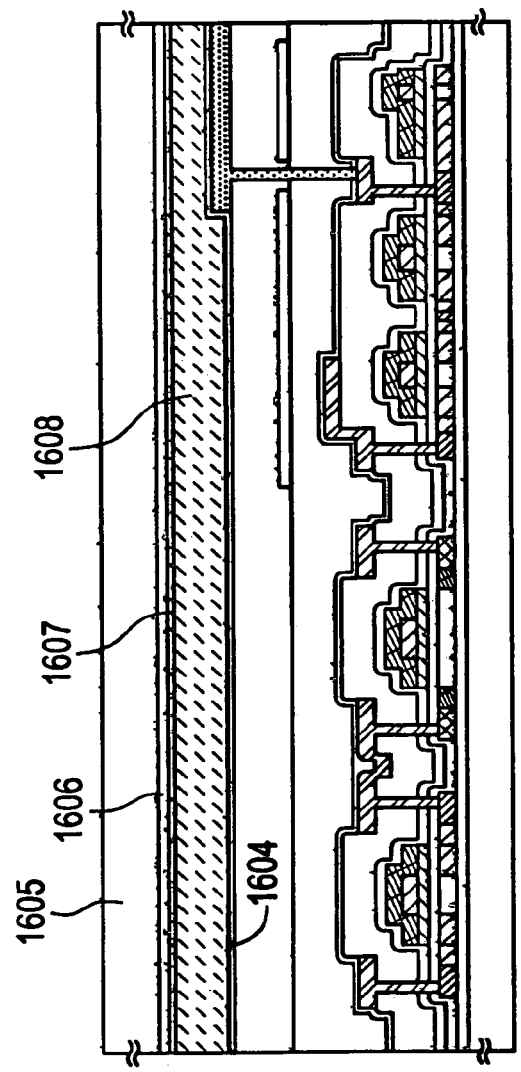

CRYSTALLIZATION

CRYSTALLIZATION

Doping phosphorus

Heat Treatment

SEMICONDUCTOR DEVICE AND WIRING STRUCTURE OF TRIPLE-LAYER

BACKGROUND OF THE INVENTION

1. Field of the Invention

The present invention relates to a semiconductor device in which a circuit including a thin film transistor (hereinbelow, abbreviated to "TFT") is formed on a substrate having an electrically insulating surface, and a method of fabricating the semiconductor device. By way of example, it relates to the constructions of an electrooptic device which is typified by a liquid crystal display device, and an electronic equipment in which the electrooptic device is installed. Incidentally, herein this specification, the expression semiconductor device is intended to signify general devices which function by utilizing semiconductor properties, and it shall cover within its category such electrooptic device and the electronic equipment as exemplified above.

2. Description of the Related Art

There have been positively fostered the developments of techniques for fabricating an active matrix type liquid crystal display device by providing TFTs on a glass substrate or a quartz substrate. Among the TFTs, a TFT whose active layer is a semiconductor film having a crystalline structure (hereinbelow, termed crystalline TFT) attains a high mobility. It is therefore said that the crystalline TFTs can integrate functional circuits on an identical substrate, thereby to realize image display of high definition.

Here in this specification, the semiconductor film having a crystalline structure shall cover a single-crystal semiconductor, a polycrystalline semiconductor and a microcrystalline semiconductor. Further, it shall cover semiconductors disclosed in the official gazette of a Japanese Patent Application Laid-open No. 7-130652 (1995) which corresponds to a U.S. Pat. No. 5,642,826, a Laid-open No. 8-78329 (1996), a Laid-open No. 10-135468 (1998) which corresponds to a U.S. patent application Ser. No. 08/951,193, a Laid-open No. 10-135469 (1998) which corresponds to a Ser. No. 08/951,819, or a Laid-open No. 10-247735 (1998) which corresponds to a Ser. No. 09/034,041.

In order to construct the active matrix type liquid crystal display device, the n-channel TFTs (hereinbelow, termed pixel TFTs) of a pixel matrix circuit are necessary in as large a number as 1,000,000 through 2,000,000. Further, when the TFTs of functional circuits provided around the pixel matrix circuit are added, a still larger number of crystalline TFTs are necessary. Specifications required of the liquid crystal display device are severe. For the purpose of stably presenting image display, eventually, it is the primary requisite to ensure the reliability of each individual crystalline TFT.

The characteristics of a field effect transistor such as the TFT can be considered as being divided into a linear region where a drain current and a drain voltage increase in proportion, a saturation region where the drain current becomes saturated even when the drain voltage is increased, and a cutoff region where ideally no current flows even when the drain voltage is applied. In this specification, the linear region and the saturation region shall be called an ON region of the TFT, and the cutoff region an OFF region. Besides, for the sake of convenience, the drain current in the ON region shall be called an ON current, and a current in the OFF region an OFF current.

Concerning the pixel TFT, a gate voltage having an amplitude of about 15 to 20 V is applied as a drive condition. Accordingly, the pixel TFT needs to satisfy the characteristics of both the ON region and the OFF region. On the other hand, each peripheral circuit for driving the pixel matrix circuit is constructed on the basis of a CMOS circuit, in which importance is chiefly attached to the characteristics of the ON region.

In this regard, it is said that the crystalline TFT is still inferior in point of reliability to a MOS transistor (a transistor fabricated on a single-crystal semiconductor substrate) which is used for an LSI, etc. By way of example, when the crystalline TFT is continuously driven, such deteriorating phenomena as lowering in the field effect mobility, decrease in the ON current and increase in the OFF current are sometimes observed. A cause for the deteriorating phenomena is the injection of hot carriers, that is, the hot carriers created by a high electric field near the drain of the TFT incur the deteriorating phenomena.

In the technical field of the LSIs, an LDD (Lightly Doped Drain) structure has been known as an expedient for decreasing the OFF current of the MOS transistor and for mitigating a high electric field near the drain of the MOS transistor. The structure is such that impurity regions of low concentration are provided outside a channel forming region. The low-concentration impurity regions are called LDD regions.

Even in the crystalline TFT, the formation of an LDD structure has, of course, been known. The official gazette of Japanese Patent Application Laid-open No. 7-202210 (1995), for example, discloses a technique wherein a gate electrode is formed into a structure of two layers which have widths different from each other, and concretely, in which the upper layer is narrower than the lower layer, and ions are subsequently implanted using the gate electrode as a mask, whereby LDD regions are formed by one time of ion implantation by utilizing the different penetration depths of the ions based on the fact that the thickness of the gate electrode is not uniform. Herein, the gate electrode overlaps the LDD regions directly.

Such a structure has been known as a GOLD (Gate-drain Overlapped LDD) structure, a LATID (Large-tilt-angle implanted drain) structure, or an ITLDD (Inverse T LDD) structure. It can mitigate the high electric field near the drain, thereby to prevent the phenomenon of the hot carrier injection and to enhance the reliability. In, for example, Mutsuko Hatano, Hajime Akimoto and Takeshi Sakai: IEDM97 TECHNICAL DIGEST, pp. 523-526, 1997, a TFT which has a GOLD structure based on side walls formed of silicon has been verified to attain a reliability which is far superior to those of TFTs of other structures.

However, the structure laid open in the above paper has the problem that the OFF current of the TFT increases more than with the conventional LDD structure, and it necessitates a measure for eliminating the problem. Especially in the pixel TFT constituting the pixel matrix circuit, the increase of the OFF current results in augmenting power dissipation or/and causing abnormality to appear in the image display. Therefore, the GOLD structure cannot be applied to the crystalline TFT as it is.

SUMMARY OF THE INVENTION

The present invention consists in techniques for solving the problems as stated above, and has for its object to incarnate a crystalline TFT which achieves a reliability equivalent or superior to that of a MOS transistor and which also attains good characteristics in both the ON region and the OFF region thereof.

Another object of the present invention is to incarnate a semiconductor device of high reliability which includes a semiconductor circuit formed of such crystalline TFTs.

FIGS. 18(A-1) and 18(B-1) through FIGS. 18(A-4) and 18(B-4) schematically illustrate the structures of TFTs and Vg-Id (gate voltage-drain current) characteristics attained with the structures, on the basis of knowledge hitherto obtained. FIG. 18(A-1) is a schematic sectional view showing the simplest structure of the TFT in which a semiconductor layer below a gate electrode consists of a channel forming region, a source region and a drain region ($n^+$ regions). FIG. 18(B-1) is a graph showing the Vg-Id characteristics in which a +Vg side is the ON region of the TFT, while a −Vg side is the OFF region thereof. Herein, a solid line indicates initial characteristics, and a broken line indicates characteristics deteriorated by the phenomenon of hot carrier injection. With the structure, both the ON current and OFF current of the TFT are high, and the deteriorations are of large magnitudes. Therefore, the TFT left intact cannot be used for, for example, the pixel TFT of a pixel matrix circuit.

FIG. 18(A-2) is a schematic sectional view showing the LDD structure of the TFT in which low-concentration impurity regions ($n^-$ region) serving as LDD regions are added to the structure depicted in FIG. 18(A-1), and in which the LDD regions and a gate electrode do not overlap each other. FIG. 18(B-2) is a graph showing the Vg-Id characteristics of the TFT. With the structure, the deterioration in the OFF current of the TFT can be suppressed to some extent, but the deterioration in the ON current of the TFT cannot be prevented. Besides, FIG. 18(A-3) is a schematic sectional view showing the structure (called the GOLD structure) of the TFT in which entire LDD regions and a gate electrode overlap each other. FIG. 18(B-3) is a graph of the Vg-Id characteristics corresponding to FIG. 18(A-3). The structure can suppress the deteriorations to the extent of posing no problem, but it increases the OFF current of the TFT on the −Vg side more than the structure depicted in FIG. 18(A-2).

Accordingly, any of the structures shown in FIGS. 18(A-1), 18(A-2) and 18(A-3) cannot satisfy those characteristics of the ON region and the OFF region which are necessary for the pixel matrix circuit, simultaneously with the reliability of the TFT. In contrast to the above structures, a structure shown in FIG. 18(A-4) is such that each of LDD regions which a gate electrode overlaps consists of a part which lies under the gate electrode, and a part which does not lie under the gate electrode. With the structure, it is possible as seen from FIG. 18(B-4) to satisfactorily suppress the deterioration in the ON current of the TFT and to decrease the OFF current thereof.

The structure shown in FIG. 18(A-4) has been derived from the following consideration: With the structure as shown in FIG. 18(A-3), when a negative voltage is applied to the gate electrode of the n-channel TFT, that is, when the TFT is operated in the OFF region, holes are induced at the interfaces between the LDD regions, which the gate electrode overlaps, and a gate insulating film, with increase in the negative voltage, and a current path based on the minority carriers as joins the drain region, LDD regions and channel region of the TFT is formed. On this occasion, if the drain region is under the application of a positive voltage, the holes will flow to the side of the source region of the TFT. This will be a cause for the increase of the OFF current.

It can be considered that LDD regions in which the minority carriers are not accumulated in spite of the application of the gate voltage may be provided in order to cut off the above current path midway. The present invention pertains to a TFT having such a structure, and a circuit employing the TFTs.

Accordingly, in one aspect of performance of the present invention, a semiconductor device wherein a TFT is formed on a substrate, the TFT having a semiconductor layer, a gate insulating film formed on the semiconductor layer, and a gate electrode formed on the gate insulating film; is characterized in that said gate electrode includes a first layer which is formed in contact with said gate insulating film, a second layer which is formed on and inside said first layer, and a third layer which is formed in contact with said first layer and said second layer; that said semiconductor layer includes a channel forming region, a first impurity region of one conductivity type, and a second impurity region of said one conductivity type which is formed between said channel forming region and said first impurity region; and that a part of said second impurity region of said one conductivity type lies under said first layer of said gate electrode.

In another aspect of performance of the present invention, a method of fabricating a semiconductor device is characterized by comprising the first step of forming a semiconductor layer on a substrate which has an insulating surface; the second step of forming a gate insulating film in contact with said semiconductor layer; the third step of successively forming a conductive layer (A) and a conductive layer (B) on said gate insulating film; the fourth step of etching said conductive layer (B) into a predetermined pattern, thereby to form a second layer of a gate electrode; the fifth step of doping a selected region of said semiconductor layer with an impurity element of one conductivity type; the sixth step of forming a conductive layer (C) in contact with said conductive layer (A) and said second layer of said gate electrode; the seventh step of etching said conductive layer (C) and said conductive layer (A) into predetermined patterns, thereby to form a third layer of said gate electrode and a first layer thereof; and the eighth step of doping a selected region of said semiconductor layer with an impurity element of said one conductivity type.

In still another aspect of performance of the present invention, a method of fabricating a semiconductor device is characterized by comprising the first step of forming a semiconductor layer on a substrate which has an insulating surface; the second step of forming a gate insulating film in contact with said semiconductor layer; the third step of successively forming a conductive layer (A) and a conductive layer (B) on said gate insulating film; the fourth step of etching said conductive layer (B) into a predetermined pattern, thereby to form a second layer of a gate electrode; the fifth step of doping a selected region of said semiconductor layer with an impurity element of one conductivity type; the sixth step of forming a conductive layer (C) in contact with said conductive layer (A) and said second layer of said gate electrode; the seventh step of etching said conductive layer (C) and said conductive layer (A) into predetermined patterns, thereby to form a third layer of said gate electrode and a first layer thereof; the eighth step of doping a selected region of said semiconductor layer with an impurity element of said one conductivity type; and the ninth step of removing parts of said first layer of said gate electrode and said third layer thereof.

In yet another aspect of performance of the present invention, a method of fabricating a semiconductor device is characterized by comprising the first step of forming a first semiconductor layer and a second semiconductor layer on a substrate which has an insulating surface; the second step of forming a gate insulating film on said first semiconductor layer and said second semiconductor layer; the third step of successively forming a conductive layer (A) and a conductive layer (B) on said gate insulating film; the fourth step of etching said conductive layer (B) into a predetermined pattern, thereby to form a second layer of a gate electrode; the fifth step of doping a selected region of said first semiconductor layer with an impurity element of one conductivity type; the sixth step of forming a conductive layer (C) in contact with said conductive layer (A) and said second layer of said gate electrode; the seventh step of etching said conductive layer (C) and said conductive layer (A) into predetermined patterns, thereby to form a third layer of said gate electrode and a first layer thereof; the eighth step of doping selected regions of said first semiconductor layer and said second semiconductor layer with an impurity element of said one conductivity type; and the ninth step of doping a selected region of said second semiconductor layer with an impurity of a conductivity type opposite to said one conductivity type.

Such a TFT is well suited for application to the n-channel TFT of a CMOS circuit or the pixel TFT of a pixel matrix circuit. In the structure of the TFT according to the present invention, said first impurity region formed in said semiconductor layer functions as a source region or a drain region, and said second impurity region functions as an LDD region. Accordingly, a concentration of an impurity element of said one conductivity type is lower in said second impurity region than in said first impurity region.

The semiconductor device according to the present invention can be so constructed that a retention capacitance is formed of an impurity region of said one conductivity type which is provided at one end of said semiconductor layer, said gate insulating film, and a wiring line which is constituted by said first layer of said gate electrode, said second layer thereof and said third layer thereof, and that said retention capacitance is connected to a source or a drain of said TFT.

Further, the semiconductor device according to the present invention is characterized in that said first layer of said gate electrode and said third layer thereof are formed containing at least one member selected from the group consisting of elements of silicon (Si), titanium (Ti), tantalum (Ta), tungsten (W) and molybdenum (Mo), and a compound which contains any of said elements as its component, and that said second layer of said gate electrode is formed containing at least one member selected from the group consisting of elements of aluminum (Al) and copper (Cu), and a compound which contains any of said elements as its principal component.

BRIEF DESCRIPTION OF THE DRAWINGS

FIGS. 6A through 6C are sectional views showing a process for fabricating TFTs in the second embodiment of the present invention;

FIGS. 8A through 8C are sectional views showing a process for fabricating TFTs in the third embodiment of the present invention;

FIGS. 9A through 9C are sectional views showing a process for fabricating TFTs in the fourth embodiment of the present invention;

FIGS. 11A through 11C are sectional views showing a process for fabricating TFTs in the fifth embodiment of the present invention;

FIGS. 16A and 16B are sectional views showing a process for fabricating a liquid crystal display device;

PREFERRED EMBODIMENTS OF THE INVENTION

An aspect of performance of the present invention will be described with reference to FIG. 1. A glass substrate, a plastics substrate, a ceramics substrate, or the like can be employed as a substrate 101 which has an electrically insulating substrate. It is also allowed to employ a silicon substrate or a stainless steel substrate whose surface is formed with an electrically insulating film such as silicon oxide film. A quartz substrate is also usable.

A underlying film 102 is formed on that surface of the substrate 101 on which TFTs are to be formed. The underlying film 102 may be a silicon oxide film, a silicon nitride film or a silicon oxide nitride film, which may be formed by plasma CVD or sputtering. This underlying film 102 is provided in order to prevent an impurity from diffusing from the substrate 101 into semiconductor layers. By way of example, the underlying film 102 may well have a double-layer structure in which a silicon nitride film being 25 to 100 nm thick is formed and is overlaid with a silicon oxide film being 50 to 200 nm thick.

The semiconductor layers to be formed in contact with the underlying film 102 should desirably be made of a crystalline semiconductor which is produced in such a way that an amorphous semiconductor film formed by a film forming method, such as plasma CVD, reduced-pressure CVD or sputtering, is crystallized by a solid-phase growth method based on laser annealing or thermal annealing. It is also possible to apply a microcrystalline semiconductor film which is formed by the above film forming method. Semiconductor materials which are applicable here, include silicon, germanium, a silicon-germanium alloy, and silicon carbide. In addition, compound semiconductor materials such as gallium arsenide are usable.

Figure 1:
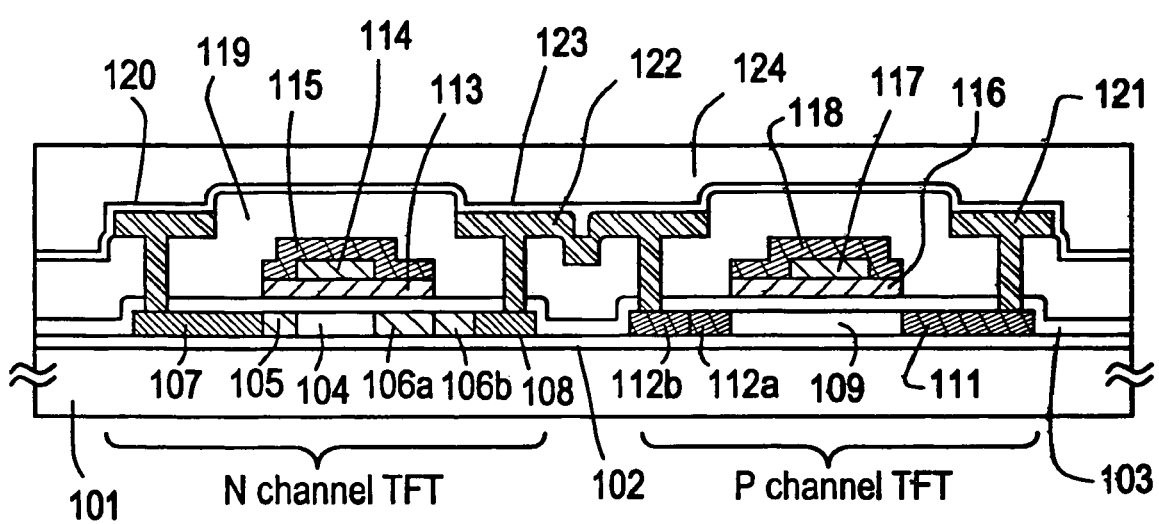
FIG. 1 is a sectional view of TFTs in an aspect of performance of the present invention.

FIG. 1 illustrates the sectional structure of an n-channel TFT and a p-channel TFT. The gate electrodes of the n-channel TFT and p-channel TFT are constituted by their first layers, second layers and third layers. The first layers 113, 116 of the respective gate electrodes are formed in contact with a gate insulating film 103. Besides, the second layers 114, 117 of the respective gate electrodes are formed shorter than the first layers thereof in the directions of the channel lengths of the corresponding TFTs and are provided on the first layers 113, 116 of the respective gate electrodes. Further, the third layers 115, 118 of the respective gate electrodes are formed on the first layers 113, 116 and second layers 114, 117 thereof.

The first layers 113, 116 of the respective gate electrodes are formed of a material which is selected from the elements of silicon (Si), titanium (Ti), tantalum (Ta), tungsten (W) and molybdenum (Mo), or a material which contains any of the elements as its component. By way of example, the first layers 113, 116 may well be made of a W—Mo compound, tantalum nitride (TaN) or tungsten nitride (WN). The thickness of each of the first layers 113, 116 may be set at 10 to 100 nm, preferably at 20 to 50 nm.

The second layers 114, 117 of the respective gate electrodes should desirably be formed of a material of low electric resistivity which contains aluminum (Al) or copper (Cu) as its component. The thickness of each of the second layers 114, 117 may be set at 50 to 400 nm, preferably at 100 to 200 nm. The second layers 114, 117 are formed for the purpose of lowering the electric resistances of the corresponding gate electrodes, and their thicknesses may be determined in consideration of both the lengths and electric resistances of bus lines and gate wiring lines which are to be connected to the corresponding gate electrodes.

Likewise to the first layers 113, 116 of the respective gate electrodes, the third layers 115, 118 thereof are formed of a material which is selected from the elements of silicon (Si), titanium (Ti), tantalum (Ta), tungsten (W) and molybdenum (Mo), or a material which contains any of the elements as its component. The thickness of each of the third layers 115, 118 may be set at 50 to 400 nm, preferably at 100 to 200 nm.

Anyway, the first layers, second layers and third layers of the respective gate electrodes may be formed as the films of the above materials by sputtering, and they may be patterned into predetermined shapes by wet etching and dry etching. Here, for forming the third layers of the respective gate electrodes so as to cover the second layers thereof, it is required, not only to control the thicknesses of these second layers as explained above, but also to set sputtering conditions appropriately. By way of example, it is an effective expedient to set comparatively low speeds as the film forming rates of the films to-be-formed.

As shown in FIG. 1, each of the gate electrodes is constructed into a clad structure in which the second layer of the gate electrode is enclosed with the first layer and third layer thereof, whereby the thermal resistance of the gate electrode can be enhanced. The second layer of the gate electrode should desirably be made of the material of low electric resistivity such as Al or Cu. In this regard, when the material is heated at or above 450 degrees centigrade, there occur the problems that a hillock appears and that the material diffuses into the surrounding insulating film and semiconductor layer. Such phenomena, however, can be prevented by the clad structure in which the second layer is enclosed with the material of any of Si, Ti, Ta, W and Mo or the material containing any of the elements as its component.

The semiconductor layer of the n-channel TFT consists of a channel forming region 104, first impurity regions 107, 108, and second impurity regions 105 and 106a, 106b which are formed in contact with the channel forming region 104. Both the first semiconductor regions and the second impurity regions are doped with an impurity element which bestows the n-conductivity type. On this occasion, the concentration of the impurity element in the first impurity regions is set at $1\times10^{20}$ to $1\times10^{21}$ atoms/cm$^3$, preferably $2\times10^{20}$ to $5\times10^{20}$ atoms/cm$^3$, while the concentration of the impurity element in the second impurity regions is set at $1\times10^{16}$ to $5\times10^{19}$ atoms/cm$^3$, typically $5\times10^{17}$ to $5\times10^{18}$ atoms/cm$^3$. The first impurity regions 107, 108 are function as the source region and drain region of the n-channel TFT, respectively.

On the other hand, the third impurity region 111 or 112a, 112b of the p-channel TFT function as the source region or drain region thereof. The third impurity region 112b contains the impurity element bestowing the n-conductivity type, at the same concentration as that of the first impurity regions 107, 108 of the n-channel TFT, but it is doped with an impurity element bestowing the p-conductivity type, at a concentration which is 1.5 to 3 times as high as the concentration of the n-type impurity element.

The doping of the second impurity regions 105 and 106a, 106b with the impurity element is carried out by a method in which the impurity element bestowing the n-conductivity type as a dopant is passed through the first layer 113 of the gate electrode and the gate insulating film 103 so as to be introduced into the semiconductor layer.

Figure 2A:
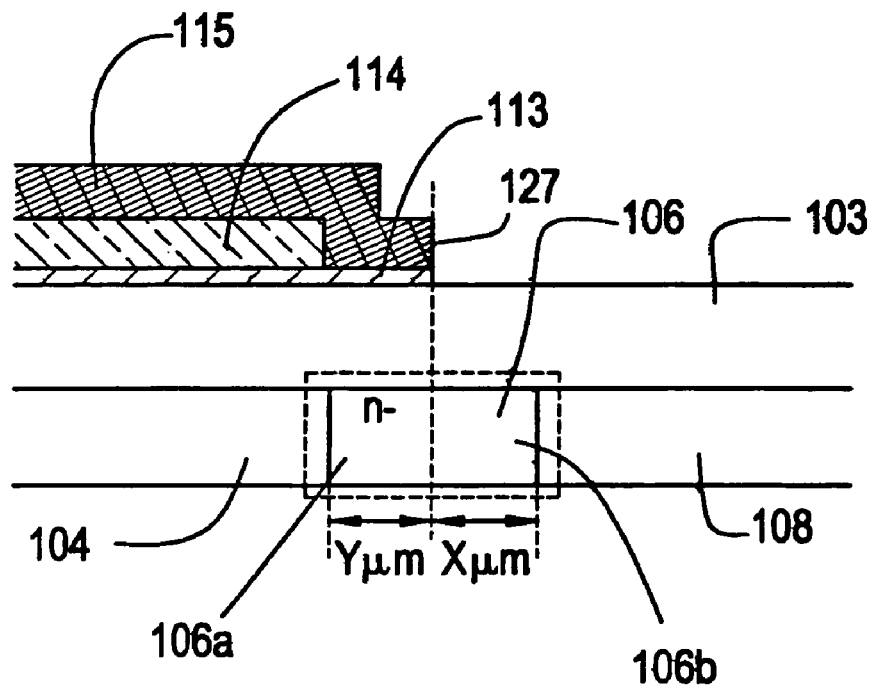
FIGS. 2A and 2B are diagrams for explaining the positional relationship between a gate electrode and a second impurity region.
Figure 2B:
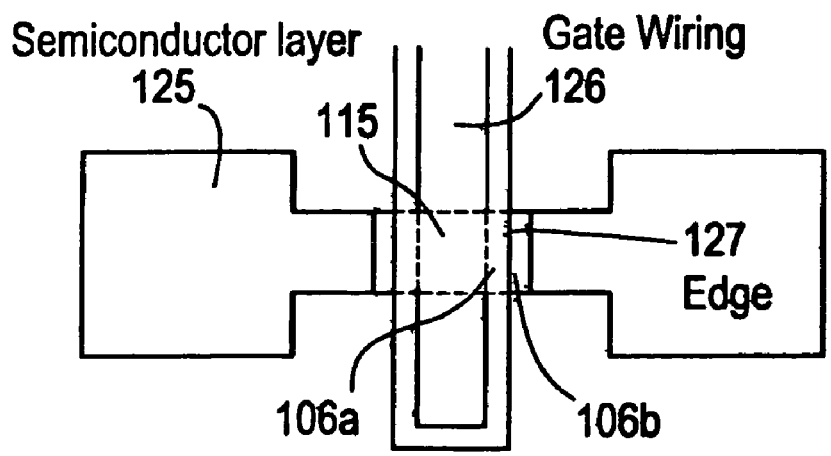

As illustrated in FIGS. 2A and 2B, the second impurity regions 106a, 106b can be divided into the second impurity region 106a which lies under the gate electrode through the gate insulating film 103, and the second impurity region 106b which does not lie under the gate electrode. That is, they consist of an LDD region (a GOLD region) which the gate electrode overlaps, and an LDD region which the gate electrode does not overlap. The formation of the divided regions is implemented by the first step of introducing the impurity element of one conductivity type (the formation of the second impurity regions), and the second step of introducing the impurity element of one conductivity type (the formation of the first impurity regions). On this occasion, photoresist may be utilized as each mask. This is a method which is very convenient when circuits of different drive voltages are to be fabricated on an identical substrate.

TABLE 1

|  | Drive Voltage | Channel Length | Y | X |
|---|---|---|---|---|
| Buffer | 16 ± 2 V | 5.0 ± 1.5 μm | 2.5 ± 0.3 μm | 2.5 ± 0.5 μm |
| Circuit | 20 ± 3 V | 5.0 ± 2.0 μm | 3.0 ± 0.5 μm | 3.0 ± 0.5 μm |

TABLE 1-continued

|  | Drive Voltage | Channel Length | Y | X |
|---|---|---|---|---|
| Logic Circuit | 5 ± 1 V | 3.0 ± 1.0 μm | 0.5 ± 0.3 μm | 0.5 ± 0.3 μm |
| | 10 ± 1 V | 3.5 ± 1.0 μm | 2.0 ± 0.3 μm | 1.0 ± 0.5 μm |
| Analog Switch | 16 ± 2 V | 3.0 ± 1.0 μm | 1.5 ± 0.5 μm | 1.5 ± 0.5 μm |
| Pixel Circuit | 16 ± 2 V | 3.0 ± 1.0 μm | 1.5 ± 0.5 μm | 1.5 ± 0.5 μm |

Table 1 tabulates examples of the design values of TFTs which are used for the buffer circuit portion, logic circuit portion, analog switch portion and pixel matrix circuit portion of a liquid crystal display device. Herein, not only the channel lengths of the TFTs, but also the length Y of the second impurity region 106a underlying the gate electrode and the length X of the second impurity region 106b not underlying the gate electrode can be set considering the drive voltages of the individual TFTs.

Regarding the TFTs of the shift register circuit of a drive circuit and the TFTs of the buffer circuit, importance is basically attached to the characteristics of the ON region of each TFT. Therefore, the TFT may well have the so-called GOLD structure and need not always be provided with the second impurity region 106b not underlying the gate electrode. However, in a case where the region 106b is daringly provided, its length may be set within a range of 0.5 to 3 μm in consideration of the drive voltage. Anyway, the value of the second impurity region 106b not underlying the gate electrode should desirably be enlarged with rise in the drive voltage, in consideration of the withstand voltage thereof.

Besides, regarding the TFTs which are provided in the analog switches and the pixel matrix circuits, the OFF current of each TFT must not increase. In case of a drive voltage of 16 V by way of example, therefore, the length of the second impurity region 106a underlying the gate electrode is set at 1.5 μm, and that of the second impurity region 106b not underlying the gate electrode is set at 1.5 μm, with the channel length set at 3 μm. Of course, the present invention is not restricted to the design values mentioned here, but a person who designs such TFTs may properly determine the lengths.

Figure 17:
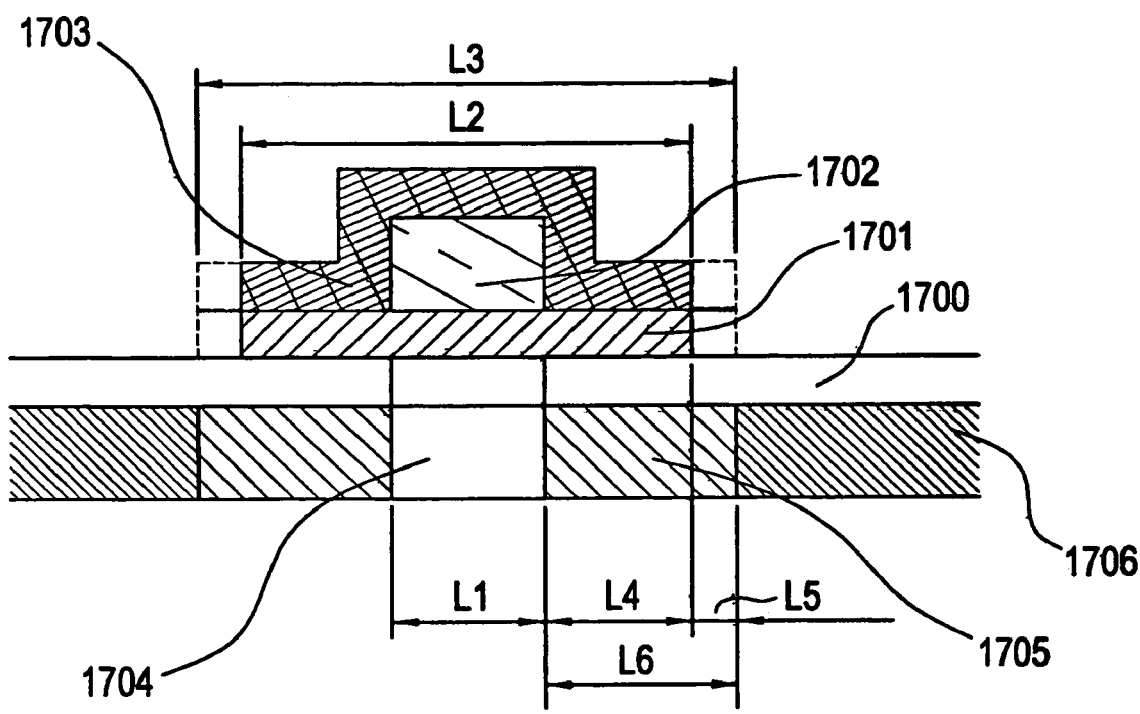
FIG. 17 is a diagram showing the construction of a gate electrode.

Meanwhile, as illustrated in FIG. 17, in the present invention, the lengths of the first layer 1701, second layer 1702 and third layer 1703 of a gate electrode in the direction of the channel length of a TFT to be fabricated relate deeply with the dimensions of the TFT. The length of the second layer 1702 of the gate electrode in the channel length direction corresponds substantially to the channel length L1. Herein, the channel length L1 may be set at a value of 0.1 to 10 μm, typically 0.2 to 5 μm.

In addition, the length L6 of a second impurity region 1705 can be set at will by masking with photoresist as explained before. This length L6 should desirably be set at 0.2 to 6 μm, typically 0.6 to 3 μm.

That length L4 of the second impurity region 1705 which this region underlies the gate electrode, relates closely with the length L2 of the first layer 1701 of the gate electrode. The length L4 should desirably be set at 0.1 to 4 μm, typically 0.5 to 3 μm. Besides, that length L5 of the second impurity region 1705 which this region does not underlie the gate electrode may usually be set at 0.1 to 3 μm, typically 0.3 to 2 μm, though the region of this length L5 not underlying the gate electrode need not always be provided as explained before. Here, the lengths L4 and L5 may be determined, for example, on the basis of the drive voltage of the TFT as explained before.

In the case illustrated in FIG. 1, the channel forming region 1704 may well be doped with boron at a concentration of $1 \times 10^{16}$ to $5 \times 10^{18}$ atoms/cm$^3$ beforehand. The element boron is introduced for controlling the threshold voltage of the TFT, and it can be replaced with any other element which can bring forth the same effect.

As thus far described, according to the present invention, the respective gate electrodes are formed of the first layers 113, 116, the second layers 114, 117 and the third layers 115, 118, and they are constructed as the clad structure in which the second layers 114, 117 of the respective gate electrodes are enclosed with the first layers 113, 116 and third layers 115, 118 thereof as shown in FIG. 1. As another feature, in at least the n-channel TFT, a part of the second impurity region 106 provided in the semiconductor layer lies under such a gate electrode through the gate insulating film 103.

In the n-channel TFT, the second impurity region may well be provided only on the side of the drain region (the side of the first impurity region 108 in FIG. 1) with respect to the channel forming region 104. Besides, in a case where the characteristics of both the ON region and OFF region of the TFT are required as of the pixel TFT of the pixel matrix circuit, the second impurity regions should desirably be provided on both the side of the source region (the side of the first impurity region 107 in FIG. 1) and the side of the drain region (the side of the first impurity region 108 in FIG. 1) with respect to the channel forming region 104.

On the other hand, in the p-channel TFT, the semiconductor layer is formed with a channel forming region 109, and the third impurity regions 111 and 112a, 112b. Of course, the p-channel TFT may well be constructed into the same structure as that of the n-channel TFT according to the present invention. Since, however, the p-channel TFT originally has a high reliability, it is more preferable that the ON current of the p-channel TFT is increased so as to balance the characteristics thereof with those of the n-channel TFT. In the case where the present invention is applied to the CMOS circuit as illustrated in FIG. 1, the balance of the characteristics is especially important. However, no problem is posed when the structure according to the present invention is applied to the p-channel TFT.

When the n-channel TFT and the p-channel TFT have been completed in this way, they are covered with a first interlayer insulating film 119 and are provided with source wiring lines 120, 121 and a drain wiring line 122. In the construction illustrated in FIG. 1, a silicon nitride film is thereafter provided as a passivation film 123. Further, a second interlayer insulating film 124 made of a resin material is provided. The second interlayer insulating film 124 need not be restricted to the resin material. However, in the case of applying the present invention to the liquid crystal display device by way of example, the use of the resin material is preferable for ensuring the flatness of the surface of the device.

Although FIG. 1 has exemplified the CMOS circuit in which the n-channel TFTs and the p-channel TFTs are complementarily combined, the present invention is also applicable to an NMOS circuit employing n-channel TFTs, and the pixel matrix circuit of the liquid crystal display device.

The construction of the present invention elucidated above will be describe in more detail in conjunction with embodiments below.

Embodiment 1

In this embodiment, the construction of the present invention will be described concerning a method in which a pixel matrix circuit, and a CMOS circuit being the basic form of a drive circuit to be provided around the pixel matrix circuit are fabricated simultaneously.

Figures 1, 18A:
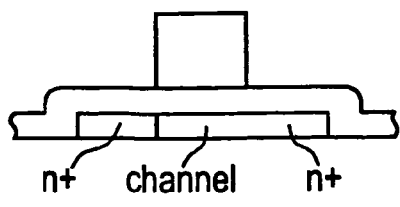
Figures 1, 18B:
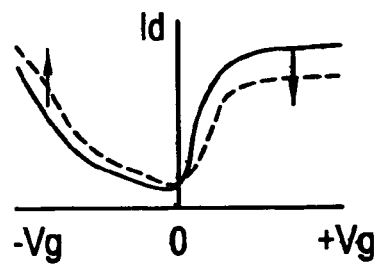
Figures 2, 18A:
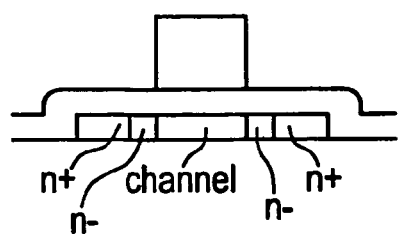
FIGS. 18(A-1), 18(B-1) through FIGS. 18(A-4), 18(B-4) are diagrams for explaining the structures and electrical characteristics of TFTs.
Figures 2, 18B:
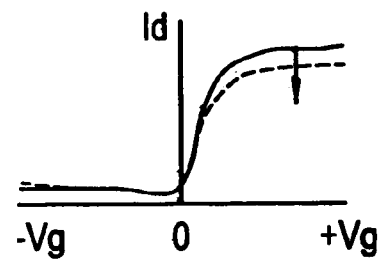
Figures 3, 18A:
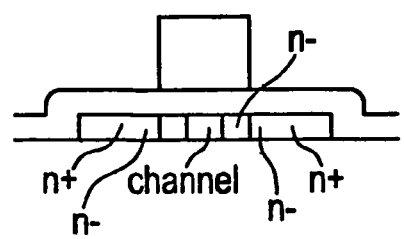
FIGS. 3A through 3C are sectional views showing a process for fabricating TFTs in the first embodiment of the present invention.
Figures 3, 18B:
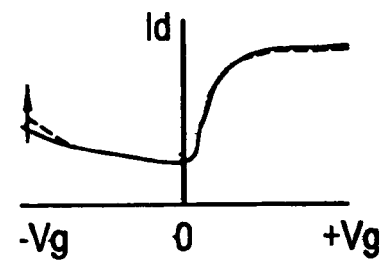

Referring to FIGS. 3A through 3C, a substrate 301 is a non-alkaline glass substrate which is typified by 1737 Glass Substrate of Corning Incorporated. An underlying film 302 is formed on that surface of the substrate 301 on which TFTs are to be formed, by plasma CVD or sputtering. Though not shown, a silicon nitride film being 25 to 100 nm, typically 50 nm thick, and a silicon oxide film being 50 to 300 nm, typically 150 nm thick, are formed as the underlying film 302.

Alternatively, the underlying film 302 may be formed by stacking a silicon oxide nitride film which is produced from $SiH_4$, $NH_3$ and $N_2O$ by plasma CVD to a thickness of 10 to 200 nm (preferably 50 to 100 nm), and a silicon oxide nitride film which is similarly produced from $SiH_4$ and $N_2O$ to a thickness of 50 to 200 nm (preferably 100 to 150 nm).

Subsequently, an amorphous silicon film being 50 nm thick is formed on the underlying film 302 by plasma CVD. The amorphous silicon film should desirably be dehydrogenated by heating for several hours preferably at 400 to 550 degrees centigrade though the conditions of the dehydrogenation depend also upon the hydrogen content of the deposited film, so as to decrease the hydrogen content to 5 atomic % or below, followed by the step of crystallization. Alternatively, an amorphous silicon film may well be formed by another producing method such as sputtering or vapor deposition, but impurity elements such as oxygen and nitrogen contained in the produced film should desirably be decreased sufficiently.

Here, since both the underlying film and the amorphous silicon film can be produced by the plasma CVD, they may well be consecutively formed in vacuum. In this case, the substrate is not once exposed to the atmospheric air after the formation of the underlying film, whereby the contamination of the surface of the resulting substrate can be prevented to relieve the discrepancy of the characteristics of TFTs to-be-fabricated.

The step of crystallizing the amorphous silicon film may well be implemented by a known technique such as laser annealing or thermal annealing. In this embodiment, a crystalline silicon film is formed in such a way that the light of a KrF excimer laser of pulse oscillation type is condensed into the shape of a lineal beam, with which the amorphous silicon film is irradiated.

In the case of implementing the crystallization by the laser annealing, an excimer laser or argon laser of pulse oscillation type or continuous light emission type is used as a light source for the crystallization. The light source may well be constituted by the fundamental harmonic of the output of a YAG laser and the second harmonic, third harmonic and fourth harmonic thereof. In the case of employing the excimer laser of pulse oscillation type, the laser annealing is implemented by shaping the laser light into the lineal beam. Although the conditions of the laser annealing are properly selected by a person who controls the process, they are set at, for example, a laser pulse oscillation frequency of 30 Hz and a laser energy density of 100 to 500 mJ/cm$^2$ (typically, 300 to 400 mJ/cm$^2$). The lineal beam is projected over the whole substrate surface, and the overlap rate of the traces of the lineal beam on this occasion is set at 80 to 98%.

In this embodiment, the crystalline silicon film for semiconductor layers is formed from the amorphous silicon film. It is also allowed, however, to employ a microcrystalline silicon film or to directly form the crystalline silicon film.

The crystalline silicon film thus formed is patterned into the semiconductor layers 303, 304 and 305 which are insular.

Subsequently, the insular semiconductor layers 303, 304 and 305 are covered with a gate insulating film 306 whose principal component is silicon oxide or silicon nitride. The gate insulating film 306 may be a silicon oxide nitride film which is formed from starting materials of $N_2O$ and $SiH_4$ by plasma CVD to a thickness of 10 to 200 nm, preferably 50 to 150 nm. Here, the silicon oxide nitride film is formed to a thickness of 100 nm.

The gate insulating film 306 is overlaid with gate electrodes each of which is constituted by the first layer, second layer and third layer thereof. First, an electrically conductive layer (A) 307 and an electrically conductive layer (B) 308 are formed. The conductive layer (A) 307 may be formed of a material selected from the elements of Ti, Ta, W and Mo, and a compound containing any of the elements as its component may well be employed considering an electric resistance and a thermal resistance. In addition, the thickness of the conductive layer (A) 307 needs to be set at 10 to 100 nm, preferably 20 to 50 nm. Here, a Ti film is formed to a thickness of 50 nm by sputtering.

It is important to control the thicknesses of the gate insulating film 306 and the conductive layer (A) 307. The reason therefor is that, at the step of first doping with an impurity as is carried out later, the impurity bestowing the n-conductivity type is passed through the gate insulating film 306 and the conductive layer (A) 307 so as to be introduced into the semiconductor layers 303, 305. In actuality, the conditions of the step of the first doping with the impurity are determined considering the thicknesses of the gate insulating film 306 and the conductive layer (A) 307, and the concentration of the impurity element as a dopant. It has been previously confirmed that the semiconductor layers can be doped with the impurity element within the ranges of the thicknesses. However, when the thicknesses fluctuate 10% or more from the original set values, the concentration of the dopant impurity lowers.

The conductive layer (B) 308 should preferably be formed of a material selected from the elements of Al and Cu. This layer (B) 308 is provided in order to lower the electric resistances of the gate electrodes, and is formed to a thickness of 50 to 400 nm, preferably 100 to 200 nm. In case of employing the element Al, it is allowed to use pure Al or to use an Al alloy in which an element selected from the elements of Ti, Si and Sc is added 0.1 to 5 atomic %. On the other hand, in case of employing the element Cu, a silicon nitride film being 30 to 100 nm thick should preferably be provided on the surface of the gate insulating film 306 though not shown.

Here, an Al film in which the element Sc is added 0.5 atomic % is formed to a thickness of 200 nm by sputtering (FIG. 3A).

At the next step, using a known patterning technique, a resist mask is formed, and the conductive layer (B) 308 is partly removed. Here, since the conductive layer (B) 308 is formed of the Al film doped with 0.5 atomic % of Sc, the step of the removal is implemented by wet etching with a solution of phosphoric acid. Thus, the second layers 309, 310, 311, 312 of the gate electrodes are formed of the remaining parts of the conductive layer (B) as shown in FIG. 3B. Regarding the lengths of the second layers of the respective gate electrodes in the directions of the channel lengths of the corresponding TFTs, the length of each of the second layers 309, 310 of the gate electrodes constituting the CMOS circuit is set at 3 μm, and the length of each of the second layers 311, 312 of the gate electrodes constituting the multigate structure of the pixel matrix circuit is set at 2 μm.

The step of the removal can also be carried out by dry etching. However, the wet etching is more favorable for removing the unnecessary regions of the conductive layer (B) 308 without damaging the conductive layer (A) 307 and with a good selectivity.

Moreover, this embodiment is so constructed that a retention capacitance is provided on the side of the drain of the pixel TFT which constitutes the pixel matrix circuit. On this occasion, the capacitance wiring line 313 of the retention capacitance is formed of the same material as that of the conductive layer (B).

Thereafter, a resist mask 314 is formed in a domain where the p-channel TFT is to be formed, and the step of the first doping with the impurity element bestowing the n-conductivity type is implemented. Phosphorus (P), arsenic (As), antimony (Sb), etc. are known as impurity elements which bestows the n-conductivity type on a crystalline semiconductor material. Here, the element phosphorus is employed, and ion doping with phosphine ($PH_3$) is used for the first doping. Since, at this step, the element phosphorus is passed through the gate insulating film 306 and the conductive layer (A) 307 so as to dope the underlying semiconductor layers with this element, the acceleration voltage of the ion doping is set at a somewhat high voltage of 80 keV. The concentration of the element phosphorus to be introduced into the semiconductor layers as a dopant, should preferably be set within a range of $1 \times 10^{16}$ to $5 \times 10^{19}$ atoms/$cm^3$. Here, the concentration is set at $1 \times 10^{18}$ atoms/$cm^3$. Thus, regions 315, 316, 317, 318, 319, 320 doped with the element phosphorus are formed in the semiconductor layers (FIG. 3B).

After removing the resist mask 314, an electrically conductive layer (C) 321 to become the third layers of the respective gate electrodes is formed in close contact with the conductive layer (A) 307, the second layers 309, 310, 311, 312 of the gate electrodes and the wiring line 313 of the retention capacitance. The conductive layer (C) 321 may be formed of a material selected from the elements of Ti, Ta, W and Mo, and a compound containing any of the elements as its component may well be employed considering an electric resistance and a thermal resistance. In addition, the thickness of the conductive layer (C) 321 needs to be set at 10 to 100 nm, preferably 20 to 50 nm. Here, a Ta film is formed to a thickness of 50 nm by sputtering (FIG. 3C).

At the next step, using a known patterning technique, a resist mask is formed, and the conductive layer (C) 321 and the conductive layer (A) 307 are partly removed. Here, the step of the removal is implemented by dry etching. The conditions of the dry etching of the conductive layer (C) 321 made of the element Ta are that CF4 and O2 are respectively introduced 80 SCCM and 20 SCCM, that a pressure of 100 mTorr is held, and that a high-frequency power of 500 W is supplied. On this occasion, the etching rate of the Ta film is 60 nm/minute. Besides, the conditions of the etching of the conductive layer (A) 307 made of the element Ti are that $SiCl_4$, $Cl_2$ and $BCl_3$ are respectively introduced 40 SCCM, 5 SCCM and 180 SCCM, that a pressure of 80 mTorr is held, and that a high-frequency power of 1200 W is supplied. On this occasion, the etching rate of the Ti film is 34 nm/minute.

A slight residue is sometimes observed after the etching, but it can be eliminated by washing the resulting substrate with a detergent SPX or a solution of EKC or the like. Under the above etching conditions, the etching rate of the gate insulating film 306 underlying the layers 321 and 307 is 18 to 38 nm/minute. Attention needs to be paid to the fact that, when the etching time period of the removal step is long, the gate insulating film 306 is etched excessively.

Thus, the first layers 322, 323, 324, 325 of the respective gate electrodes and the third layers 327, 328, 329, 330 thereof are formed. The first layer of each gate electrode and the third layer thereof are formed having equal lengths in the direction of the channel length. More specifically, the first layers 322, 323 of the corresponding gate electrodes and the third layers 327, 328 thereof have lengths of 6 μm. Besides, the first layers 324, 325 of the corresponding gate electrodes and the third layers 329, 330 thereof have lengths of 4 μm (FIG. 4A).

In this way, the respective gate electrodes made up of the first layers, second layers and third layers are completed. Besides, the retention capacitance is provided on the drain side of the pixel TFT constituting the pixel matrix circuit. On this occasion, the wiring line portions 326, 331 of the retention capacitance are respectively formed from the conductive layer (A) and the conductive layer (C).

Figures 4, 18A:
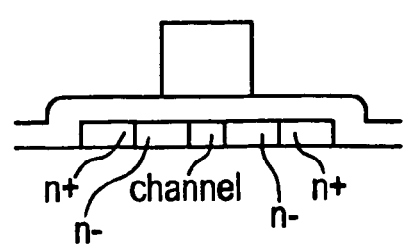
FIGS. 4A through 4C are sectional views showing the process for fabricating the TFTs in the first embodiment.
Figures 4, 18B:
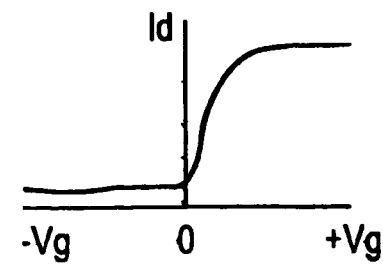

Subsequently, as illustrated in FIG. 4B, resist masks 332, 333, 334, 335, 336 are formed so as to carry out the step of second doping with an impurity element bestowing the n-conductivity type. The step of the second doping is also implemented by ion doping with phosphine ($PH_3$). Also at this step, phosphorus as a dopant is passed through the gate insulating film 306 to be introduced into the underlying semiconductor layers, and hence, the acceleration voltage of the ion doing is set at a somewhat high voltage of 80 keV. Thus, regions 337, 338, 339, 340, 341, 342, 343 doped with the element phosphorus are formed. The concentration of the element phosphorus in these regions 337 through 343 is higher than in the regions formed by the step of the first doping with the impurity element bestowing the n-conductivity type. The phosphorus concentration should preferably be set at $1 \times 10^{19}$ to $1 \times 10^{21}$ atoms/$cm^3$. Here, it is set at $1 \times 10^{20}$ atoms/$cm^3$.

At this step, the lengths of the resist masks 332, 333, 334, 335 in the channel length direction are important for determining the structures of the respective TFTs. Especially in each of the n-channel TFTs, the part of the second impurity region lying under the gate electrode and the part thereof not lying under the gate electrode can be determined at will within a certain range in accordance with the length of the first and third layers of the gate electrode and the length of the resist mask. In this embodiment, the length of the first layer 322 and third layer 327 of the corresponding gate electrode is 6 μm, and that of the first layers 324, 325 and third layers 329, 330 of the corresponding gate electrodes is 4 μm. Therefore, the resist mask 332 is set at a length of 9 μm, and the resist masks 334, 335 are set at a length of 7 μm. Of course, the individual lengths mentioned here are mere examples, and they may be determined considering the drive voltages of the corresponding TFTs as explained before.

Subsequently, domains where the n-channel TFTs are to be formed are covered with resist masks 344, 345 so as to carry out the step of third doping at which only the domain where the p-channel TFT is to be formed is doped with an impurity element bestowing the p-conductivity type. Boron (B), aluminum (Al) and gallium (Ga) are known as impurity elements which bestows the p-conductivity type. Here, the impurity element boron is employed, and ion doping is implemented with diborane ($B_2H_6$). Also in this case, the acceleration voltage of the ion doping is set at 80 keV so as to introduce the element boron at a concentration of $2 \times 10^{20}$ atoms/$cm^3$. Thus, third impurity regions 346a, 346b, 347a, 347b doped with the element boron at high concentrations are formed as illustrated in FIG. 4C. Although the third impurity regions 346b, 347b contain the element phosphorus introduced by the preceding step, they are doped with the element boron at the concentration being double higher, so that no problem is involved (FIG. 4C).

Figure 5:
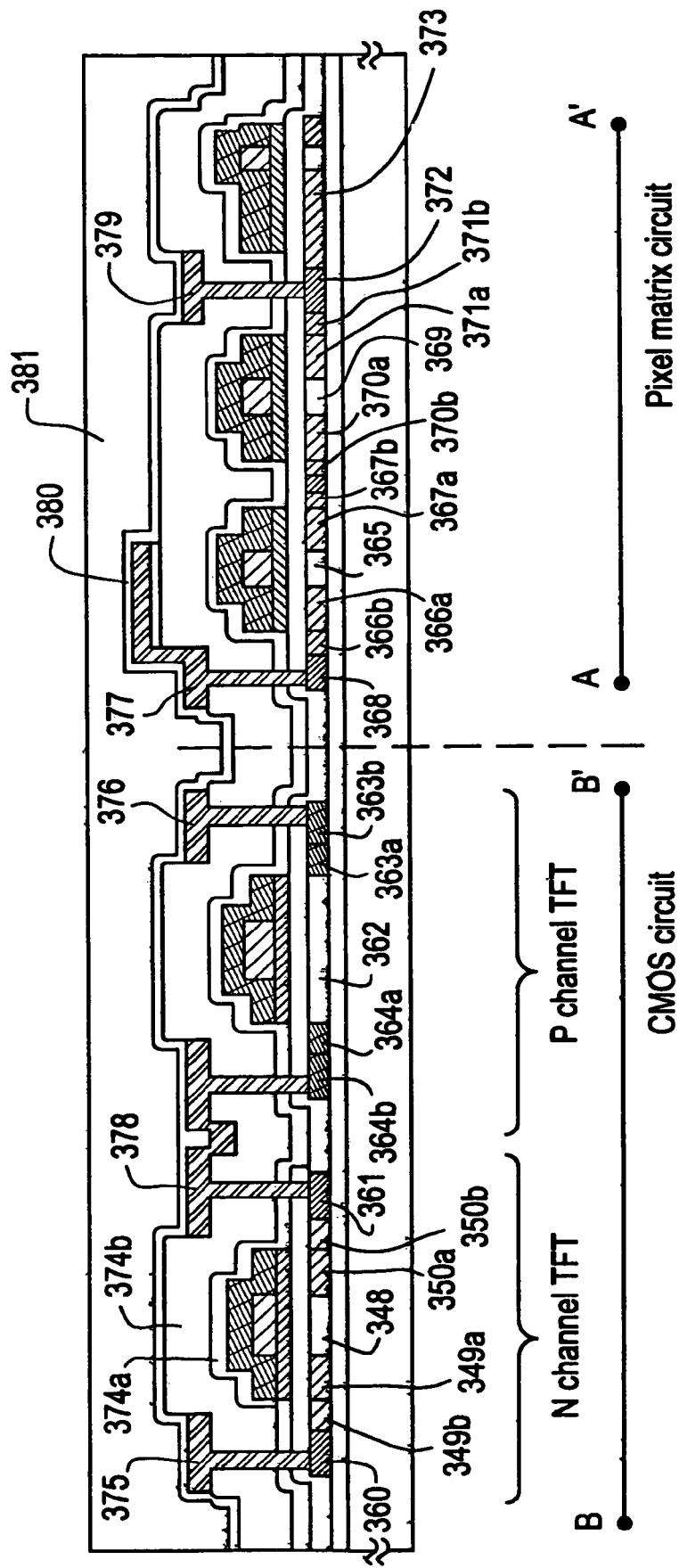
FIG. 5 is a sectional view showing the process for fabricating the TFTs in the first embodiment.

After the steps Illustrated up to FIG. 4C have ended, the resist masks 344, 345 are removed so as to carry out the step of forming a first interlayer insulating film 374, as shown in FIG. 5. The first interlayer insulating film 374 is formed by a double-layer structure. Initially, a silicon nitride film 374a is formed to a thickness of 50 nm. The silicon nitride film 374a is formed by plasma CVD under the conditions that $SiH_4$, $NH_3$ and $N_2$ are respectively introduced 5 SCCM, 40 SCCM and 100 SCCM, that a pressure of 0.7 Torr is held, and that a high-frequency power of 300 W is supplied. Subsequently, a silicon oxide film 374b is formed to a thickness of 950 nm under the conditions that TEOS and $O_2$ are respectively introduced 500 SCCM and 50 SCCM, that a pressure of 1 Torr is held, and that a high-frequency power of 200 W is supplied. In this manner, the silicon nitride film 374a and the silicon oxide film 374b which are 1 μm thick in total constitute the first interlayer insulating film 374.

The silicon nitride film 374a formed here is necessary for carrying out the next step of heat treatment. In this embodiment, each gate electrode is formed into the clad structure as explained before. This structure is so constructed that the second layer of the gate electrode formed of Al is enclosed with the first layer thereof formed of Ti and the third layer thereof formed of Ta. The element Ta is effective to prevent the element Al from forming a hillock and leaking to the surroundings, but it has the drawback that it is immediately oxidized when heated at or above 400 degrees centigrade under the normal pressure. As a result, the electrical resistance of the third layer made of the element Ta increases. However, when the surface of the third layer is covered with the silicon nitride film 374a of the first interlayer insulating film 374, the oxidation is preventable.

The step of the heat treatment needs to be implemented for activating the impurity elements bestowing the n-conductivity type and p-conductivity type as have been introduced at the respective concentrations. This step may be implemented by thermal annealing with an electric heating furnace, laser annealing with the excimer laser stated before, or rapid thermal annealing (RTA) with a halogen lamp. The laser annealing can activate the impurity elements at a lower substrate heating temperature, but it is difficult of activating them even in the regions concealed under the gate electrodes. Accordingly, the thermal annealing is employed here. Conditions in this case are a nitrogen atmosphere, and a heating temperature of 300 to 700 degrees centigrade, preferably 350 to 550 degrees centigrade. Here, the heat treatment is carried out at 450 degrees centigrade for 2 hours.

The first interlayer insulating film 374 is thereafter formed by patterning with contact holes which reach the source regions and drain regions of the respective TFTs. Further, source wiring lines 375, 376, 377 and drain wiring lines 378, 379 are formed. In this embodiment, each of the wiring lines has a triple-layer structure, not shown, which is formed in such a way that a Ti film being 100 nm thick, an Al film containing Ti and being 300 nm thick, and a Ti film being 150 nm thick are consecutively deposited by sputtering.

In addition, a passivation film 380 is formed covering the source wiring lines 375, 376, 377 as well as the drain wiring lines 378, 379 and the first interlayer insulating film 374. The passivation film 380 is formed as a silicon nitride film to a thickness of 50 nm. Further, a second interlayer insulating film 381 made of an organic resin is formed to a thickness of about 1000 nm. Usable as the organic resin are polyimide, acrylic resin, polyimidoamide, etc. The merits of the use of the organic resin film are that a method for forming the film is easy, that a parasitic capacitance can be lowered owing to the small dielectric constant of the organic resin, and that the flatness of the surface of the film is excellent. Incidentally, it is possible to employ organic resins other than mentioned above. Here, polyimide of the type which is thermally polymerized after application on the substrate is employed, and it is baked at 300 degrees centigrade.

By the steps thus far described, the gate electrodes of the clad structure are formed, and the n-channel TFT of the CMOS circuit is formed with a channel forming region 348, first impurity regions 360, 361, and second impurity regions 349a, 349b, 350a, 350b. Here, each of the parts 349a, 350a of the second impurity regions underlying the gate electrode has a length of 1.5 μm, while each of the parts 349b, 350b (LDD regions) of the second impurity regions not underlying the gate electrode has a length of 1.5 μm. Besides, the first impurity region 360 functions as the source region of the TFT, and the first impurity region 361 as the drain region.

Likewise, the p-channel TFT of the CMOS circuit is formed with the gate electrode of the clad structure, and it is formed with a channel forming region 362, and third impurity regions 363a, 363b, 364a, 364b. The third impurity regions 363a, 363b serve as the source region of the TFT, and the third impurity regions 364a, 364b as the drain region.

In addition, the pixel TFTs of the pixel matrix circuit are formed with channel forming regions 365, 369, first impurity regions 368, 372, and second impurity regions 366, 367, 370, 371. The second impurity regions can be divided into parts 366a, 367a, 370a, 371a underlying the corresponding gate electrodes, and parts 366b, 367b, 370b, 371b not underlying the gate electrodes.

In this way, an active matrix substrate in which the CMOS circuit and the pixel matrix circuit are formed on the substrate 301 is fabricated as shown in FIG. 5. Besides, the retention capacitance is simultaneously formed on the drain side of the pixel TFT of the pixel matrix circuit.

Embodiment 2

In this embodiment, there will be described another aspect of performance in which a pixel matrix circuit, and a CMOS circuit being the basic form of a drive circuit to be provided around the pixel matrix circuit are fabricated simultaneously in the same manner as in Embodiment 1.

First, as in Embodiment 1, the steps of FIGS. 3A through 3C and FIG. 4A are carried out.

FIG. 6A illustrates the state in which each of the gate electrodes is formed of the first layer, the second layer and the third layer. The substrate in this state is formed with resist masks 601, 602, 603, 604, 605, and is subjected to the step of doping with an impurity element which bestows the n-conductivity type. Thus, first impurity regions 606, 607, 608, 609, 610, 611, 612 are formed (FIG. 6B).

Each of the resist masks 601, 602 formed here is in a shape in which an LDD region is formed on only the side of the drain region of the TFT. In other words, that part of the resist mask which masks a second impurity region from above a gate insulating film is formed on only one side with respect to a channel forming region.

The formation of such a resist mask is especially effective for the n-channel TFT of the CMOS circuit. Since the LDD region is formed on only one side, the series resistance component of the TFT is permitted to be substantially lowered, and the ON current thereof can be increased.

Either of the GOLD structure and the LDD structure explained before is provided in order to mitigate a high electric field near the drain region of a TFT. Insofar as the LDD region is formed on the drain side of the TFT, the effect of the mitigation is attained sufficiently.

Further, resist masks 613, 614 are formed. As in Embodiment 1, the step of doping with an impurity element which bestows the p-type conductivity type is carried out to form third impurity regions 615a, 615b, 616. The third impurity region 615a contains the impurity element bestowing the n-conductivity type as introduced by the preceding step (FIG. 6C).

Figure 7:
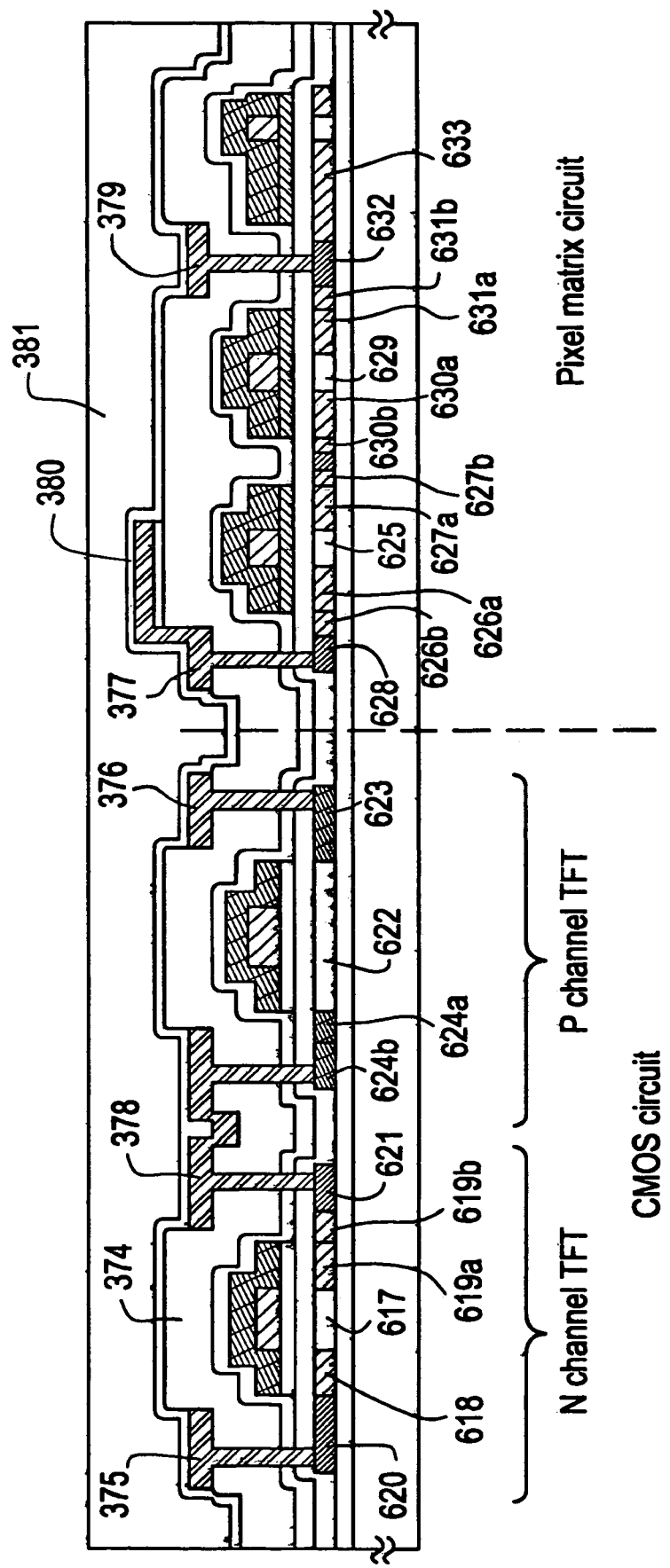
FIG. 7 is a sectional view showing the process for fabricating the TFTs in the second embodiment.

The succeeding steps may be implemented similarly to those of Embodiment 1. Thus, source wiring lines 375, 376, 377 as well as drain wiring lines 378, 379, a passivation film 380, and a second interlayer insulating film 381 made of an organic resin are formed. Then, an active matrix substrate shown in FIG. 7 is completed. More specifically, the n-channel TFT of the CMOS circuit is formed with a channel forming region 617, first impurity regions 620, 621, and second impurity regions 618, 619. Here, the second impurity region 619 consists of a part (GOLD region) 619a underlying the corresponding gate electrode, and a part (LDD region) 619b not underlying the gate electrode. Besides, the first impurity region 620 serves as the source region of the TFT, and the first impurity region 621 as the drain region.

The p-channel TFT of the CMOS circuit is formed with a channel forming region 622, and third impurity regions 624a, 624b, 623. The third impurity region 623 serves as the source region of the TFT, and the third impurity regions 624a, 624b as the drain region. The pixel TFTs of the pixel matrix circuit are formed with channel forming regions 625, 629, first impurity regions 628, 632, and second impurity regions 626, 627, 630, 631. The second impurity regions can be divided into parts 626a, 627a, 630a, 631a underlying the corresponding gate electrodes, and parts 626b, 627b, 630b, 631b not underlying the gate electrodes.

Embodiment 3

In this embodiment, there will be described another aspect of performance in which a pixel matrix circuit, and a CMOS circuit being the basic form of a drive circuit to be provided around the pixel matrix circuit are fabricated simultaneously in the same manner as in Embodiment 1.

First, as in Embodiment 1, the steps of FIGS. 3A through 3C are carried out.

At the next step as illustrated in FIG. 8A, using a known patterning technique, resist masks 801, 802, 803, 804, 805 are formed, and the conductive layer (C) 321 and the conductive layer (A) 307 are partly removed. Here, the step of the removal is implemented by dry etching as in Embodiment 1. Thus, the first layers 851, 852, 853, 854, 855 of respective gate electrodes and the third layers 856, 857, 858, 859, 860 thereof are formed. The lengths of the first layer of each gate electrode and the third layer thereof in the channel length direction are set equal. The first layers 851, 852 of the gate electrodes of the CMOS circuit and the third layers 856, 857 thereof are formed longer than their final shapes and at lengths of 9 μm. Besides, the first layers 853, 854 of the gate electrodes of the pixel matrix circuit and the third layers 858, 859 thereof are similarly formed at lengths of 7 μm.

Further, a retention capacitance is provided on the drain side of the pixel TFT of the pixel matrix circuit. On this occasion, the electrodes 855, 860 of the retention capacitance are respectively formed from the conductive layer (A) and the conductive layer (c).

Thereafter, the step of second doping with an impurity element bestowing the n-conductivity type is carried out as in Embodiment 1. At this step, phosphorus is introduced into the semiconductor layers through those parts of the gate insulating film with which the gate electrodes do not lie in contact, thereby to form regions 806, 807, 808, 811, 812 doped with the element phosphorus at a high concentration. After the end of this step, the resist masks 801, 802, 803, 804, 805 are removed (FIG. 8A).

Subsequently, a photoresist film is formed again, and the step of patterning based on the exposure of the photoresist film to light projected from the rear surface of the substrate. On this occasion, as illustrated in FIG. 8B, resist masks 813, 814, 815, 816, 817 are formed in self-alignment fashion with the respective gate electrodes serving as masks. The exposure from the rear surface is done by utilizing direct light and scattered light. The resist masks can be formed inside the peripheries of the upper surfaces of the gate electrodes as shown in FIG. 8B, by regulating the conditions of the exposure such as a light intensity and an exposure time.

Using the resist masks 813, 814, 815, 816, 817, the non-masked parts of the third layers and first layers of the gate electrodes are removed by dry etching. The conditions of the dry etching are set as in Embodiment 1. After the end of the etching, the resist masks 813, 814, 815, 816, 817 are removed.

Thus, the first layers 818, 819, 820, 821 of the gate electrodes, the third layers 823, 824, 825, 826 of the gate electrodes, and the wiring line portions 822, 827 of the retention capacitance are formed as shown in FIG. 8(C). Owing to the etching, the first layers 851, 852 and third layers 856, 857 of the gate electrodes of the CMOS circuit are formed into lengths of 6 μm. Besides, the first layers 853, 854 and third layers 858, 859 of the gate electrodes of the pixel matrix circuit are similarly formed into lengths of 4 μm.

Further, domains where the n-channel TFTs are to be formed are covered with resist masks 828, 829 so as to carry out the step of third doping with an impurity element which bestows the p-conductivity type (FIG. 8C).

The succeeding steps may be implemented similarly to those of Embodiment 1. Thus, an active matrix substrate shown in FIG. 5 can be fabricated.

Embodiment 4

In this embodiment, there will be described another aspect of performance in which a pixel matrix circuit, and a CMOS circuit being the basic form of a drive circuit to be provided around the pixel matrix circuit are fabricated simultaneously in the same manner as in Embodiment 1.

First, as in Embodiment 1, the steps of FIGS. 3A through 3C are carried out. Thus, gate electrodes are formed as illustrated in FIG. 9C.

At the next step, using a known patterning technique, resist masks are formed, and the conductive layer (C) 321 and the conductive layer (A) 307 are partly removed. Here, the step of the removal is implemented by dry etching. The conditions of the dry etching of the conductive layer (C) 321 made of Ta are that $CF_4$ and $O_2$ are respectively introduced 80 SCCM and 20 SCCM, that a pressure of 100 mTorr is held, and that a high-frequency power of 500 W is supplied. On this occasion, the etching rate of the Ta film is 60 nm/minute. Besides, the conditions of the etching of the conductive layer (A) 307 made of Ti are that $SiCl_4$, $Cl_2$ and $BCl_3$ are respectively introduced 40 SCCM, 5 SCCM and 180 SCCM, that a pressure of 80 mTorr is held, and that a high-frequency power of 1200 W is supplied. On this occasion, the etching rate of the Ti film is 34 nm/minute.

Thus, the first layers 322, 323, 324, 325 of the respective gate electrodes and the third layers 327, 328, 329, 330 thereof are formed. The first layer of each gate electrode and the third layer thereof are formed having equal lengths in the direction of the channel length. More specifically, the first layers 322, 323 of the corresponding gate electrodes and the third layers 327, 328 thereof have lengths of 6 µm. Besides, the first layers 324, 325 of the corresponding gate electrodes and the third layers 329, 330 thereof have lengths of 4 µm.

Under the above etching conditions, the gate insulating film 306 formed of the silicon oxide nitride film is also etched. The etching rate of the film 306 is 18 nm/minute under the etching conditions of the Ta film. Usually, the etching is carefully carried out so as not to etch the gate insulating film. This phenomenon, however, can be positively utilized for thinning those parts of the gate insulating film with which the gate electrodes do not lie in contact. Such a contrivance can be immediately actualized merely by increasing an etching time period at the step of etching the gate electrodes.

However, a gas to be used must be chosen yet for etching the gate insulating film. In this regard, a fluorine-based gas such as $CF_4$ or $NF_3$ produces a result better than that of a chlorine-based gas.

Here, the gate insulating film is etched with the gaseous mixture consisting of $CF_4$ and $O_2$ as used for etching the Ta film. More specifically, the conditions of the etching are that $CF_4$ and $O_2$ are respectively introduced 80 SCCM and 20 SCCM, that a pressure of 100 mTorr is held, and that a high-frequency power of 500 W is supplied. Thus, when the gate insulating film 306 formed to a thickness of 100 nm is etched for a time period of about 2.5 minutes, those parts of the gate insulating film with which the gate electrodes do not lie in contact can be thinned to a thickness of 50 nm as shown in FIG. 9A.

As in Embodiment 1, resist masks 332, 333, 334, 335, 336 are formed so as to carry out the step of second doping with an impurity element which bestows the n-conductivity type. On this occasion, the thickness of the gate insulating film is 50 nm in correspondence with regions 337, 338, 339, 340, 341, 342, 343 which are to be doped with the impurity element bestowing the n-conductivity type, and hence, the semiconductor layers can be efficiently doped with the impurity element.

Owing to the thinned gate insulating film, an acceleration voltage in ion doping can be lowered from 80 keV to 40 keV, and damages to the gate insulating film and the semiconductor layers can be relieved (FIG. 9B).

At the next step, as illustrated in FIG. 9C, resist masks 344, 345 are formed so as to carry out the step of doping with an impurity element which bestows the p-conductivity type. The parts of the gate insulating film lying in contact with regions 346a, 346b, 347a, 347b which are to be doped with the impurity bestowing the p-conductivity type are 50 nm thick, so that an acceleration voltage in ion doping can be lowered from 80 keV to 40 keV, and the semiconductor layers can be efficiently doped with the impurity element.

Figure 10:
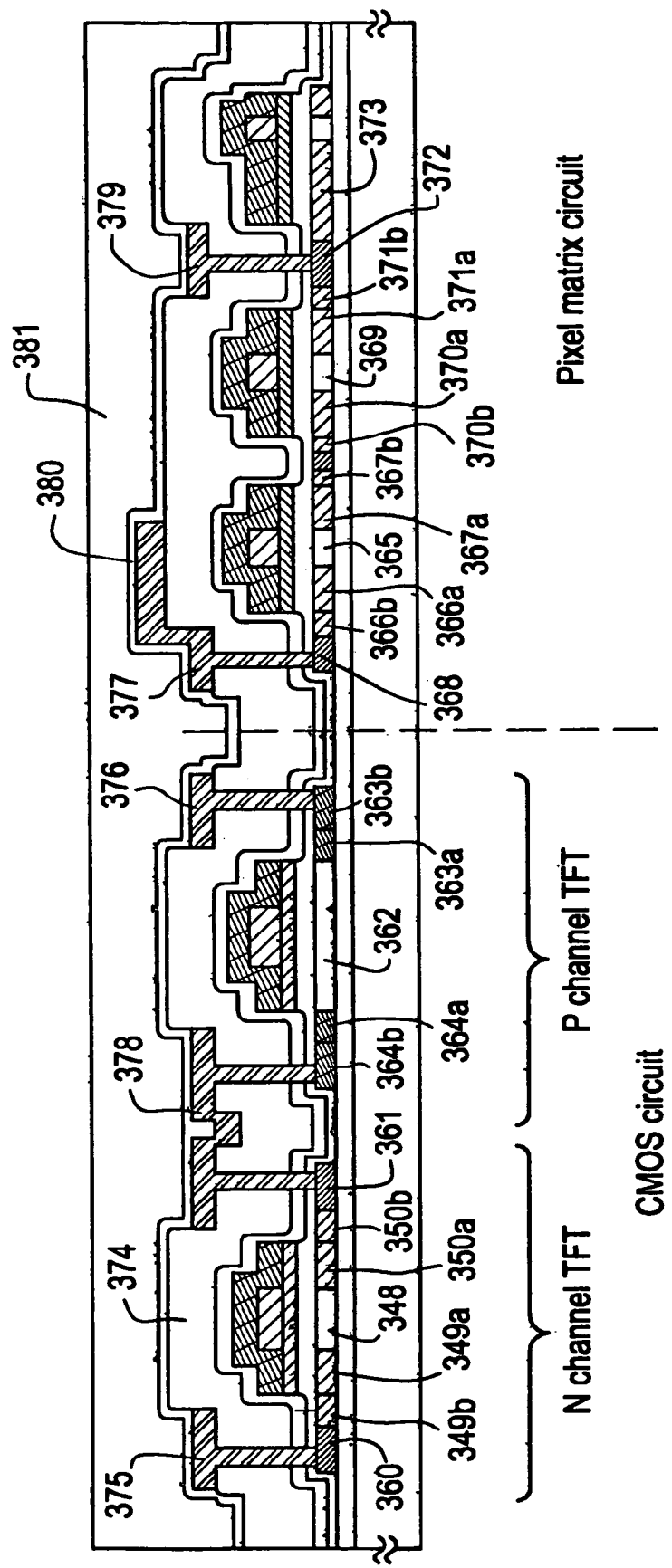
FIG. 10 is a sectional view showing the process for fabricating the TFTs in the fourth embodiment.

The other steps may be conformed to Embodiment 1. Thus, source wiring lines 375, 376, 377 as well as drain wiring lines 378, 379, a passivation film 380, and a second interlayer insulating film 381 made of an organic resin are formed. Then, an active matrix substrate shown in FIG. 10 is completed. More specifically, the n-channel TFT of the CMOS circuit is formed with a channel forming region 348, first impurity regions 360, 361, and second impurity regions 349, 350. Here, the second impurity regions are constituted by parts 349a, 350a underlying the gate electrode, and parts (LDD regions) 349b, 350b not underlying the gate electrode. Besides, the first impurity region 360 functions as the source region of the TFT, and the first impurity region 361 as the drain region. Likewise, the p-channel TFT of the CMOS circuit is formed with the gate electrode of the clad structure, and it is formed with a channel forming region 362, and third impurity regions 363a, 363b, 364a, 364b. The third impurity regions 363a, 363b serve as the source region of the TFT, and the third impurity regions 364a, 364b as the drain region. In addition, the pixel TFTs of the pixel matrix circuit are formed with channel forming regions 365, 369, first impurity regions 368, 372, and second impurity regions 366a, 366b, 367a, 367b, 370a, 370b, 371a, 371b. The second impurity regions can be divided into the parts 366a, 367a, 370a, 371a underlying the corresponding gate electrodes, and the parts 366b, 367b, 370b, 371b not underlying the gate electrodes.

Embodiment 5

In this embodiment, the construction of the present invention will be described concerning a method in which a pixel matrix circuit, and a CMOS circuit being the basic form of a drive circuit to be provided around the pixel matrix circuit are fabricated simultaneously.

Referring to FIGS. 11A through 11C, a substrate 1101 is a non-alkaline glass substrate which is typified by, for example, 1737 Glass Substrate of Corning Incorporated. An underlying film 1102 is formed on that surface of the substrate 1101 on which TFTs are to be formed, by plasma CVD or sputtering. Though not shown, a silicon nitride film being 25 to 100 nm, typically 50 nm thick, and a silicon oxide film being 50 to 300 nm, typically 150 nm thick, are formed as the underlying film 1102. Alternatively, the underlying film 1102 may well be made of only a silicon nitride film or a silicon oxide nitride film.

Subsequently, an amorphous silicon film being 50 nm thick is formed on the underlying film 1102 by plasma CVD. The amorphous silicon film should desirably be dehydrogenated by heating for several hours preferably at 400 to 550 degrees centigrade though the conditions of the dehydrogenation depend also upon the hydrogen content of the deposited film, so as to decrease the hydrogen content to 5 atomic % or below, followed by the step of crystallization. Alternatively, an amorphous silicon film may well be formed by another producing method such as sputtering or vapor deposition, but impurity elements such as oxygen and nitrogen contained in the produced film should desirably be decreased sufficiently.

Here, both the underlying film and the amorphous silicon film are produced by the plasma CVD, and they may well be consecutively formed in vacuum on this occasion. The substrate is not once exposed to the atmospheric air after the formation of the underlying film, whereby the contamination of the surface of the resulting substrate can be prevented to relieve the discrepancy of the characteristics of TFTs to-be-fabricated.

In this embodiment, a crystalline silicon film to be used as semiconductor layers is formed by thermal crystallization which employs a catalyst element. In the case of employing the catalyst element, it is desirable to apply the technique disclosed in the official gazette of Japanese Patent Application Laid-open No. 7-130652 (1995) or No. 8-78329 (1996).

Figure 19A:
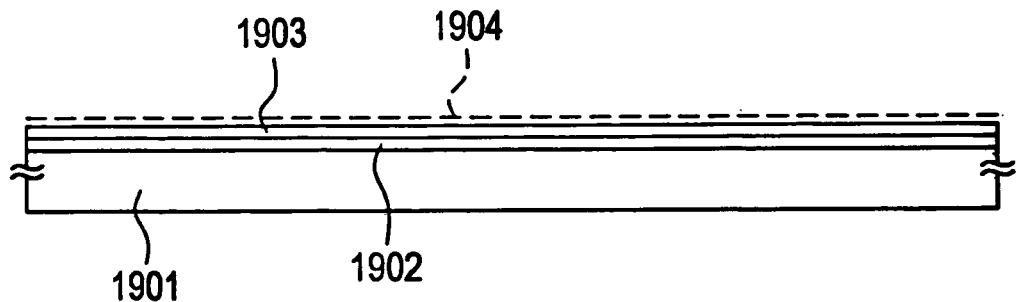
FIGS. 19A and 19B are schematic sectional views showing a process for fabricating a crystalline silicon film.
Figure 19B:

FIGS. 19A and 19B illustrate an example in the case where the technique disclosed in the official gazette of Japanese Patent Application Laid-open No. 7-130652 (1995) is applied to the present invention. A silicon oxide film 1902 is formed on a substrate 1901, and is overlaid with an amorphous silicon film 1903. The surface of the amorphous silicon film 1903 is coated with a nickel acetate solution which contains 10 ppm of nickel in terms of weight, thereby to form a nickel containing layer 1904 (FIG. 19A).

After the step of dehydrogenation at 500 degrees centigrade for one hour, a heat treatment is carried out at 500 to 650 degrees centigrade for 4 to 12 hours, for example, at 550 degrees centigrade for 8 hours. Thus, a crystalline silicon film 1905 is formed (FIG. 19B).

Figure 20A:
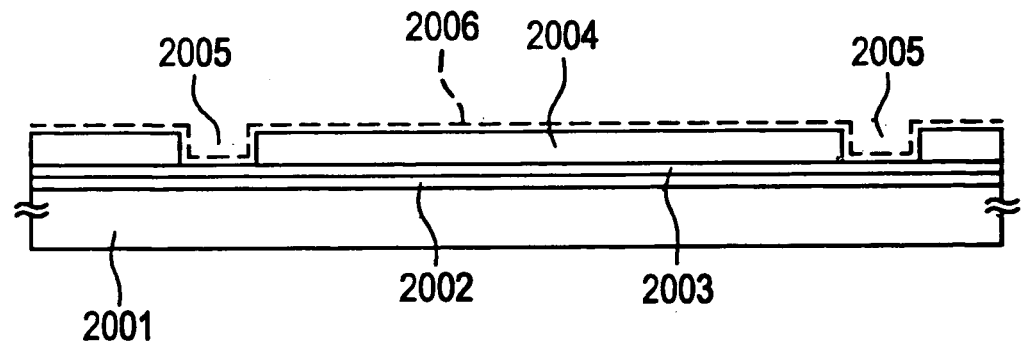
FIGS. 20A and 20B are schematic sectional views showing another process for fabricating a crystalline silicon film.
Figure 20B:
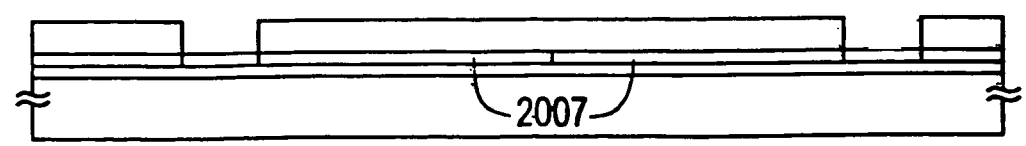

On the other hand, the technique disclosed in the official gazette of Japanese Patent Application Laid-open No. 8-78329 (1996) is such that the selective crystallization of an amorphous silicon film is permitted by selectively introducing the catalyst element. FIGS. 20A and 20B illustrate an example in the case of applying the technique to the present invention.

First, a silicon oxide film 2002 and an amorphous silicon film 2003 are formed on a glass substrate 2001, and a silicon oxide film 2004 is consecutively formed. On this occasion, the thickness of the silicon oxide film 2004 is set at 150 nm.

Secondly, the silicon oxide film 2004 is patterned so as to form openings 2005 in selected parts. Thereafter, the surface of the resulting glass substrate is coated with a nickel acetate solution which contains 10 ppm of nickel in terms of weight. Thus, a nickel containing layer 2006 is formed, and it lies in contact with the amorphous silicon film 2003 at only the bottoms of the openings 2005 (FIG. 20A).

Subsequently, a heat treatment is carried out at 500 to 650 degrees centigrade for 4 to 24 hours, for example, at 570 degrees centigrade for 14 hours, thereby to form a crystalline silicon film 2007. In the course of the crystallization, the parts of the amorphous silicon film 2003 having been contacted by the nickel containing layer 2006 is initially crystallized, and the crystallization proceeds laterally from the parts. The crystalline silicon film 2007 thus formed is an aggregate of rod or needle crystals. Since the individual crystals have been grown with a specific directionality when macroscopically viewed, the film 2007 has the merit of uniform crystallinity (FIG. 20B).

By the way, the catalyst elements usable in the two techniques include iron (Fe), palladium (Pd), tin (Sn), lead (Pb), cobalt (Co), platinum (Pt), copper (Cu) and gold (Au), in addition to nickel (Ni).

The crystalline silicon film is formed using the technique as explained above, and is patterned. Then, the semiconductor layers 1103, 1104, 1105 shown in FIG. 11A can be formed.

There will also been described an example in which a crystalline silicon film is formed using a catalyst element, followed by the step of gettering for removing the catalyst element from the crystalline silicon film.

This example is such a technique that the catalyst element employed for the crystallization of an amorphous silicon film is removed after the crystallization by utilizing the gettering action of phosphorus. Owing to the technique, the concentration of the catalyst element in the crystalline silicon film can be lowered to $1\times10^{17}$ atoms/cm$^3$ or less, preferably $1\times10^{16}$ atoms/cm$^3$.

Figure 21A:
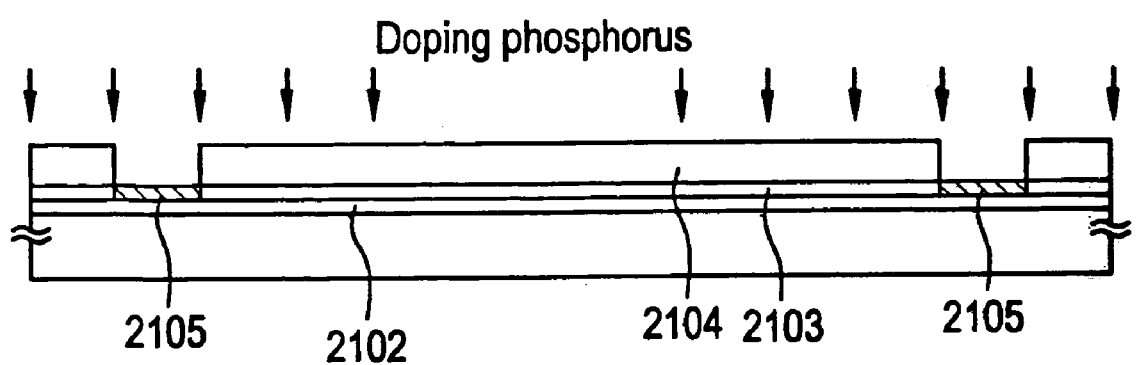
FIGS. 21A and 21B are schematic sectional views showing still another process for fabricating a crystalline silicon film.
Figure 21B:
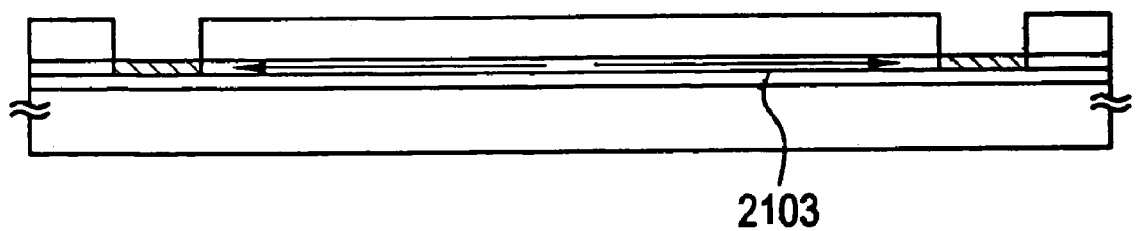

FIG. 21A illustrates a state where a subbing film 2102 and a crystalline silicon film 2103 are formed on a substrate. Besides, a masking silicon oxide film 2104 is formed on the surface of the crystalline silicon film 2103 to a thickness of 150 nm, and it is provided with openings by patterning so as to form the exposed parts of the crystalline silicon film 2103. Further, the step of introducing the element phosphorus is implemented, whereby the crystalline silicon film 2103 is provided with regions 2105 doped with the element phosphorus.

In this state, the substrate is heat-treated in a nitrogen atmosphere at 550 to 800 degrees centigrade for 5 to 24 hours, for example, at 600 degrees centigrade for 12 hours. Then, the regions 2105 of the crystalline silicon film 2103 doped with the element phosphorus act as gettering sites, and the catalyst element remaining in the crystalline silicon film 2103 can be segregated into the regions 2105 doped with the element phosphorus.

The masking silicon oxide film 2104 and the regions 2105 doped with the element phosphorus are etched and removed, thereby to obtain a crystalline silicon film in which the concentration of the catalyst element used at the step of crystallization is lowered to $1\times10^{17}$ atoms/cm$^3$ or less. This crystalline silicon film is usable for the semiconductor layers 1103, 1104, 1105 shown in FIG. 11A.

Subsequently, the insular semiconductor layers 1103, 1104 and 1105 are covered with a gate insulating film 1106 whose principal component is silicon oxide or silicon nitride. The gate insulating film 1106 may be a silicon oxide nitride film which is formed from starting materials of N$_2$O and SiH$_4$ by plasma CVD to a thickness of 10 to 200 nm, preferably 50 to 150 nm. Here, the silicon oxide nitride film is formed to a thickness of 100 nm.

Thereafter, the gate insulating film 1106 is overlaid with an electrically conductive layer (A) 1107 which forms the first layers of gate electrodes, and an electrically conductive layer (B) 1108 which forms the second layers of the gate electrodes. The conductive layer (A) 1107 may be formed of a material selected from the elements of Ti, Ta, W and Mo, and a compound containing any of the elements as its component may well be employed considering an electric resistance and a thermal resistance. In addition, the thickness of the conductive layer (A) 1107 needs to be set at 10 to 100 nm, preferably 20 to 50 nm. Here, a Ti film is formed to a thickness of 50 nm by sputtering.

The conductive layer (B) 1108 for forming the second layers of the gate electrodes should preferably be formed of a material selected from the elements of Al and Cu. This layer (B) 1108 is provided in order to lower the electric resistances of the gate electrodes, and is formed to a thickness of 50 to 400 nm, preferably 100 to 200 nm. In case of employing the element Al, it is allowed to use pure Al or to use an Al alloy in which an element selected from the elements of Ti, Si and Sc is added 0.1 to 5 atomic %. On the other hand, in case of employing the element Cu, a silicon nitride film being 30 to 100 nm thick should preferably be provided on the surface of the gate insulating film 1106 though not shown.

Here, an Al film in which the element Sc is added 0.5 atomic % is formed to a thickness of 200 nm by sputtering (FIG. 11A).

At the next step, using a known patterning technique, a resist mask is formed, and the conductive layer (B) 1108 is partly removed. Here, since the conductive layer (B) 1108 is formed of the Al film doped with 0.5 atomic % of Sc, the step of the removal is implemented by wet etching with a solution of phosphoric acid. Thus, the second layers 1109, 1110, 1111, 1112 of the gate electrodes are formed as shown in FIG. 11B. Regarding the lengths of the second layers of the respective gate electrodes in the directions of the channel lengths of the corresponding TFTs, the length of each of the second layers 1109, 1110 of the gate electrodes constituting the CMOS circuit is set at 3 μm, and the length of each of the second layers 1111, 1112 of the gate electrodes constituting the multigate structure of the pixel matrix circuit is set at 2 μm.

Moreover, this embodiment is so constructed that a retention capacitance is provided on the side of the drain of the pixel TFT which constitutes the pixel matrix circuit. On this occasion, the capacitance wiring line 1113 of the retention capacitance is formed of the same material as that of the conductive layer (B).

Thereafter, the step of first doping with an impurity element bestowing the n-conductivity type is implemented. Here, phosphorus is employed, and ion doping with phosphine (PH$_3$) is used for the first doping. Since, at this step, the element phosphorus is passed through the gate insulating film

1106 and the conductive layer (A) 107 so as to dope the underlying semiconductor layers 1103, 1104, 1105 with this element, the acceleration voltage of the ion doping is set at a somewhat high voltage of 80 keV. The concentration of the element phosphorus to be introduced into the semiconductor layers as a dopant, should preferably be set within a range of $1 \times 10^{16}$ to $5 \times 10^{19}$ atoms/cm$^3$. Here, the concentration is set at $1 \times 10^{18}$ atoms/cm$^3$. Thus, regions 1114, 1115, 1116, 1117, 1118, 1119, 1120, 1121 doped with the element phosphorus are formed in the semiconductor layers (FIG. 11B).

Subsequently, domains where the n-channel TFTs are to be formed are covered with resist masks 1122, 1123 so as to carry out the step of third doping at which only the domain where the p-channel TFT is to be formed is doped with an impurity element bestowing the p-conductivity type. Here, boron is employed as the impurity element, and ion doping is implemented with diborane (B$_2$H$_6$). Also in this case, the acceleration voltage of the ion doping is set at 80 keV so as to introduce the element boron at a concentration of $2 \times 10^{20}$ atoms/cm$^3$. Thus, third impurity regions 1124, 1125 doped with the element boron at a high concentration are formed as illustrated in FIG. 1C.

Figure 12A:
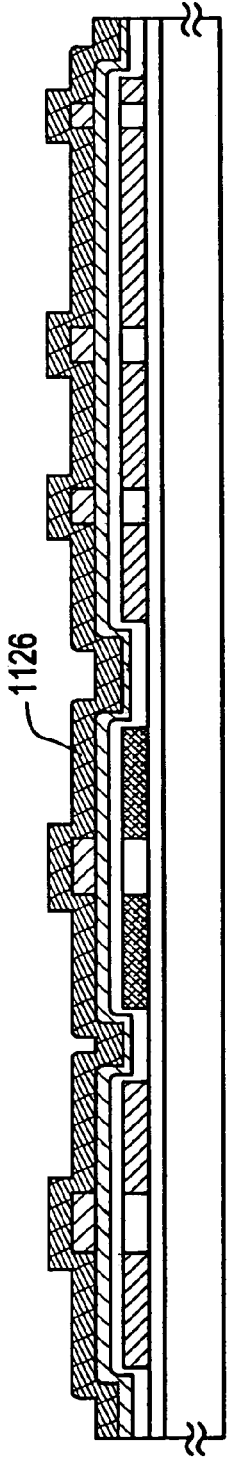
FIGS. 12A through 12C are sectional views showing the process for fabricating the TFTs in the fifth embodiment.

After removing the resist masks 1122, 1123, an electrically conductive layer (C) 1126 to become the third layers of the respective gate electrodes is formed in close contact with the conductive layer (A) 1107, the second layers 1109, 1110, 1111, 1112 of the gate electrodes and the wiring line 1113 of the retention capacitance. The conductive layer (C) 1126 may be formed of a material selected from the elements of Ti, Ta, W and Mo, and a compound containing any of the elements as its component may well be employed considering an electric resistance and a thermal resistance. In addition, the thickness of the conductive layer (C) 1126 needs to be set at 10 to 100 nm, preferably 20 to 50 nm. Here, an Mo—W film is formed to a thickness of 50 nm by sputtering (FIG. 12A).

At the next step, using a known patterning technique, resist masks are formed, and the conductive layer (C) 1126 and the conductive layer (A) 1107 are partly removed. Here, the step of the removal is implemented by dry etching. The conditions of the dry etching of the conductive layer (C) 1126 made of the Mo—W film are that Cl$_2$ is introduced 80 SCCM, that a pressure of 10 mTorr is held, and that a high-frequency power of 350 W is supplied. On this occasion, the etching rate of the Mo—W film is 50 nm/minute. Besides, the conditions of the etching of the conductive layer (A) 1107 made of the element Ti are that SiCl$_4$, Cl$_2$ and BCl$_3$ are respectively introduced 40 SCCM, 5 SCCM and 180 SCCM, that a pressure of 80 mTorr is held, and that a high-frequency power of 1200 W is supplied. On this occasion, the etching rate of the Ti film is 34 nm/minute.

A slight residue is sometimes observed after the etching, but it can be eliminated by washing the resulting substrate with a detergent SPX or a solution of EKC or the like. Under the above etching conditions, the etching rate of the gate insulating film 1106 underlying the layers 1126 and 1107 is 18 to 38 nm/minute. Attention needs to be paid to the fact that, when the etching time period of the removal step is long, the gate insulating film 1106 is etched excessively.

Thus, the first layers 1127, 1128, 1129, 1130 of the respective gate electrodes and the third layers 1132, 1133, 1134, 1135 thereof are formed. The first layer of each gate electrode and the third layer thereof are formed having equal lengths in the direction of the channel length. More specifically, the first layers 1127, 1128 of the corresponding gate electrodes and the third layers 1132, 1133 thereof have lengths of 6 μm.

Figure 12B:
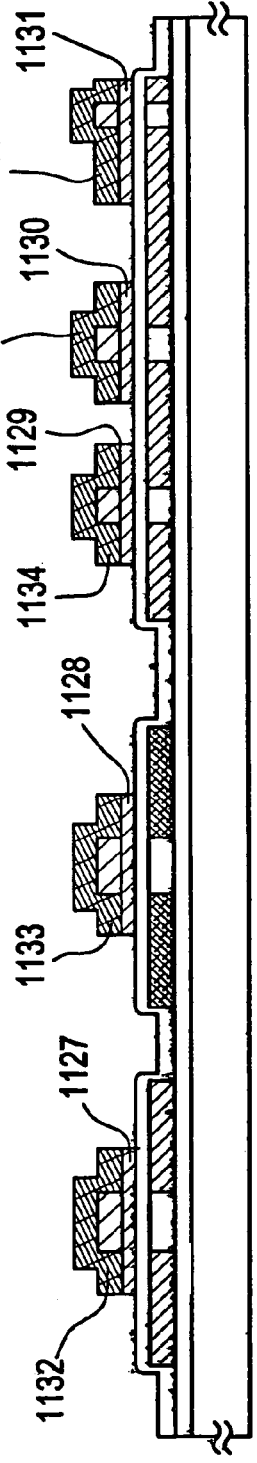

Besides, the first layers 1129, 1130 of the corresponding gate electrodes and the third layers 1134, 1135 thereof have lengths of 4 μm (FIG. 12B).

Besides, the retention capacitance is provided on the drain side of the pixel TFT constituting the pixel matrix circuit. On this occasion, the electrode portions 1131, 1136 of the retention capacitance are respectively formed from the conductive layer (A) and the conductive layer (C).

Figure 12C:
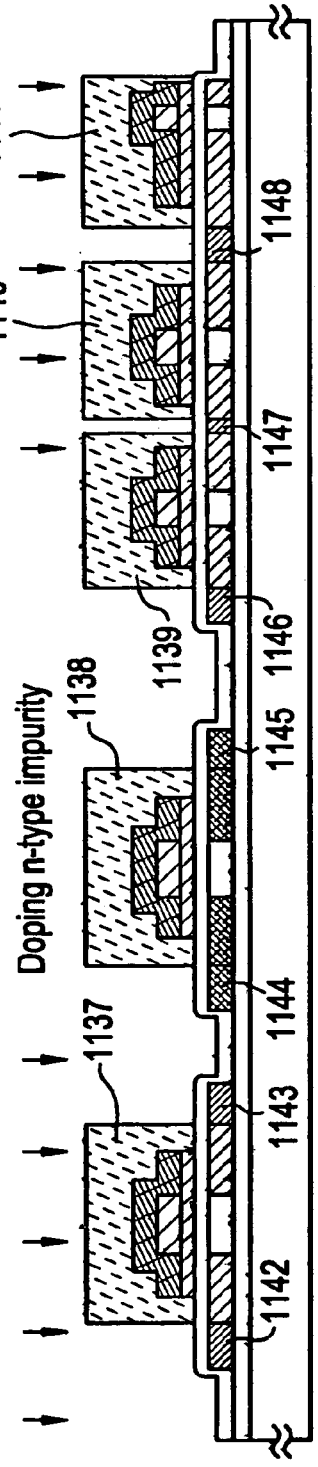

Subsequently, as illustrated in FIG. 12C, resist masks 1137, 1138, 1139, 1140, 1141 are formed so as to carry out the step of second doping with an impurity element bestowing the n-conductivity type. Here, the step is implemented by ion doping with phosphine (PH$_3$). Also at this step, phosphorus as a dopant is passed through the gate insulating film 1106 to be introduced into the underlying semiconductor layers, and hence, the acceleration voltage of the ion doping is set at a somewhat high voltage of 80 keV. Thus, regions 1142, 1143, 1144, 1145, 1146, 1147, 1148 doped with the element phosphorus are formed. The concentration of the element phosphorus in these regions 1142 to 1148 is higher than in the regions formed by the step of the first doping with the impurity element bestowing the n-conductivity type. The phosphorus concentration should preferably be set at $1 \times 10^{20}$ to $1 \times 10^{21}$ atoms/cm$^3$. Here, it is set at $1 \times 10^{20}$ atoms/cm$^3$.

At this step, the lengths of the resist masks 1137, 1138, 1139, 1140 in the channel length direction are important for determining the structures of the respective TFTs. Especially in each of the n-channel TFTs, the part of the second impurity region lying under the gate electrode and the part thereof not lying under the gate electrode can be determined at will within a certain range in accordance with the length of the first and third layers of the gate electrode and the length of the resist mask. In this embodiment, the length of the first layers 1127, 1128 and third layers 1132, 1133 of the corresponding gate electrode is 6 μm, and that of the first layers 1129, 1130 and third layers 1134, 1135 of the corresponding gate electrodes is 4 μm. Therefore, the resist masks 1137, 1138 are set at a length of 9 μm, and the resist masks 1139, 1140 are set at a length of 7 μm.

Figure 13:
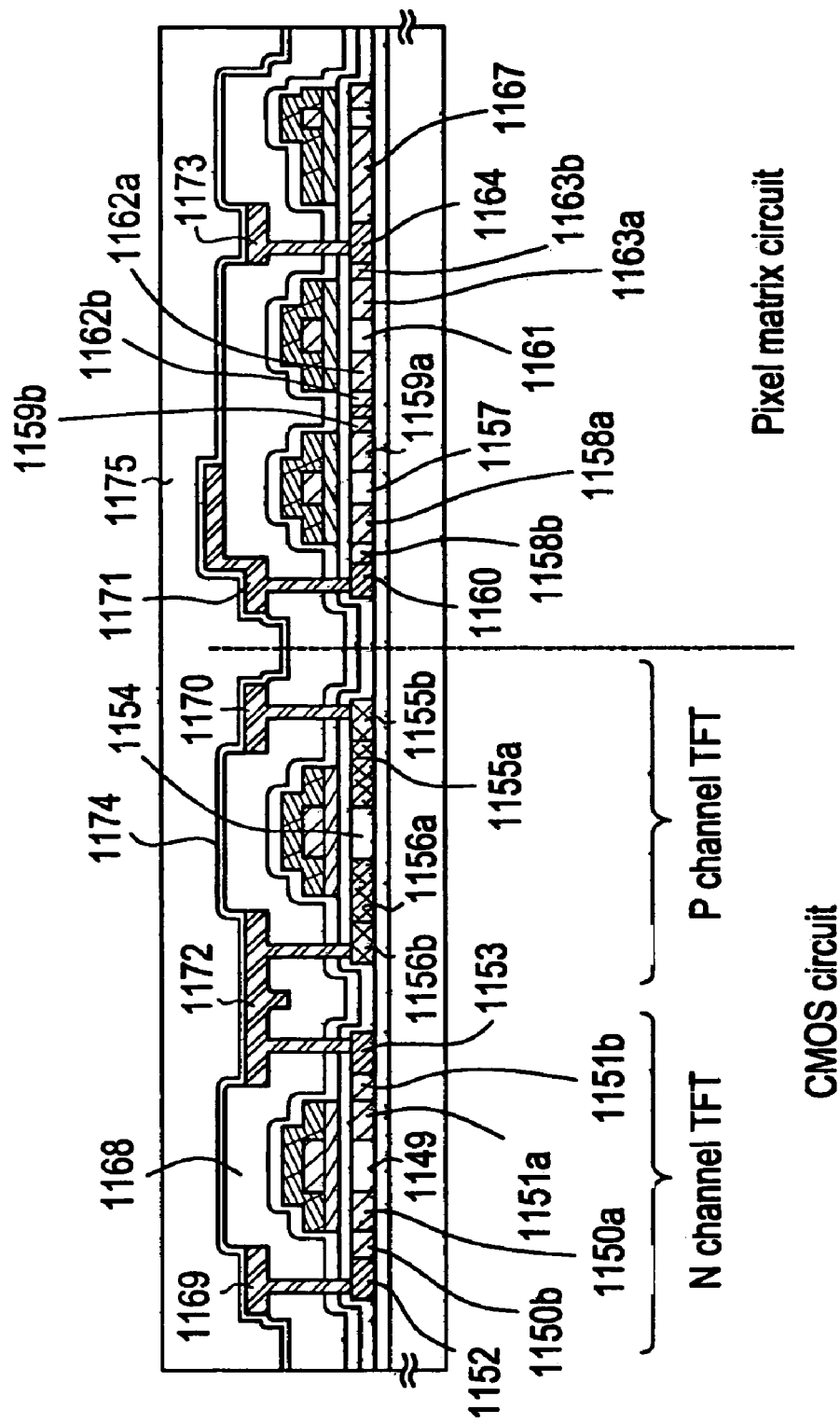
FIG. 13 is a sectional view showing the process for fabricating the TFTs in the fifth embodiment.

After the steps illustrated up to FIG. 12C have ended, the resist masks 1137, 1138, 1139, 1140, 1141 are removed so as to carry out the step of forming a first interlayer insulating film 1168, as shown in FIG. 13. The first interlayer insulating film 1168 is formed by a double-layer structure. Initially, a silicon nitride film is formed to a thickness of 50 nm. The silicon nitride film is formed by plasma CVD under the conditions that SiH$_4$, NH$_3$ and N$_2$ are respectively introduced 5 SCCM, 40 SCCM and 100 SCCM, that a pressure of 0.7 Torr is held, and that a high-frequency power of 300 W is supplied. Subsequently, a silicon oxide film is formed to a thickness of 950 nm under the conditions that TEOS and O$_2$ are respectively introduced 500 SCCM and 50 SCCM, that a pressure of 1 Torr is held, and that a high-frequency power of 200 W is supplied. Accordingly, the silicon nitride film and the silicon oxide film which are 1 μm thick in total constitute the first interlayer insulating film 1168.

The step of heat treatment needs to be implemented for activating the impurity elements bestowing the n-conductivity type and p-conductivity type as have been introduced at the respective concentrations. This step may be implemented by thermal annealing with an electric heating furnace, laser annealing with the excimer laser stated before, or rapid thermal annealing (RTA) with a halogen lamp. The laser annealing can activate the impurity elements at a lower substrate heating temperature, but it is difficult of activating them even in the regions concealed under the gate electrodes. Accordingly, the thermal annealing is employed here. Conditions in this case are a nitrogen atmosphere, and a heating temperature of 300 to 700 degrees centigrade, preferably 350 to 550 degrees centigrade. Here, the heat treatment is carried-out at 450 degrees centigrade for 2 hours.

The first interlayer insulating film 1168 is thereafter formed by patterning with contact holes which reach the source regions and drain regions of the respective TFTs. Further, source wiring lines 1169, 1170, 1171 and drain wiring lines 1172, 1173 are laid. In this embodiment, each of the wiring lines has a triple-layer structure, not shown, which is formed in such a way that a Ti film being 100 nm thick, an Al film containing Ti and being 300 nm thick, and a Ti film being 150 nm thick are consecutively deposited by sputtering.

In addition, a passivation film 1174 is formed covering the source wiring lines 1169, 1170, 1171 as well as the drain wiring lines 1172, 1173 and the first interlayer insulating film 1168. The passivation film 1174 is formed as a silicon nitride film to a thickness of 50 nm. Further, a second interlayer insulating film 1175 made of an organic resin is formed to a thickness of about 1000 nm. Usable as the organic resin are polyimide, acrylic resin, polyimidoamide, etc. The merits of the use of the organic resin film are that a method for forming the film is easy, that a parasitic capacitance can be lowered owing to the small dielectric constant of the organic resin, and that the flatness of the surface of the film is excellent. Incidentally, it is possible to employ organic resins other than mentioned above. Here, polyimide of the type which is thermally polymerized after application on the substrate is employed, and it is baked at 300 degrees centigrade.

By the steps thus far described, the gate electrodes of the clad structure are formed, and the n-channel TFT of the CMOS circuit is formed with a channel forming region 1149, first impurity regions 1152, 1153, and second impurity regions 1150a, 1150b, 1151a, 1151b. Here, each of the parts 1150a, 1151a (GOLD regions) of the second impurity regions underlying the gate electrode has a length of 1.5 μm, while each of the parts 1150b, 1151b (LDD regions) of the second impurity regions not underlying the gate electrode has a length of 1.5 μm. Besides, the first impurity region 1152 serves as the source region of the TFT, and the first impurity region 1153 as the drain region.

Likewise, the p-channel TFT of the CMOS circuit is formed with the gate electrode of the clad structure, and it is formed with a channel forming region 1154, and third impurity regions 1155a, 1155b, 1156a, 1156b. The third impurity regions 1155a, 1155b serve as the source region of the TFT, and the third impurity regions 1156a, 1156b as the drain region.

In addition, the pixel TFTs of the pixel matrix circuit are formed with channel forming regions 1157, 1161, first impurity regions 1160, 1164, and second impurity regions 1158, 1159, 1162, 1163. The second impurity regions here consist of subregions 1158a, 1159a, 1162a, 1163a underlying the corresponding gate electrodes, and subregions 1158b, 1159b, 1162b, 1163b not underlying the gate electrodes.

In this way, an active matrix substrate in which the CMOS circuit and the pixel matrix circuit are formed on the substrate 1101 is fabricated as shown in FIG. 13. Besides, the retention capacitance is simultaneously formed on the drain side of the n-channel TFT of the pixel matrix circuit.

Embodiment 6

In this embodiment, there will be described a process in which an active matrix type liquid crystal display device is produced from the active matrix substrate fabricated in Embodiment 1.

In the active matrix substrate in the state illustrated in FIG. 5, a light shield film 1601 and a third interlayer insulating film 1602 are formed on the second interlayer insulating film 381 as shown in FIG. 16A. The light shield film 1601 may be formed of an organic resin film containing a pigment, or a metal film made of Ti, Cr or the like. The third interlayer insulating film 1602 is formed of an organic resin film made of polylmide or the like. Besides, the third interlayer insulating film 1602 and the second interlayer insulating film 381 are formed with a contact hole reaching the drain wiring line 379, and a pixel electrode 1603 is formed through the contact hole. A transparent conductive film may be employed for the pixel electrode 1603 in a case where the liquid crystal display device is of transmission type, and a metal film in a case where the liquid crystal display device is of reflection type. Here, in order to manufacture the transmission type liquid crystal display device, the pixel electrode 1603 is formed in such a way that an indium tin oxide (ITO) film is deposited on the third interlayer insulating film 1602 to a thickness of 100 nm by sputtering.

The material of the transparent conductive film is etched with a solution based on hydrochloric acid. Since, however, the etching of the material ITO is liable to produce a residue, an indium oxide ($In_2O_3$)-zinc oxide (ZnO) alloy may well be employed for bettering the processibility of the etching. The indium oxide-zinc oxide alloy has the features of endowing the film with an excellent surface smoothness, and exhibiting a thermal stability superior to that of the material ITO. Likewise, zinc oxide (ZnO) is a suitable material. Further, a material (ZnO:Ga) in which zinc oxide is doped with gallium (Ga), etc. can be employed in order to attain a higher transmittance for visible light and a higher electric conductivity.

Subsequently, as shown in FIG. 16B, an orientation film 1604 is formed on the third interlayer insulating film 1602 and the pixel electrode 1603. Usually, a polyimide resin is often used for the orientation film of a liquid crystal display element. A substrate 1605 on a side opposite to the active matrix substrate is formed with a transparent conductive film 1606 and an orientation film 1607. After having been formed, each orientation film is subjected to rubbing so that liquid crystal molecules may be oriented in parallel with a certain predetermined pretilt angle.

The active matrix substrate which has been formed with the pixel matrix circuit and the CMOS circuit via the above steps, is fastened to the opposite substrate 1605 through sealing members (not shown), spacers (not shown), or the likes by a known cell assemblage step. Thereafter, a liquid crystal material 1608 is poured between both the substrates, and the resulting structure is completely sealed with a sealant (not shown). Then, the active matrix type liquid crystal display device shown in FIG. 16B is finished up.

Figure 14:
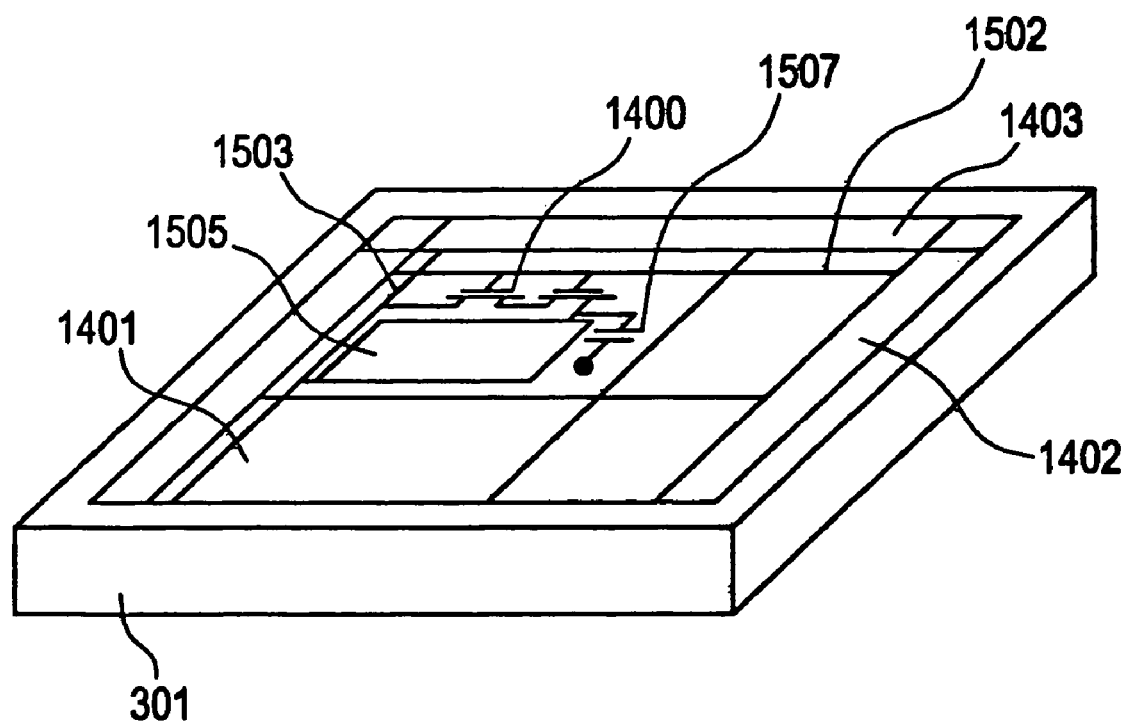
FIG. 14 is a perspective view of an active matrix substrate.

Next, the construction of the active matrix type liquid crystal display device in this embodiment will be described with reference to FIG. 14 and FIGS. 15A and 15B. FIG. 14 is a perspective view of the active matrix type liquid crystal display device in this embodiment. The active matrix substrate includes a pixel matrix circuit 1401, a scanning (gate) line drive circuit 1402 and a data (source) line drive circuit 1403 which are formed on a glass substrate 301. The pixel TFT 1400 of the pixel matrix circuit 1401 is an n-channel TFT (of double-gate structure), and the drive circuits 1402, 1403 provided around the pixel matrix circuit 1401 are constructed on the basis of CMOS circuits. The scanning (gate) line drive circuit 1402 and the data (source) line drive circuit 1403 are respectively connected to the pixel matrix circuit 1401 by gate wiring lines 1502 and source wiring lines 1503.

Figure 15A:
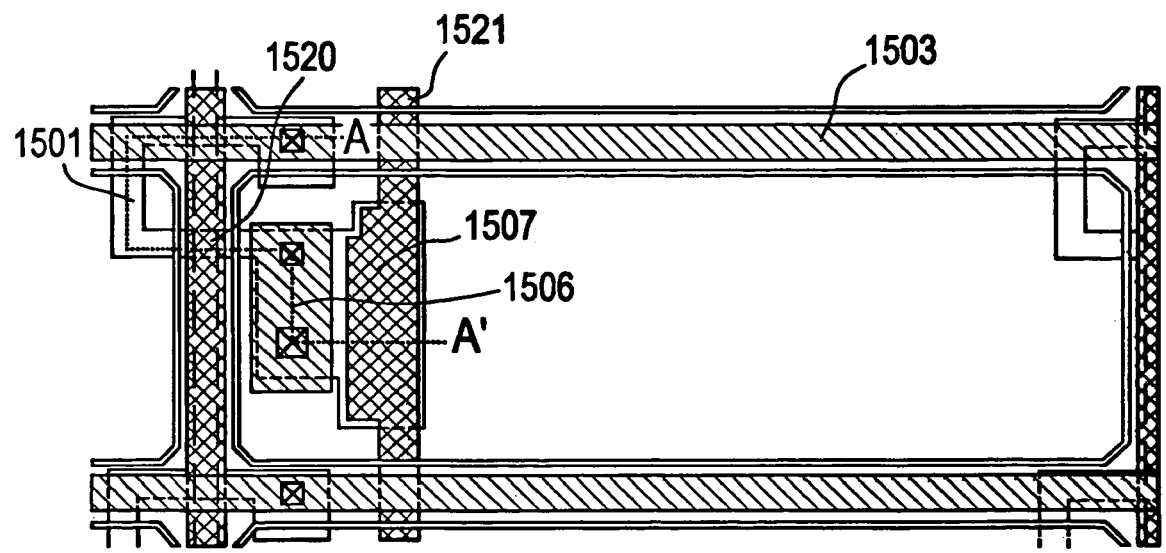
FIGS. 15A and 15B are top plan views of an active matrix circuit and a CMOS circuit, respectively.

FIG. 15A is a top plan view showing the pixel matrix circuit 1401, and corresponding substantially to one pixel. The pixel matrix circuit includes the n-channel TFT being the pixel TFT. A gate electrode 1520 which is formed in continuation to the gate wiring line 1502, intersects a semiconductor layer 1501 which underlies the gate electrode 1520 through a gate insulating film, not shown. The semiconductor layer is formed with a source region, a drain region and a first impurity region though these regions are not shown. Besides, on the drain side of the pixel TFT, a retention capacitance 1507 is formed from the semiconductor layer, the gate insulating film, and an electrode made of the same material as the gate electrode 1520. A capacitance wiring line 1521 which is connected to the retention capacitance 1507, is laid in parallel with the gate wiring line 1502. Incidentally, a sectional structure taken along line A-A' indicated in FIG. 15A is as shown by the sectional view of the pixel matrix circuit in FIG. 5.

Figure 15B:
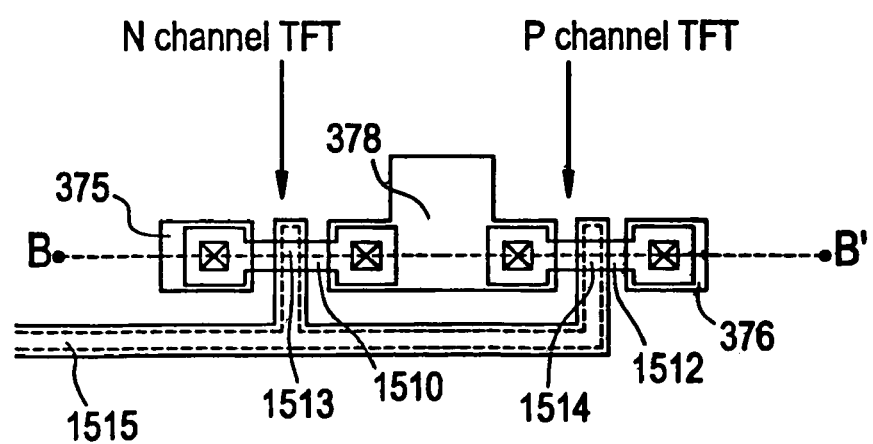

On the other hand, in the CMOS circuit shown in FIG. 15B, gate electrodes 1513, 1514 extended from a gate wiring line 1515 intersect respective semiconductor layers 1510, 1512 which underlie the corresponding gate electrodes 1513, 1514 through the gate insulating film, not shown. Although no illustration is made, the semiconductor layer of the n-channel TFT of the CMOS circuit is similarly formed with a source region, a drain region and first impurity regions. Also, the semiconductor layer of the p-channel TFT of the CMOS circuit is formed with a source region and a drain region. Regarding the positional relationships among these regions, a sectional structure taken along line B-B' indicated in FIG. 15B is as shown by the sectional view of the CMOS circuit in FIG. 5.

In this embodiment, the pixel TFT 1400 is of the double-gate structure, but it may well be a single-gate structure or a multigate structure such as triple-gate structure. The structure of the active matrix substrate in the present invention is not restricted to the structure in this embodiment. The present invention features the structure of the gate electrode, and the configuration of the source region, drain region and other impurity regions of the semiconductor layer which is provided under the gate electrode through the gate insulating film. Therefore, a person who designs the active matrix substrate may properly determine any other constructional point.

An active matrix substrate for manufacturing the active matrix type liquid crystal display device explained in this embodiment is not restricted to one explained in Embodiment 1, but it may well be any of the active matrix substrates in Embodiments 2 to 5 and an active matrix substrate fabricated in accordance with a process to be explained in Embodiment 7 below.

Embodiment 7

In this embodiment, there will be described a process in which the step of gettering is omitted from the method of fabricating the active matrix substrate explained in Embodiment 5. In Embodiment 5, the semiconductor layers 1103, 1104, 1105 shown in FIG. 11A are the crystalline silicon films produced by the catalyst element. On this occasion, the catalyst element used at the step of crystallization remains in the semiconductor layers, and hence, the step of gettering should desirably be implemented. Embodiment 5 employs the process in which, after the crystalline silicon films have been produced, they are partly doped with phosphorus so as to getter the remaining catalyst element. Here in Embodiment 7, the catalyst element is removed from the channel forming regions of the TFTs by the process below, without implementing the gettering step.

Here, the steps illustrated in FIGS. 11A through 12C are carried out as they are. Thereafter, the resist masks 1137, 1138, 1139, 1140, 1141 are removed.

In this case, the first impurity regions 1152, 1153, 1160, 1164 of the n-channel TFTs are doped with the element phosphorus. Besides, the third impurity regions 1155b, 1156b of the p-channel TFT are similarly doped with the element phosphorus. According to Embodiment 5, the concentration of the element phosphorus is $1\times10^{20}$ to $1\times10^{21}$ atoms/cm$^3$ on this occasion.

Figure 22:
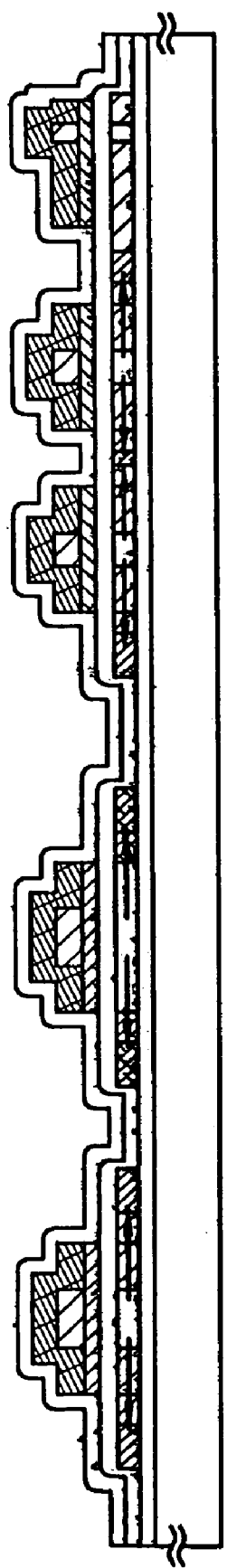
FIG. 22 is a sectional view showing a process for fabricating TFTs.

In this state, the gate insulating film and the gate electrodes are covered with a silicon nitride film 1180 as illustrated in FIG. 22. The silicon nitride film 1180 is formed to a thickness of 10 to 100 nm, here 50 nm, by plasma CVD. This silicon nitride film 1180 may well be substituted by a silicon oxide nitride film.

In Embodiment 5, the third layers of the respective gate electrodes are made of Mo—W. Alternatively, they may well be made of Ti, Ta, Mo, W or the like. These materials are oxidized comparatively easily by a heat treatment which is executed under the atmospheric pressure or while nitrogen is being purged. In such a situation, the oxidation can be prevented by covering the surfaces of the third layers with the silicon nitride film 1180.

In this state, the resulting substrate is subjected to the step of heat treatment in a nitrogen atmosphere at 400 to 800 degrees centigrade for 1 to 24 hours, for example, at 600 degrees centigrade for 12 hours. Owing to this step, the introduced impurity elements bestowing the n-conductivity type and the p-conductivity type can be activated. Further, the regions doped with the element phosphorus act as gettering sites, and the catalyst element having remained after the step of the crystallization can be segregated. As a result, the catalyst element can be removed from the channel forming regions. Consequently, the effect of decreasing OFF currents can be brought forth in the TFTs finished up.

After the end of the step shown in FIG. 22, the succeeding steps conform to those of Embodiment 5 so as to form the first interlayer insulating film, the source wiring lines as well as the drain wiring lines, the passivation film, and the second interlayer insulating film as shown in FIG. 13. Then, the active matrix substrate can be fabricated.

Embodiment 8

In this embodiment, another example of the circuit arrangement of the CMOS circuit shown in FIG. 1 will be described with reference to FIGS. 23A, 23B and 23C. Incidentally, terminal portions a, b, c, d in a circuit diagram of an inverter circuit in FIG. 23A and ones in a top plan view of the inverter circuit in FIG. 23B correspond to each other, respectively.

Figure 23A:
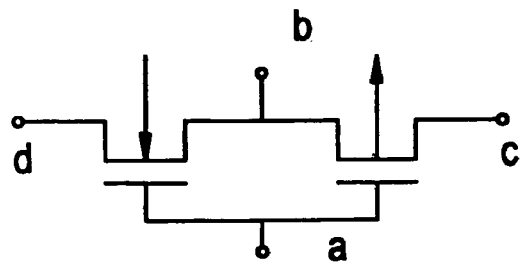
FIGS. 23A, 23B and 23C are a circuit diagram, a top plan view and a sectional structural view of an inverter circuit, respectively.
Figure 23B:
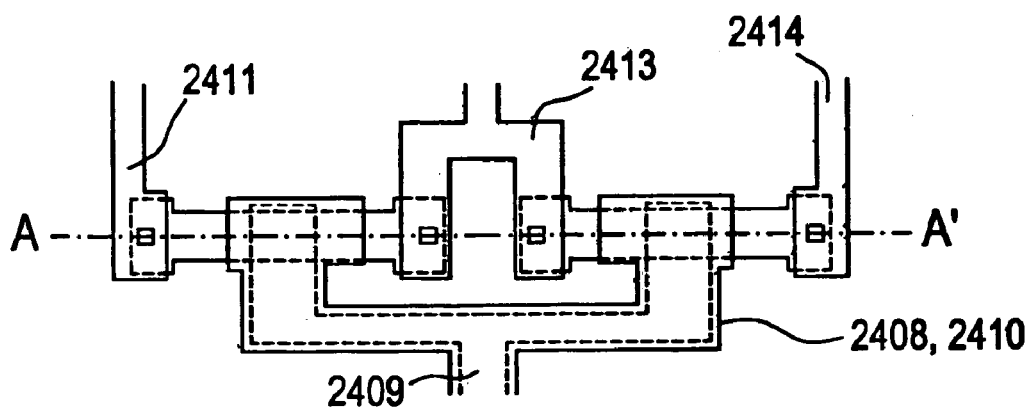
Figure 23C:
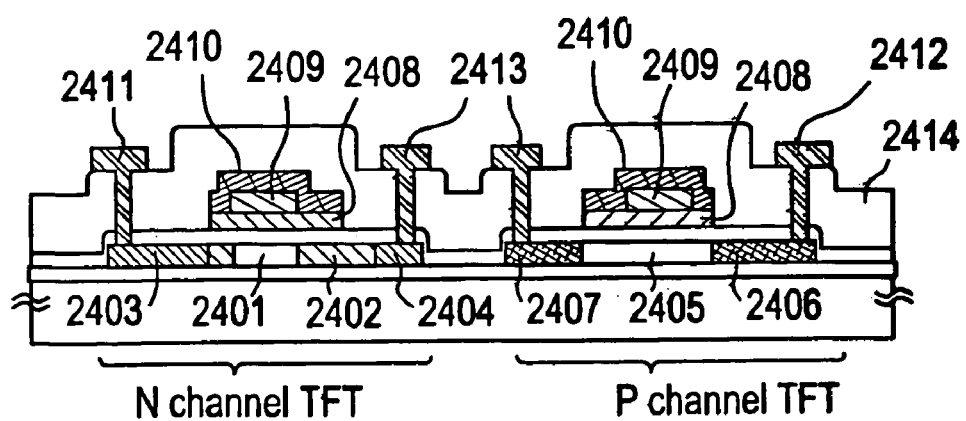

The inverter circuit shown in FIG. 23A is constructed as illustrated by the top plan view in FIG. 23B. Further, the structure of an A-A' section indicated in FIG. 23B is constructed of gate electrodes 2409, 2409', the source wiring line 2411 of the n-channel TFT of the CMOS circuit, the source wiring line 2414 of the p-channel TFT thereof, and the common drain wiring line 2413 of the TFTs thereof, as seen from FIG. 23C. Here, the gate electrodes 2409, 2409' are depicted in a state where the first layers 2408, 2408' of the respective gate electrodes, the second layers 2409, 2409' thereof and the third layers 2410, 2410' thereof are united.

The n-channel TFT of the inverter circuit includes second impurity regions 2402a, 2402b. More specifically, the second impurity regions consist of the part 2402a which the gate electrode 2409 overlaps, and the part (LDD region) 2402b which the gate electrode 2409 does not overlap. Such a structure may be provided on only the drain side of the n-channel TFT. The p-channel TFT does not include such impurity regions.

Embodiment 9

Nematic liquid crystals and various other liquid crystals can be employed for the liquid crystal display devices of the present invention as described above. By way of example, it is possible to employ liquid crystals disclosed in H. Furue et al., Characteristics and Driving Scheme of Polymer-Stabilized Monostable FLCD Exhibiting Fast Response Time and High Contrast Ratio with Gray-Scale Capability, SID, 1998; T. Yoshida et al., A Full-Color Thresholdless Antiferroelectric LCD Exhibiting Wide Viewing Angle with Fast Response Time, 841, SID DIGEST, 1997; S. Inui et al., Thresholdless antiferroelectricity in liquid crystals and its application to displays, 671-673, J. Mater. Chem. 6(4), 1996; and U.S. Pat. No. 5,594,569.

Figure 24:
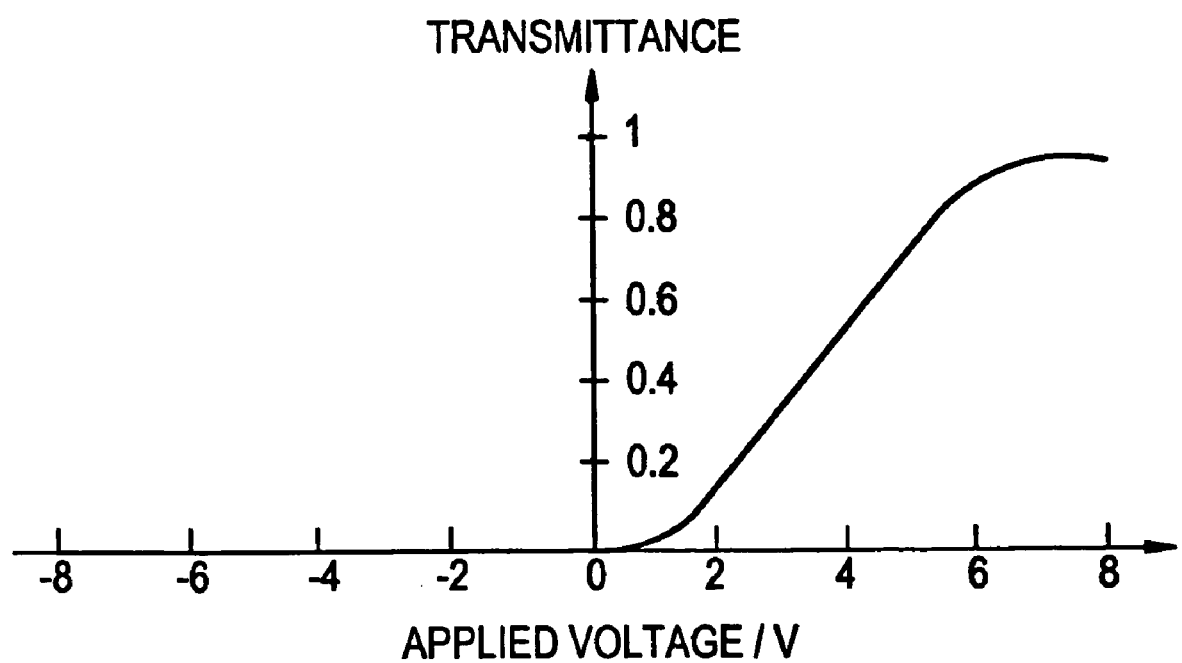
FIG. 24 is a graph showing a light transmittance characteristic of a ferroelectric liquid crystal.

FIG. 24 illustrates the electrooptic characteristics of a monostable FLC (ferroelectric liquid crystal) obtained by employing an FLC which exhibits an isotropic phase-cholesteric phase-chiral smectic C phase transition series, inducing a cholesteric phase-chiral smectic C phase transition while a DC voltage is kept applied to the employed FLC, and bringing a cone edge into substantial agreement with a rubbing direction. A display mode based on the ferroelectric liquid crystal as shown in FIG. 24 is called the Half-V shape switching mode. The axis of ordinates of the graph shown in FIG. 24 represents a transmittance (in an arbitrary unit), while the axis of abscissas represents an applied voltage. The Half-V shape switching mode is detailed in Half-V shape switching mode FLCD by Terada et al., Collection of Preliminary Lecture Manuscripts for 46th Associated Lecture Meeting on Applied Physics, March 1999, p. 1316; and Time-Division Full-Color LCD employing Ferroelectric Liquid Crystal by Yoshihara et al., Liquid Crystals, Vol. 3, No. 3, p. 190.

It is understood from FIG. 24 that a low voltage drive and a gradation display are realized with such a mixed ferroelectric liquid crystal. The ferroelectric liquid crystal exhibiting the above electrooptic characteristics is also applicable to the liquid crystal display devices according to the present invention.

Meanwhile, a liquid crystal exhibiting an antiferroelectric phase in a certain temperature range is termed an antiferroelectric liquid crystal (AFLC). A mixed liquid crystal having the AFLC includes what is called a thresholdless mixed antiferroelectric liquid crystal exhibiting electrooptic response characteristics in which a transmittance changes continuously versus an electric field. The thresholdless mixed antiferroelectric liquid crystal includes one which exhibits so-called V-shaped electrooptic response characteristics, and one whose drive voltage is about ±2.5 V (about 1 to 2 µm in terms of a cell thickness) has been found out.

In general, the thresholdless mixed antiferroelectric liquid crystal exhibits a spontaneous polarization of large magnitude, and it has a large dielectric constant in itself. Therefore, in a case where the liquid crystal display device is constructed using the thresholdless mixed antiferroelectric liquid crystal, the pixel thereof requires a retention capacitance of comparatively large value. The thresholdless mixed antiferroelectric liquid crystal to be used should preferably have a small spontaneous polarization.

Incidentally, since a low voltage drive is realized by employing such a thresholdless mixed antiferroelectric liquid crystal for the liquid crystal display device according to the present invention, the power dissipation of the display device can be lowered.

Embodiment 10

The active matrix substrate and the liquid crystal display device which have been obtained by performing the present invention, can be employed for various electrooptic devices. In addition, the present invention can be applied to any electronic equipment in which such an electrooptic device is incorporated as a display medium. Mentioned as the electronic equipments are a personal computer, a digital camera, a video camera, a mobile computer, a portable telephone set and an electronic book, a navigation system, etc. Examples of the electronic equipments are illustrated in FIGS. 25A through 25H and FIGS. 26A through 26D.

Figure 25A:
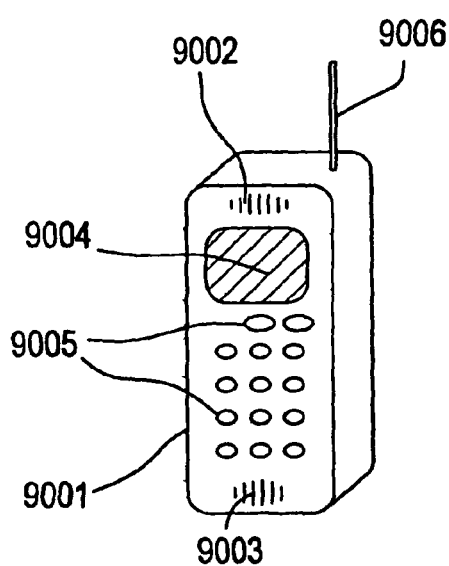
FIGS. 25A through 25H are schematic views showing examples of semiconductor devices.

FIG. 25A shows a portable telephone set, which is configured of a body 9001, a voice output unit 9002, a voice input unit 9003, a display unit 9004, operating switches 9005, and an antenna 9006. The present invention is applicable to the display unit 9004 and the other signal control circuits incorporated into the portable telephone set.

Figure 25B:
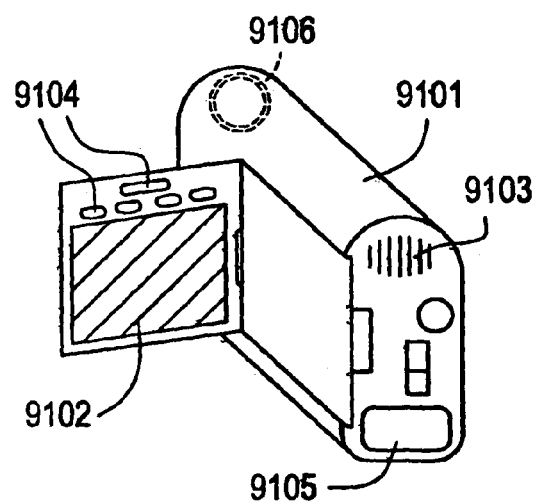

FIG. 25B shows a video camera, which is configured of a body 9101, a display unit 9102, a sound input unit 9103, operating switches 9104, a battery 9105, and an image receiving unit 9106. The present invention is applicable to the display unit 9102 and the other signal control circuits incorporated into the video camera.

Figure 25C:
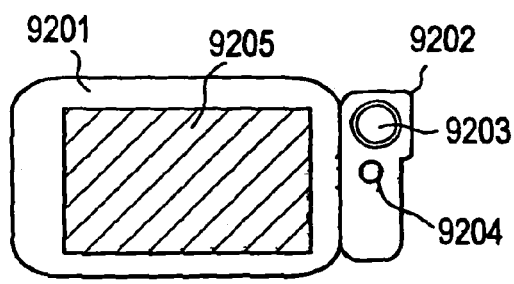

FIG. 25C shows a portable information terminal, which is configured of a body 9201, a camera portion 9202, an image receiving portion 9203, an operating switch 9204, and a display unit 9205. The present invention is applicable to the display unit 9205 and the other signal control circuits incorporated into the portable information terminal.

Figure 25D:
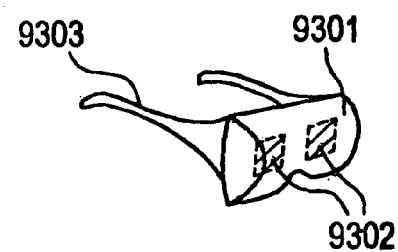

FIG. 25D shows a goggle type display device, which is configured of a body 9301, a display unit 9302, and an arm portion 9303. The present invention is applicable to the display unit 9302 and the other signal control circuits incorporated into the goggle type display device.

Figure 25E:
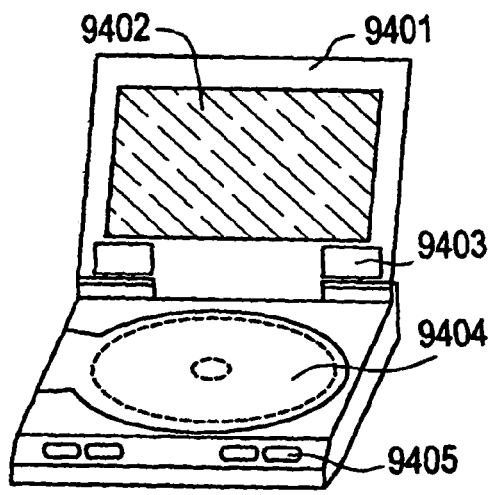

FIG. 25E shows a player which is used for a recording medium 9404 storing programs therein, and which is configured of a body 9401, a display unit 9402, a loudspeaker unit 9403, and operating switches 9405. By the way, the recording medium 9404 is a DVD (Digital Versatile Disc), a CD (Compact Disc), or the like, and the player is capable of reproducing a music program, displaying an image, displaying the information of a video game (or television game) or information obtained through the Internet, and so forth. The present invention is applicable to the display unit 9402 and the other signal control circuits incorporated into the player.

Figure 25F:
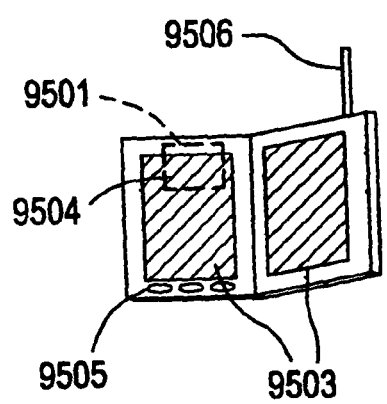

FIG. 25F shows a portable book (electronic book), which is configured of the body 9501, display units 9503, a storage medium 9504, operating switches 9505, and an antenna 9506. The present invention is applicable to the display units 9503 and the other signal control circuits incorporated into the portable book.

Figure 25G:
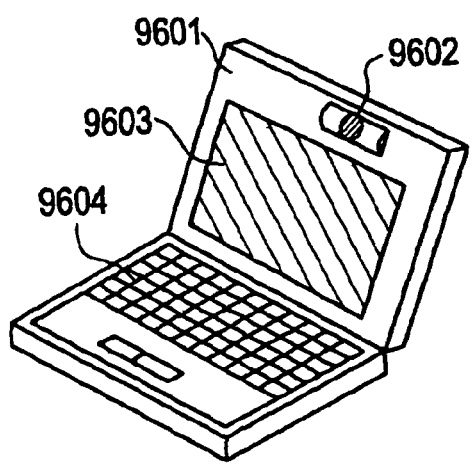

FIG. 25G shows a personal computer, which is configured of a body 9601 including a microprocessor, a memory etc., an image input unit 9602, a display unit 9603, and a keyboard 9604. The present invention is applicable to the display unit 9603 and the other signal processing circuits incorporated into the personal computer.

Figure 25H:
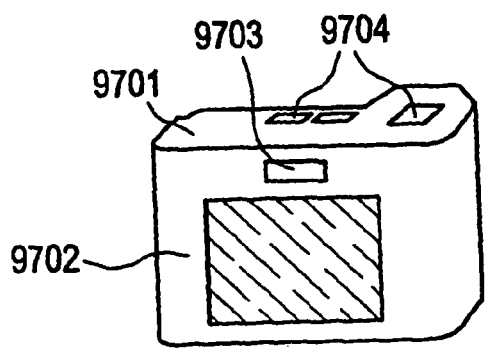

FIG. 25H shows a digital camera, which is configured of the body 9701, a display unit 9702, a view window 9703, operating switches 9704, and an image receiving portion (not shown). The present invention is applicable to the display unit 9702 and the other signal control circuits incorporated into the digital camera.

Figure 26A:
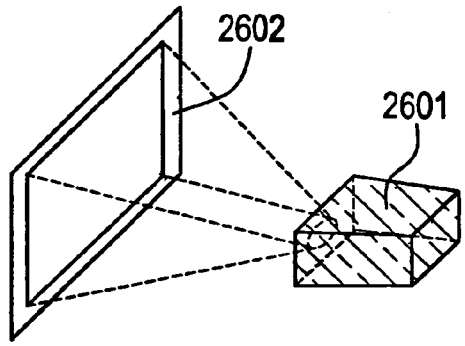
FIGS. 26A through 26D are schematic views for explaining the construction of a projector.
Figure 26B:
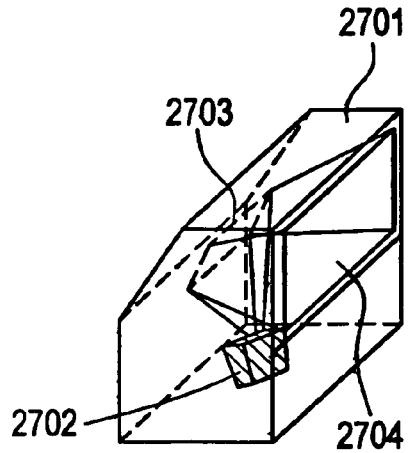

FIG. 26A shows a front type projector, which is configured of a light-source optical system and display unit 2601, and a screen 2602. The present invention is applicable to the display unit and signal control circuits. On the other hand, FIG. 26B shows a rear type projector, which is configured of the body 2701, a light-source optical system and display unit 2702, a mirror 2703, and a screen 2704. The present invention is applicable to the display unit and the other signal control circuits incorporated into the front type projector and the rear type projector.

Figure 26C:
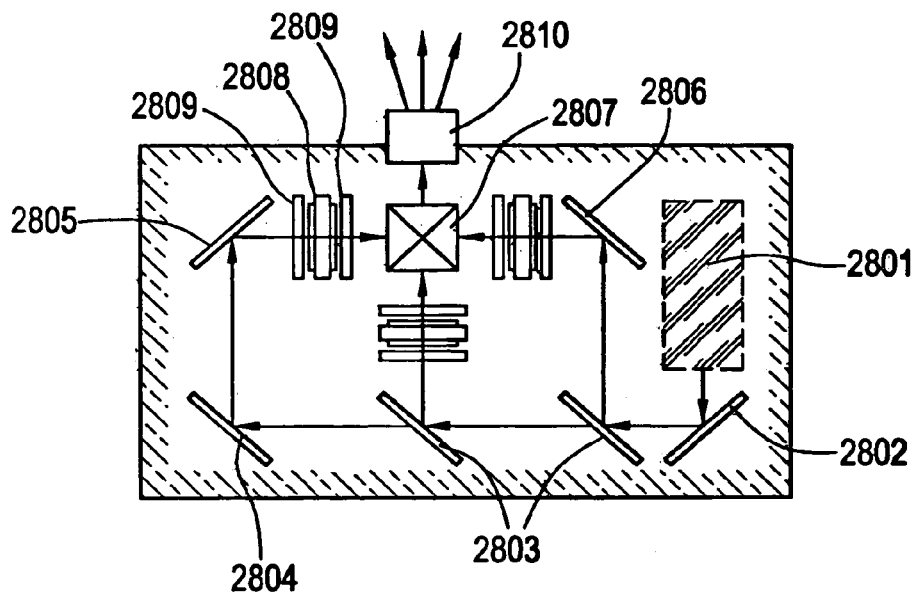
Figure 26D:
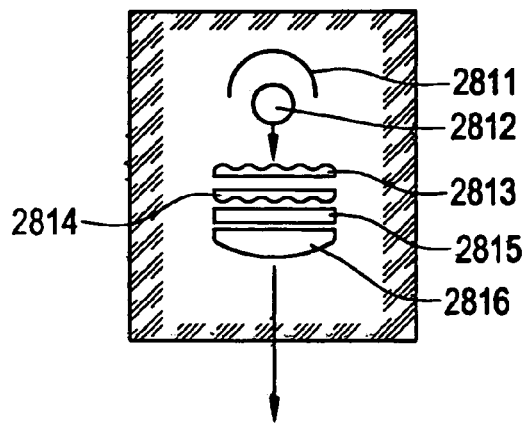

FIG. 26C illustrates an example of the structure of each of the light-source optical system and display units 2601, 2702 respectively shown in FIGS. 26A and 26B. Each of the light-source optical system and display units 2601, 2702 is configured of a light-source optical system 2801, reflector mirrors 2802, 2804, 2805 and 2806, dichroic mirrors 2803, a beam splitter 2807, liquid crystal display units 2808, a phase difference plate 2809, and a projection optical system 2810. The projection optical system 2810 is constituted by a plurality of optical lenses. The example shown in FIG. 26C includes a triple panel scheme in which the three liquid crystal display units 2808 are used. However, the structure is not restricted to such a scheme, but it may well be constructed of an optical system of single panel scheme. Moreover, an optical lens, a film having a polarizing function, a film for regulating a phase, an IR film, etc. may well be occasionally inserted into optical paths which are indicated by arrows in FIG. 26C. Besides, FIG. 26D is a diagram showing an example of the structure of the light-source optical system 2801 depicted in FIG. 26C. In this embodiment, the light-source optical system 2801 is constituted by a reflector 2811, a light source 2812, lens arrays 2813, 2814, a polarizing transducer 2815, and a condensing lens 2816. It is to be understood that the light-source optical system 2801 shown in FIG. 26D is merely one example, and that the optical system is not restricted to the illustrated structure.

The present invention is also applicable to the reading circuits of a navigation system an image sensor, etc. though they are not shown in the drawings. In this manner, the present invention has very wide applications and is applicable to electronic equipments in all technical fields. Besides, the electronic equipments in this embodiment can be incarnated using constructions which are any combinations of the aspect of performance described before and Embodiments 1 through 9.

Embodiment 11

This embodiment demonstrates a process for producing an EL (electroluminescence) display device according to the invention of the present application.

Figure 27A:
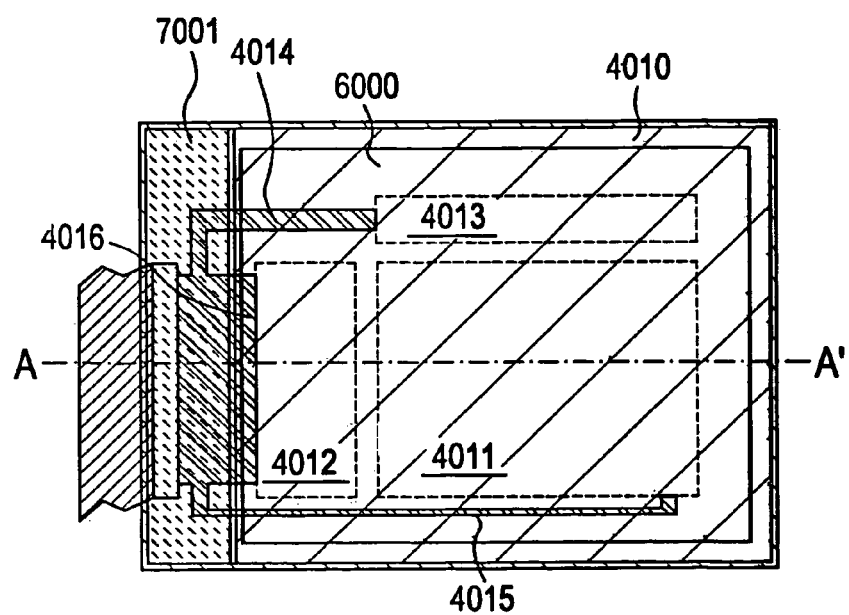
FIGS. 27A and 27B are a top plan view and a sectional view of an active matrix type EL display device, respectively.

FIG. 27A is a top view showing an EL display device, which was produced according to the invention of the present application. In FIG. 27A, there are shown a substrate 4010, a pixel part 4011, a driving circuit from the source 4012, and a driving circuit from the gate 4013, each driving circuit connecting to wirings 4014, 4015 and 4016 which reach FPC 4017 leading to external equipment.

Figure 27B:
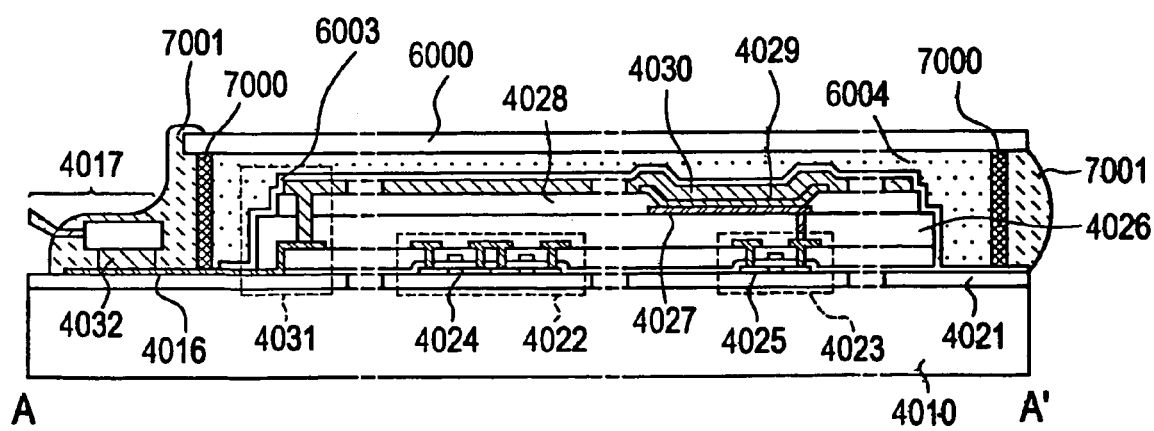

FIG. 27B is a sectional view showing the structure of the EL display device in this embodiment. The pixel part, preferably together with the driving circuit, is enclosed by a covering material 6000, a sealing material (or housing material) 7000, and an end-sealing material (or second sealing material) 7001.

Furthermore, there is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. It is preferable that the TFT for the pixel portion is a p-channel type TFT in the case that the transparent conductive film is used for the pixel electrode 4027. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spacers are contained in the filling material, the passivation film 6003 can relieve the pressure of the spacers. Of course, the other film different from the passivation film, such as an organic resin, can be used for relieving the pressure of the spacers.
As the covering material 6000, a glass plate, an aluminum plate, a stainless plate, a FRP (Fiberglass-Reinforced. Plastics) plate, a PVF (Polyvinyl Fluoride) film, a Mylar film, a polyester film or an acryl film can be used. In a case that PVB or EVA is employed as the filling material 6004, it is preferable to use an aluminum foil with a thickness of some tens of m sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

Embodiment 12

Figure 28A:
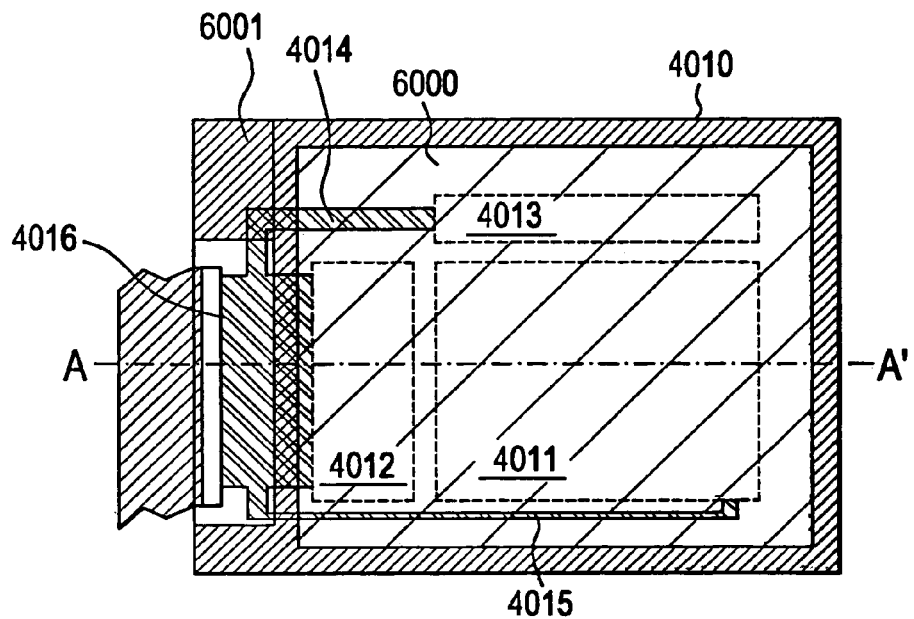
FIGS. 28A and 28B are a top plan view and a sectional view of an active matrix type EL display device, respectively.
Figure 28B:
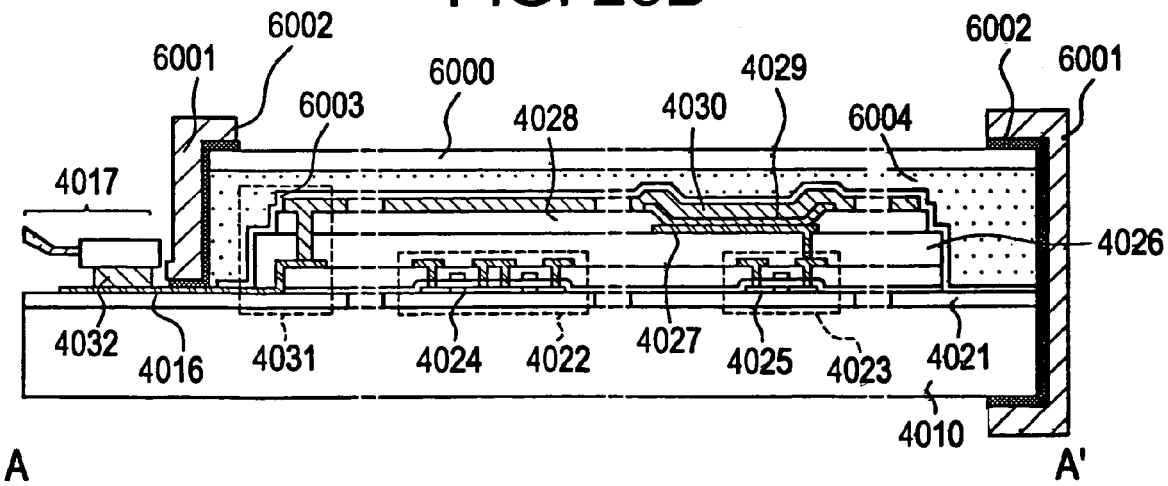

In this embodiment, another EL display device having a different structure from the embodiment 11 is explained, as shown in FIGS. 28A and 28B. The same reference numerals in FIGS. 28A and 28B as in FIGS. 27A and 27B indicate same constitutive elements, so an explanation is omitted.

FIG. 28A shows a top view of the EL module in this embodiment and FIG. 28B shows a sectional view of A-A' of FIG. 28A.

According to Embodiment 11, the passivation film 6003 is formed to cover a surface of the EL element.

The filling material 6004 is formed to cover the EL element and also functions as an adhesive to adhere to the covering material 6000. As the filling material 6004, PVC (Polyvinyl Chloride), an epoxy resin, a silicon resin, PVB (Polyvinyl Butyral), or EVA (Ethylenvinyl Acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of m sandwiched by a PVF film or a Mylar film.

It is noted that the covering material 6000 should have a light transparency with accordance to a light emitting direction (a light radiation direction) from the EL element.

Next, the covering material 6000 is adhered using the filling material 6004. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

Embodiment 13

Figure 29:
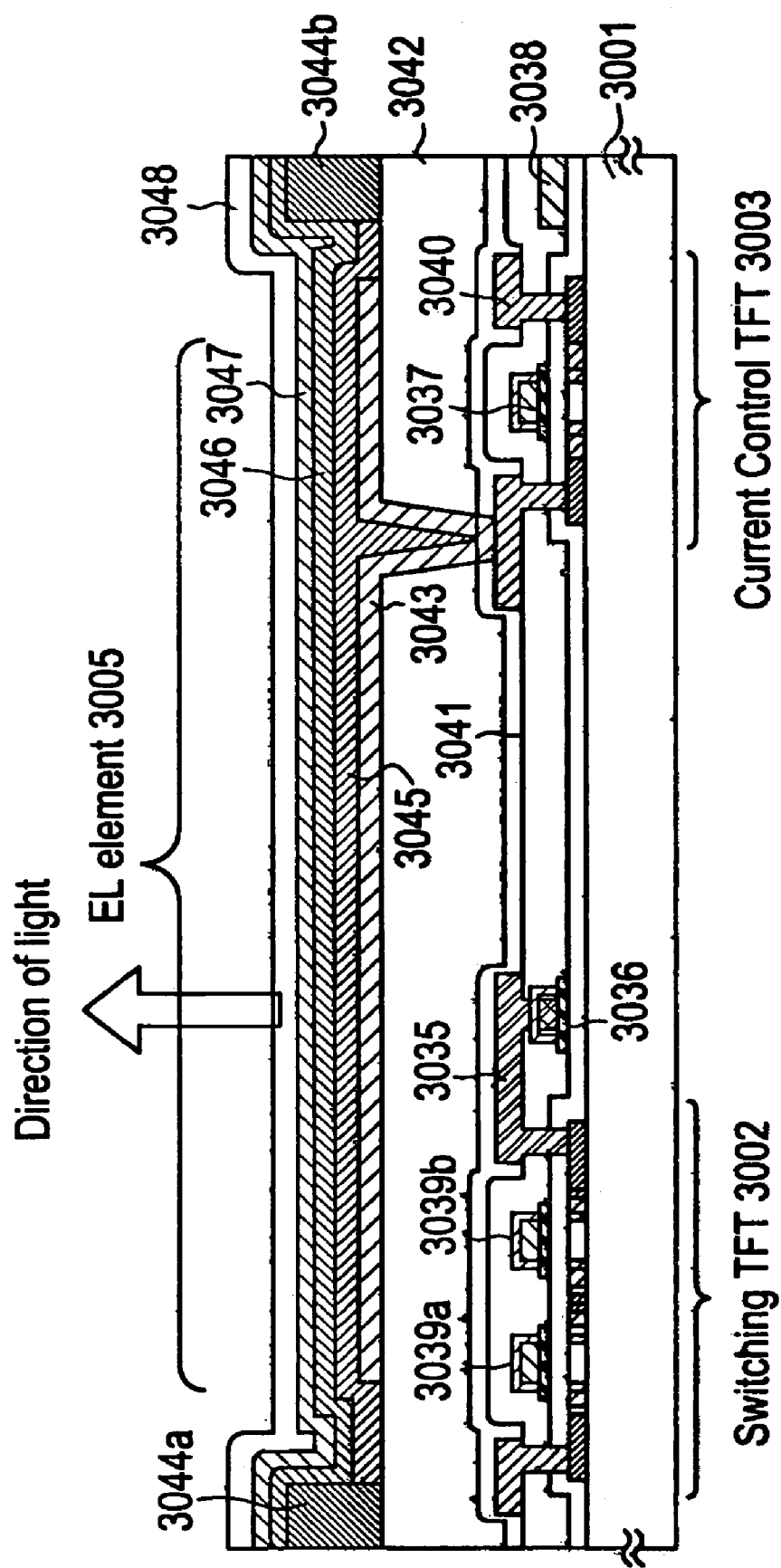
FIG. 29 is a sectional view of a pixel portion in an active matrix type EL display device.
Figure 30A:
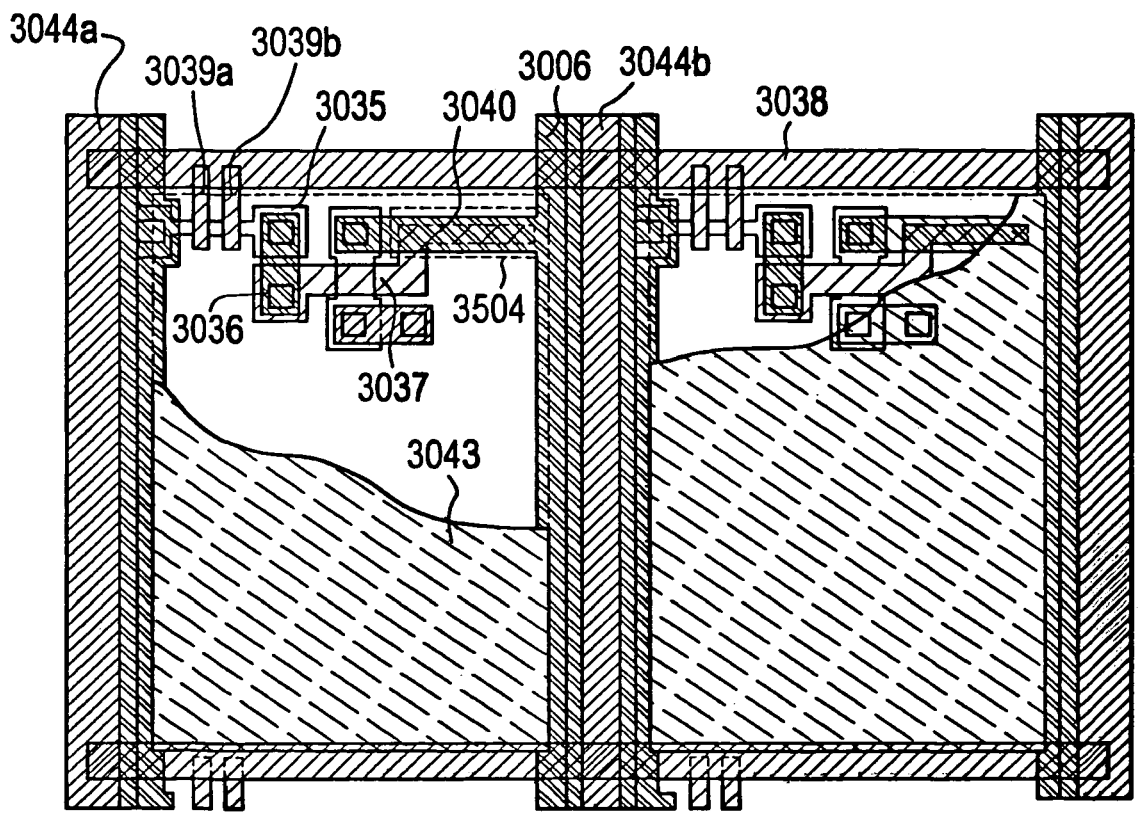
FIGS. 30A and 30B are top plan view and a circuit diagram of a pixel portion in an active matrix EL display device, respectively.
Figure 30B:
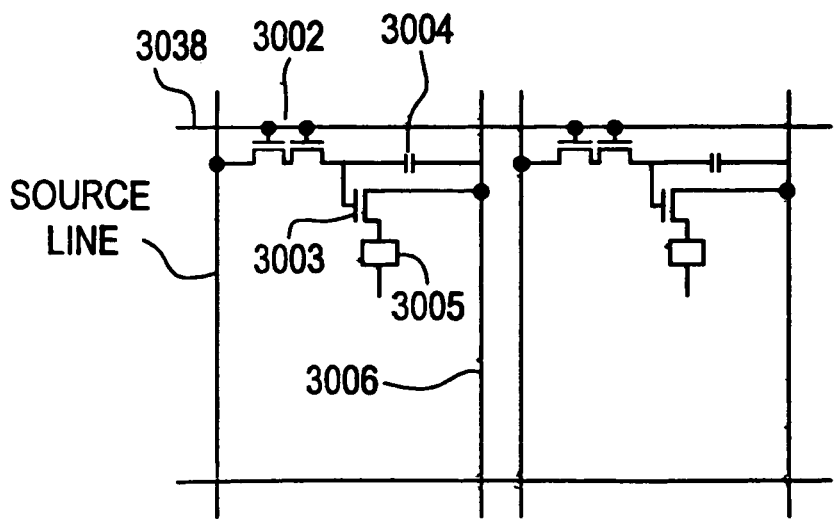

In this embodiment, the structure of the pixel region in the EL display device is illustrated in more detail. FIG. 29 shows the cross section of the pixel region, FIG. 30A shows the top view thereof and FIG. 30B shows the circuit diagram for the pixel region. In FIG. 29, FIG. 30A and FIG. 30B, the same reference numerals are referred to for the same parts, as being common thereto.

In FIG. 29, the switching TFT 3002 formed on the substrate 3001 is NTFT of the invention (cf. Embodiments 1 to 8). In this Embodiment, it has a double-gate structure, but its structure and fabrication process do not so much differ from the structures and the fabrication processes illustrated hereinabove, and their description is omitted herein. However, the double-gate structure of the switching TFT 3002 has substantially two TFTs as connected in series, and therefore has the advantage of reducing the off-current to pass therethrough. In this Embodiment, the switching TFT 3002 has such a double-gate structure, but is not limitative. It may have a single-gate structure or a triple-gate structure, or even any other multi-gate structure having more than three gates. As the case may be, the switching TFT 3002 may be PTFT of the invention.

The current-control TFT 3003 is NTFT of the invention. The drain wire 3035 in the switching TFT 3002 is electrically connected with the gate electrode 3037 in the current-control TFT, via the wire 3036 therebetween. The wire indicated by 3038 is a gate wire for electrically connecting the gate electrodes 3039a and 3039b in the switching TFT 3002.

It is very important that the current-control TFT 3003 has the structure defined in the invention. The current-control TFT is a unit for controlling the quantity of current that passes through the EL element. Therefore, a large quantity of current passes through it, and the unit, current-control TFT has a high risk of thermal degradation and degradation with hot carriers. To this unit, therefore, the structure of the invention is extremely favorable, in which an GOLD region (a second impurity region) is so constructed that the gate electrode overlaps with the drain area in the current-control TFT, via a gate-insulating film therebetween.

In this embodiment, the current-control TFT 3003 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 30A, the wire to be the gate electrode 3037 in the current-control TFT 3003 overlaps with the drain wire 3040 therein in the region indicated by 3004, via an insulating film therebetween. In this state, the region indicated by 3004 forms a capacitor. The capacitor 3004 functions to retain the voltage applied to the gate in the current-control TFT 3003. The drain wire 3040 is connected with the current supply line (power line) 3006, from which a constant voltage is all the time applied to the drain wire 3040.

On the switching TFT 3002 and the current-control TFT 3003, formed is a first passivation film 3041. On the film 3041, formed is a planarizing film 3042 of an insulating resin. It is extremely important that the difference in level of the layered parts in TFT is removed through planarization with the planarizing film 3042. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3043 indicates a pixel electrode (a cathode in the EL device) of an electroconductive film with high reflectivity. The pixel electrode 3043 is electrically connected with the drain in the current-control TFT 3003. It is preferable to use a n-channel type TFT for the current-control TFT in the case of the conductive film with high reflectivity is used for the pixel electrode 3043. Moreover, it is preferable that the pixel electrode 3043 is of a low-resistance electroconductive film of an aluminum alloy, a copper alloy or a silver alloy, or of a laminate of those films. Needless-to-say, the pixel electrode 3043 may have a laminate structure with any other electroconductive films.

In the recess (this corresponds to the pixel) formed between the banks 3044a and 3044b of an insulating film (preferably of a resin), the light-emitting layer 3045 is formed. In the illustrated structure, only one pixel is shown, but plural light-emitting layers could be separately formed in different pixels, corresponding to different colors of R (red), G (green) and B (blue). The organic EL material for the light-emitting layer may be any-conjugated polymer material. Typical polymer materials usable herein include Polyparaphenylenevinylene (PPV) materials, Polyvinylcarbazole (PVK) materials, Polyfluorene materials, etc.

Various types of PPV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33-37" and in Japanese Patent Laid-Open No. 10-92576 (1998). Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 3046 of PEDOT (polythiophene) or PAni (polyaniline) is formed on the light-emitting layer 3045 to give a laminate structure for the EL layer. On the hole injection layer 3046, formed is an anode 3047 of a transparent electroconductive film. In this Embodiment, the light having been emitted by the light-emitting layer 3045 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3047 is formed, the EL device 3005 is finished. The EL device 3005 thus fabricated herein indicates a capacitor comprising the pixel electrode (cathode) 3043, the light-emitting layer 3045, the hole injection layer 3046 and the anode 3047. As in FIG. 30A, the region of the pixel electrode 3043 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 3048 is formed on the anode 3047. For the second passivation film 3048, preferably used is a silicon nitride film or a silicon oxynitride film. The object of the film 3048 is to insulate the EL device from the outward environment. The film 3048 has the function of preventing the organic EL material from being degraded through oxidation and has the function of preventing it from degassing. With the second passivation film 3048 of that type, the reliability of the EL display device is improved.

As described hereinabove, the EL display panel of the invention fabricated in this Embodiment has a pixel region for the pixel having the constitution as in FIG. 29, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 to 8 in any desired manner. Incorporating the EL display device of this Embodiment into the electronic appliance of Embodiment 10 as its display part is advantageous.

Embodiment 14

This Embodiment is to demonstrate a modification of the EL display panel of Embodiment 13, in which the EL device 3005 in the pixel region has a reversed structure. For this Embodiment, referred to is FIG. 31. The constitution of the EL display panel of this Embodiment differs from that illustrated in FIG. 29 only in the EL device part and the current-control TFT part. Therefore, the description of the other parts except those different parts is omitted herein.

Figure 31:
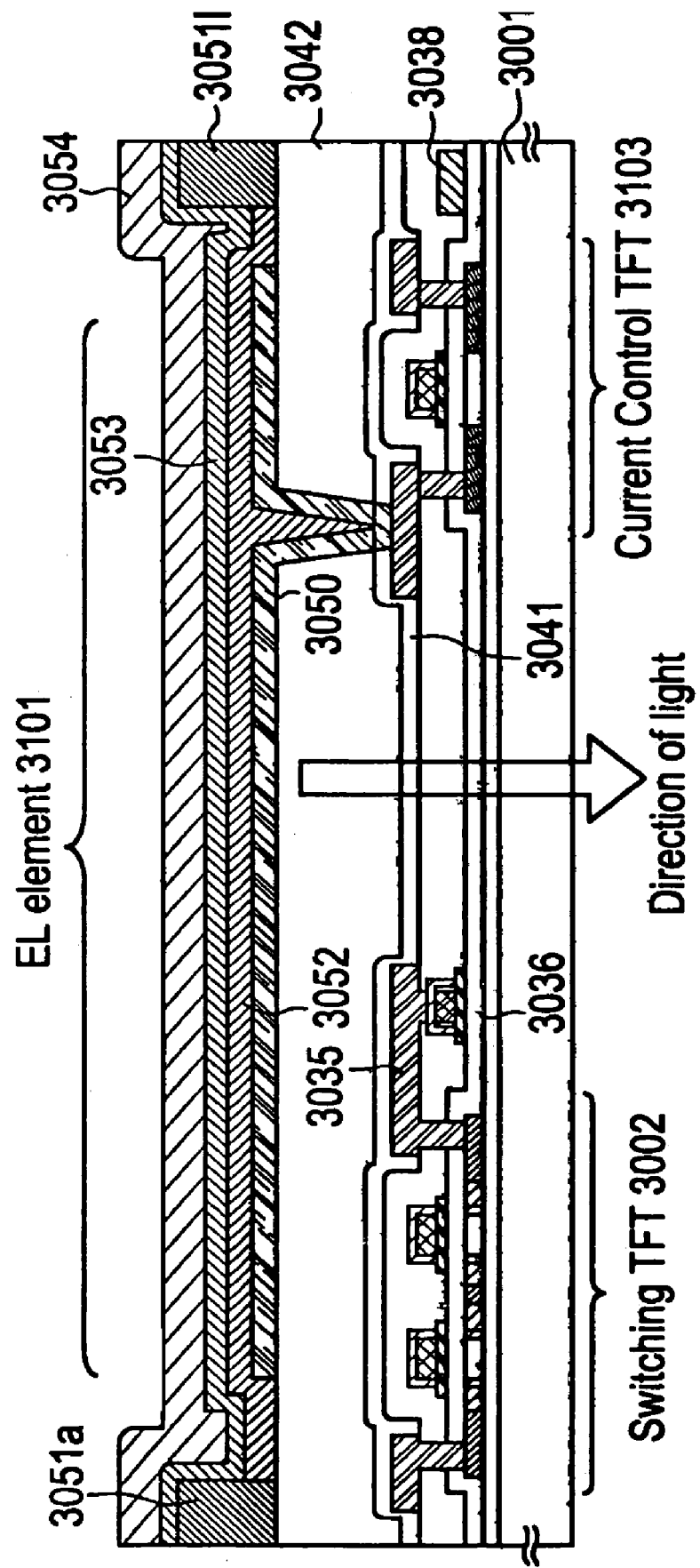
FIG. 31 is a sectional view of a pixel portion in an active matrix type EL display device.

In FIG. 31, the current-control TFT 3103 may be PTFT of the invention. For the process of forming it, referred to is that of Embodiment 1 to 8.

In this Embodiment, the pixel electrode (anode) 3050 is of a transparent electroconductive film. Concretely, used is an electroconductive film of a compound of indium oxide and zinc oxide. Needless-to-say, also usable is an electroconductive film of a compound of indium oxide and tin oxide.

After the banks 3051a and 3051b of an insulating film have been formed, a light-emitting layer 3052 of polyvinylcarbazole is formed between them in a solution coating method. On the light-emitting layer 3052, formed are an electron injection layer 3053 of acetylacetonatopotassium (hereinafter acacK), and a cathode 3054 of an aluminum alloy. In this case, the cathode 3054 serves also as a passivation film. Thus is fabricated the EL device 3101.

In this Embodiment, the light having been emitted by the light-emitting layer 3052 radiates in the direction toward the substrate with TFT formed thereon, as in the direction of the arrow illustrated.

The constitution of this Embodiment can be combined with any constitution of Embodiments 1 to 8 in any desired manner. Incorporating the EL display panel of this Embodiment into the electronic appliance of Embodiment 10 as its display part is advantageous.

Embodiment 15

This Embodiment is to demonstrate modifications of the pixel with the circuit pattern of FIG. 30B. The modifications are as in FIG. 32A to FIG. 32C. In this Embodiment illustrated in those FIG. 32A to FIG. 32C, 3201 indicates the source wire for the switching TFT 3202; 3203 indicates the gate wire for the switching TFT 3202; 3204 indicates a current-control TFT; 3205 indicates a capacitor; 3206 and 3208 indicate current supply lines; and 3207 indicates an EL element.

Figure 32A:
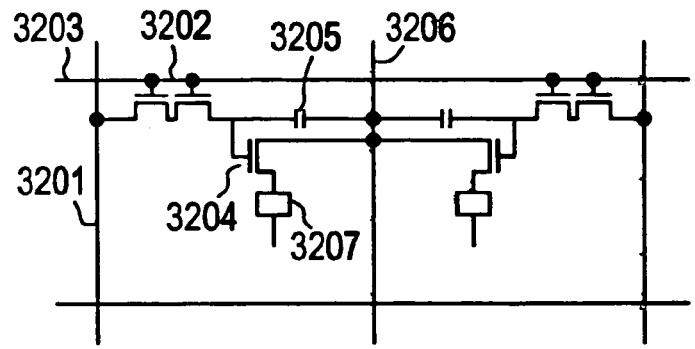
FIGS. 32A through 32C are circuit diagrams of a pixel portion in an active matrix type EL display device.

In the embodiment of FIG. 32A, the current supply line 3806 is common to the two pixels. Specifically, this embodiment is characterized in that two pixels are lineal-symmetrically formed with the current supply line 3206 being the center between them. Since the number of current supply lines can be reduced therein, this embodiment is advantageous in that the pixel pattern can be much finer and thinner.

Figure 32B:
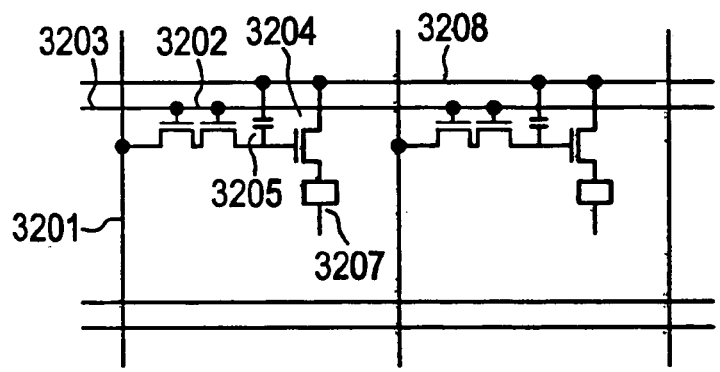

In the embodiment of FIG. 32B, the current supply line 3208 is formed in parallel to the gate wire 3203. Specifically, in this, the current supply line 3208 is so constructed that it does not overlap with the gate wire 3203, but is not limitative. Being different from the illustrated case, the two may overlap with each other via an insulating film therebetween so far as they are of different layers. Since the current supply line 3208 and the gate wire 3203 may enjoy the common exclusive area therein, this embodiment is advantageous in that the pixel pattern can be much finer and thinner.

Figure 32C:
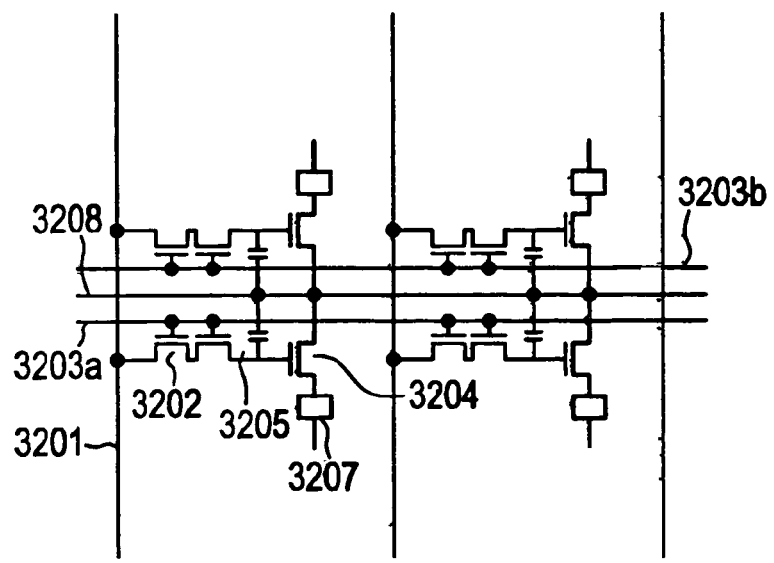

The structure of the embodiment of FIG. 32C is characterized in that the current supply line 3208 is formed in parallel to the gate wires 3203a and 3203b, like in FIG. 32B, and that two pixels are lineal-symmetrically formed with the current supply line 3208 being the center between them. In this, it is also effective to provide the current supply line 3208 in such a manner that it overlaps with any one of the gate wires 3203a and 3203b. Since the number of current supply lines can be reduced therein, this embodiment is advantageous in that the pixel pattern can be much finer and thinner.

The constitution of this Embodiment can be combined with any constitution of Embodiment 1 to 8 in any desired manner. Incorporating the EL display panel having the pixel structure of this Embodiment into the electronic appliance of Embodiment 10 as its display part is advantageous.

Embodiment 16

The embodiment of Embodiment 13 illustrated in FIG. 30A and FIG. 30B is provided with the capacitor 3004 which acts to retain the voltage applied to the gate in the current-control TFT 3003. In the embodiment, however, the capacitor 3004 may be omitted.

In the Embodiment 13, the current-control TFT 3003 is NTFT of the invention, as shown in Embodiments 1 to 8. Therefore, in the embodiment, the LDD region is so formed that it overlaps with the gate electrode via the gate-insulating film therebetween. In the overlapped region, formed is a parasitic capacitance generally referred to as a gate capacitance. This Embodiment is characterized in that the parasitic capacitance is positively utilized in place of the capacitor 3004.

The parasitic capacitance in question varies, depending on the area in which the gate electrode overlaps with the GOLD region, and is therefore determined according to the length of the GOLD region in the overlapped area.

Also in Embodiment 15 illustrated in FIGS. 32A, 24B and 32C, the capacitor 3205 can be omitted.

The constitution of this Embodiment can be combined with any constitution of Embodiment 1 to 8 in any desired manner. Incorporating the EL display device having the pixel structure of this Embodiment into the electronic appliance of Embodiment 10 as its display part is advantageous.

The present invention thus far described brings forth effects as stated below.

According to the present invention, even when the n-channel TFT of a pixel matrix circuit is driven by applying a gate voltage of 15 to 20 V thereto, a stable operation can be attained. As a result, a semiconductor device including a CMOS circuit fabricated of crystalline TFTs, concretely the pixel matrix circuit of a liquid crystal display device and the drive circuits thereof provided around the pixel matrix circuit, can have their reliabilities enhanced, and a liquid crystal display device of long life can be manufactured.

Moreover, according to the present invention, in the second impurity region of an n-channel TFT as is formed between the channel forming region and drain region thereof, a part (GOLD region) which a gate electrode overlaps and a part (LDD region) which the gate electrode does not overlap can have their lengths set and actualized with ease. Concretely, the lengths of the part (GOLD region) of the second impurity region to lie under the gate electrode and the part (LDD region) not to lie under the gate electrode can also be determined in accordance with the drive voltage of the TFT. Thus, in a case where TFTs are to be operated by different drive voltages within an identical substrate, the TFTs corresponding to the respective drive voltages can be fabricated by an identical process.

Furthermore, such features of the present invention are very suitable for a liquid crystal display device of active matrix type in which a pixel matrix circuit and driver circuits require different drive voltages and different TFT characteristics.

What is claimed is:

1. A semiconductor device including a wiring, the wiring comprising:
   a first conductive layer formed over a substrate;
   a second conductive layer formed directly on a first upper surface of the first conductive layer;
   a third conductive layer formed over a second upper surface of the first conductive layer and the second conductive layer; and
   an insulating film formed over the third conductive layer,
   wherein the third conductive layer is directly in contact with the second upper surface of the first conductive layer and directly in contact with upper and side surfaces of the second conductive layer,
   wherein the insulating film is directly in contact with side surfaces of the first conductive layer,
   wherein the first conductive layer extends beyond edges of the second conductive layer,
   wherein the second conductive layer comprises aluminum,
   wherein the first conductive layer and the third conductive layer comprise a material selected from the group consisting of silicon, titanium, tantalum, tungsten and molybdenum,
   wherein the entire first conductive layer and the entire third conductive layer comprise different materials,
   wherein the first conductive layer and the second conductive layer comprise different materials, and
   wherein the second conductive layer and the third conductive layer comprise different materials.

2. The semiconductor device according to claim 1, wherein the wiring is a gate electrode of a transistor.

3. The semiconductor device according to claim 1, wherein the wiring is a gate wiring line.

4. The semiconductor device according to claim 1, wherein the substrate is a substrate selected from the group consisting of a glass substrate, a ceramics substrate, a silicon substrate, a stainless steel substrate and a quartz substrate.

5. The semiconductor device according to claim 1, wherein the semiconductor device is an electronic equipment selected from the group consisting of a personal computer, a video camera, a digital camera, a mobile computer, a portable telephone set, an electronic book, a navigation system and a projector.

6. The semiconductor device according to claim 1, wherein the semiconductor device is a display device selected from the group consisting of a liquid crystal display device and an electroluminescence display device.

7. The semiconductor device according to claim 1, wherein the first upper surface of the first conductive layer is coplanar with the second upper surface of the first conductive layer.

8. The semiconductor device according to claim 1, wherein the insulating film is a silicon nitride film.

9. The semiconductor device according to claim 2, wherein the transistor is a thin film transistor.

10. A semiconductor device including a wiring, the wiring comprising:
    a first conductive layer formed over a substrate;
    a second conductive layer formed directly on a first upper surface of the first conductive layer;
    a third conductive layer formed over a second upper surface of the first conductive layer and the second conductive layer ;and
    an insulating film formed over the third conductive layer,
    wherein the third conductive layer is directly in contact with the second upper surface of the first conductive layer and directly in contact with upper and side surfaces of the second conductive layer,
    wherein the insulating film is directly in contact with side surfaces of the first conductive layer,
    wherein the first conductive layer extends beyond edges of the second conductive layer,
    wherein the second conductive layer comprises copper,
    wherein the first conductive layer and the third conductive layer comprise a material selected from the group consisting of silicon, titanium, tantalum, tungsten and molybdenum,
    wherein the entire first conductive layer and the entire third conductive layer comprise different materials,
    wherein the first conductive layer and the second conductive layer comprise different materials, and
    wherein the second conductive layer and the third conductive layer comprise different materials.

11. The semiconductor device according to claim 10, wherein the wiring is a gate electrode of a transistor.

12. The semiconductor device according to claim 10, wherein the wiring is a gate wiring line.

13. The semiconductor device according to claim 10, wherein the substrate is a substrate selected from the group consisting of a glass substrate, a ceramics substrate, a silicon substrate, a stainless steel substrate and a quartz substrate.

14. The semiconductor device according to claim 10, wherein the semiconductor device is an electronic equipment selected from the group consisting of a personal computer, a video camera, a digital camera, a mobile computer, a portable telephone set, an electronic book, a navigation system and a projector.

15. The semiconductor device according to claim 10, wherein the semiconductor device is a display device selected from the group consisting of a liquid crystal display device and an electroluminescence display device.

16. The semiconductor device according to claim 10, wherein the first upper surface of the first conductive layer is coplanar with the second upper surface of the first conductive layer.

17. The semiconductor device according to claim 10, wherein the insulating film is a silicon nitride film.

18. The semiconductor device according to claim 11, wherein the transistor is a thin film transistor.

19. A semiconductor device including a wiring, the wiring comprising:
    a first conductive layer formed over a substrate;
    a second conductive layer formed directly on a first upper surface of the first conductive layer;
    a third conductive layer formed over a second upper surface of the first conductive layer and the second conductive layer; and
    an insulating film formed over the third conductive layer,
    wherein the third conductive layer is directly in contact with the second upper surface of the first conductive layer and directly in contact with upper and side surfaces of the second conductive layer,
    wherein the insulating film is directly in contact with side surfaces of the first conductive layer, wherein the first conductive layer extends beyond edges of the second conductive layer, wherein a side surface of the first conductive layer is coplanar with a side surface of the third conductive layer, wherein the entire first conductive layer and the entire third conductive layer comprise different materials, wherein the first conductive layer and the second conductive layer comprise different materials, and wherein the second conductive layer and the third conductive layer comprise different materials.

20. The semiconductor device according to claim 19, wherein the wiring is a gate electrode of a transistor.

21. The semiconductor device according to claim 19, wherein the wiring is a gate wiring line.

22. The semiconductor device according to claim 19, wherein the substrate is a substrate selected from the group consisting of a glass substrate, a ceramics substrate, a silicon substrate, a stainless steel substrate and a quartz substrate.

23. The semiconductor device according to claim 19, wherein the semiconductor device is an electronic equipment selected from the group consisting of a personal computer, a video camera, a digital camera, a mobile computer, a portable telephone set, an electronic book, a navigation system and a projector.

24. The semiconductor device according to claim 19, wherein the semiconductor device is a display device selected from the group consisting of a liquid crystal display device and an electroluminescence display device.

25. The semiconductor device according to claim 19, wherein the first upper surface of the first conductive layer is coplanar with the second upper surface of the first conductive layer.

26. The semiconductor device according to claim 19, wherein the insulating film is a silicon nitride film.

27. The semiconductor device according to claim 19, wherein the first conductive layer comprises titanium.

28. The semiconductor device according to claim 19, wherein the third conductive layer comprises tantalum.

29. The semiconductor device according to claim 20, wherein the transistor is a thin film transistor.

30. The semiconductor device according to claim 19, wherein the first conductive layer and the third conductive layer comprise a material selected from the group consisting of silicon, titanium, tantalum, tungsten and molybdenum.

31. The semiconductor device according to claim 19, wherein the second conductive layer comprises a material selected from the group consisting of aluminum and copper.

32. A semiconductor device including a wiring, the wiring comprising:

a first conductive layer formed over a substrate;

a second conductive layer formed directly on a first upper surface of the first conductive layer;

a third conductive layer formed over a second upper surface of the first conductive layer and the second conductive layer; and an insulating film formed over the third conductive layer, wherein the third conductive layer is directly in contact with the second upper surface of the first conductive layer and directly in contact with upper and side surfaces of the second conductive layer, wherein the insulating film is directly in contact with side surfaces of the first conductive layer, wherein the first conductive layer extends beyond edges of the second conductive layer, wherein the first upper surface of the first conductive layer is coplanar with a bottom surface of the third conductive layer, wherein the entire first conductive layer and the entire third conductive layer comprise different materials, wherein the first conductive layer and the second conductive layer comprise different materials, and wherein the second conductive layer and the third conductive layer comprise different materials.

33. The semiconductor device according to claim 32, wherein the wiring is a gate electrode of a transistor.

34. The semiconductor device according to claim 33, wherein the transistor is a thin film transistor.

35. The semiconductor device according to claim 32, wherein the wiring is a gate wiring line.

36. The semiconductor device according to claim 32, wherein the first conductive layer and the third conductive layer comprise a material selected from the group consisting of silicon, titanium, tantalum, tungsten and molybdenum.

37. The semiconductor device according to claim 32, wherein the second conductive layer comprises a material selected from the group consisting of aluminum and copper.

38. The semiconductor device according to claim 32, wherein the substrate is a substrate selected from the group consisting of a glass substrate, a ceramics substrate, a silicon substrate, a stainless steel substrate and a quartz substrate.

39. The semiconductor device according to claim 32, wherein the semiconductor device is an electronic equipment selected from the group consisting of a personal computer, a video camera, a digital camera, a mobile computer, a portable telephone set, an electronic book, a navigation system and a projector.

40. The semiconductor device according to claim 32, wherein the semiconductor device is a display device selected from the group consisting of a liquid crystal display device and an electroluminescence display device.

41. The semiconductor device according to claim 32, wherein the first upper surface of the first conductive layer is coplanar with the second upper surface of the first conductive layer.

42. The semiconductor device according to claim 32, wherein the insulating film is a silicon nitride film.

43. The semiconductor device according to claim 32, wherein the first conductive layer comprises titanium.

44. The semiconductor device according to claim 32, wherein the third conductive layer comprises tantalum.

* * * * *